(12) United States Patent
Hayashi et al.

(10) Patent No.: US 7,369,375 B2
(45) Date of Patent: May 6, 2008

(54) MAGNETO-RESISTANCE EFFECT ELEMENT AND MAGNETO-RESISTANCE EFFECT HEAD

(75) Inventors: Kazuhiko Hayashi, Tokyo (JP); Junichi Fujikata, Tokyo (JP); Tsutomu Ishi, Tokyo (JP); Shigeru Mori, Tokyo (JP); Keishi Ohashi, Tokyo (JP); Masafumi Nakada, Tokyo (JP); Kiyokazu Nagahara, Tokyo (JP); Kunihiko Ishihara, Tokyo (JP); Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/477,411

(22) Filed: Jun. 30, 2006

(65) Prior Publication Data

US 2007/0047158 A1      Mar. 1, 2007

Related U.S. Application Data

(62) Division of application No. 11/227,143, filed on Sep. 16, 2005, now Pat. No. 7,158,355, which is a division of application No. 10/803,144, filed on Mar. 18, 2004, now Pat. No. 6,999,287, which is a division of application No. 10/442,209, filed on May 21, 2003, now Pat. No. 6,747,853, which is a division of application No. 09/916,529, filed on Jul. 30, 2001, now Pat. No. 6,934,132.

(30) Foreign Application Priority Data

Aug. 3, 2000     (JP)     ................. 2000-236287

(51) Int. Cl.
G11B 5/39      (2006.01)
G11B 5/127     (2006.01)

(52) U.S. Cl. ............................ 360/324.12; 360/324.11; 360/324.2

(58) Field of Classification Search ............ 360/324.12, 360/324.2, 324.11, 324.1
See application file for complete search history.

(56) References Cited

U.S. PATENT DOCUMENTS 6,097,579 A     8/2000     Gill (Continued)

FOREIGN PATENT DOCUMENTS

EP     911810 A2 *     4/1999

(Continued)

OTHER PUBLICATIONS

Japanese office action dated Oct. 26, 2004 with English translation of pertinent portions.

(Continued)

Primary Examiner—William J Klimowicz
(74) Attorney, Agent, or Firm—Whitham Curtis Christofferson & Cook, P.C.

(57) ABSTRACT

A magneto-resistance effect head is provided with a lower conductive layer which is provided with a recessed portion, and a vertical bias layer is provided in the recessed portion. A first magnetic layer is provided on the lower conductive layer. On the first magnetic layer, layered in the following order are the non-magnetic layer, the fixed layer, the fixing layer, and the upper layer so as not to be placed immediately above the vertical bias layer. The non-magnetic layer, the fixed layer, the fixing layer, and the upper layer are buried in an insulation layer. Furthermore, an upper conductive layer is provided on the upper layer and the insulation layer. In the direction of the magnetic field applied by the vertical bias layer, the free layer is made greater in length than the fixed layer and the free layer is disposed in proximity to the vertical bias layer with the distance between the fixed layer and the vertical bias layer remaining unchanged.

15 Claims, 51 Drawing Sheets

U.S. PATENT DOCUMENTS

| | | | |
|---|---|---|---|
| 6,114,719 A * | 9/2000 | Dill et al. ................. 257/295 |
| 6,146,776 A | 11/2000 | Fukuzawa et al. |
| 6,181,537 B1 | 1/2001 | Gill |
| 6,259,586 B1 * | 7/2001 | Gill .......................... 360/324.2 |
| 6,266,218 B1 | 7/2001 | Carey et al. |
| 6,275,362 B1 | 8/2001 | Pinarbasi |
| 6,275,363 B1 * | 8/2001 | Gill .......................... 360/324.2 |
| 6,306,266 B1 | 10/2001 | Metin et al. |
| 6,325,900 B1 | 12/2001 | Komuro et al. |
| 6,327,107 B1 * | 12/2001 | Komuro et al. ............... 360/55 |
| 6,333,842 B1 | 12/2001 | Nobuyuki et al. |
| 6,400,536 B1 | 6/2002 | Gill |
| 6,411,476 B1 | 6/2002 | Lin et al. |
| 6,452,204 B1 | 9/2002 | Ishiwata et al. |
| 6,469,879 B1 | 10/2002 | Redon et al. |
| 6,473,275 B1 * | 10/2002 | Gill .......................... 360/314 |
| 6,483,675 B1 * | 11/2002 | Araki et al. ............ 360/324.2 |
| 6,487,056 B1 | 11/2002 | Gibbons et al. |
| 6,795,280 B1 | 9/2004 | Song et al. |
| 7,027,274 B1 * | 4/2006 | Sin et al. .................. 360/324.2 |
| 2001/0014001 A1 | 8/2001 | Aoshima et al. |
| 2002/0167767 A1 | 11/2002 | Jayasekara |
| 2003/0035256 A1 | 2/2003 | Hayashi et al. |
| 2004/0196596 A1 | 10/2004 | Ho et al. |

FOREIGN PATENT DOCUMENTS

| | | |
|---|---|---|
| EP | 953849 | 11/1999 |
| JP | 2-61572 | 3/1990 |
| JP | 5-94605 | 4/1993 |
| JP | 6-236527 | 8/1994 |
| JP | 10-162327 | 6/1998 |
| JP | 10-255231 | 9/1998 |
| JP | 11-134620 | 5/1999 |
| JP | 11175920 | 7/1999 |
| JP | 11-213355 | 8/1999 |
| JP | 11-232616 | 8/1999 |
| JP | 11316919 | 11/1999 |
| JP | 2000003507 | 1/2000 |
| JP | 2000-40211 | 2/2000 |
| JP | 20000105912 | 4/2000 |
| JP | 2000-163716 | 6/2000 |
| KR | 199-0062685 | 7/1999 |

OTHER PUBLICATIONS

Korean office action Aug. 5, 2003 with Japanese translation Korean action and English translation of the Japanese translation J. Moodera, et al., "Ferromagnetic-insulator-ferromagnetic tunneling: Spin-dependent tunneling and large magnetoresistance in trilayer junctions 9 (invited)" J. Appl Phys. 79 (8), Apr. 15, 1996.

D. Thompson, et al., "Thin film magnetoresistors in memory, storage, and related applications", IEEE Transactions on Magnetics. vol. Mag. 11 No. 4 Jul. 1975.

* cited by examiner

MAGNETO-RESISTANCE EFFECT ELEMENT AND MAGNETO-RESISTANCE EFFECT HEAD

CROSS-REFERENCE TO RELATED APPLICATIONS

This application is a division of patent application Ser. No. 11/227,143 filed Sep. 16, 2005, now U.S. Pat. No. 7,158,355 issued Jan. 2, 2007, which is a divisional application of Ser. No. 10/803,144 filed Mar. 18, 2004, now U.S. Pat. No. 6,999,287 issued Feb. 14, 2006, which in turn is a divisional application of Ser. No. 10/442,209, filed May 21, 2003, now U.S. Pat. No. 6,747,853 issued Jun. 8, 2004, which is a divisional application of Ser. No. 09/916,529 filed Jul. 30, 2001, now U.S. Pat. No. 6,934,132 issued Aug. 23, 2005, the complete contents of which is incorporated herein by reference.

BACKGROUND OF THE INVENTION

1. Field of the Invention

The present invention relates to a magneto-resistance effect element for writing and reading an information signal on magnetic storage media, a magneto-resistance effect head comprising the magneto-resistance effect element, a magneto-resistance transducer system comprising the magneto-resistance effect head, and a magnetic storage system comprising the magneto-resistance transducer system. More particularly, the present invention relates to a magneto-resistance effect element that reduces noise in a read signal.

2. Description of the Related Art

Conventionally disclosed is a magnetic read transducer that is referred to as a magneto-resistance sensor (hereinafter referred to as an MR sensor) or a head. This magnetic read transducer can read data from a magnetic surface at high linear densities. The MR sensor allows the read element to vary the electrical resistance as the function of the strength and the orientation of a magnetic flux applied from the outside in order to measure a variation in electrical resistance, thereby detecting a magnetic signal.

Such a conventional MR sensor operates based on the anisotropic magneto-resistance effect (hereinafter referred to as an AMR effect). By this effect, the component of a change in electrical resistance of the read element varies in proportion to the second power of the cosine of the angle between the orientation of magnetization and the direction of the sense current flowing through the read element. The AMR effect is described in more detail in an article entitled "Memory, Storage, and Related Applications", D. A. Thompson, IEEE Transactions on Magnetics, Vol. MAG-11, No. 4, pp. 1039 (1975).

In addition, disclosed lately is a more prominent magneto-resistance effect by which a change in electrical resistance of the layered magnetic sensor is caused by spin-dependent transportation of conduction electrons between magnetic layers via a non-magnetic layer and spin-dependent scattering associated therewith at layer boundaries. This magneto-resistance effect is identified by various names such as the "giant magneto-resistance effect" or the "spin valve effect". Such a magneto-resistance sensor is formed of suitable materials to provide improved detection sensitivity and greater changes in electrical resistance in comparison with a sensor which makes use of the AMR effect. In a MR sensor of this type, in-plane resistance between a pair of ferromagnetic layers separated by a non-magnetic layer varies in proportion to the cosine of the angle between the orientations of magnetization of the aforementioned pair of ferromagnetic layers. In Japanese Patent Laid-Open Publication No. Hei 2-61572 submitted in July 1988, for claiming priority, described is a layered magnetic structure for providing a significant change in MR caused by an anti-parallel alignment of the orientations of magnetization in the magnetic layers.

On the other hand, such a phenomenon has been recently discovered in which a relative change in orientation of magnetization of ferromagnetic bodies disposed above and below a very thin insulation layer (barrier layer) through which a tunneling current flows, causes a change in electrical resistance. And, the layered structure made up of the ferromagnetic layer, the barrier layer, and the ferromagnetic layer is termed a ferromagnetic tunnel junction. For example, ferromagnetic tunnel junctions are introduced in "Journal of Applied Physics", Vol. 79 (8), No. 15, pp. 4724 (1996).

On the other hand, in a shield type element that makes use of a ferromagnetic tunnel junction, it is necessary to conduct a sense current for detecting a change in electrical resistance of the element in perpendicular relation to the tunnel junction. However, the structure similar to the shield type element employing the conventional spin valve presents a problem that the sense current flows through a vertical bias layer for controlling the magnetic domain of the free layer disposed near the tunnel junction to reduce the current flowing through the tunnel junction, thereby providing a reduced change in electrical resistance.

In order to overcome this problem, a read head was disclosed in Japanese Patent Laid-Open Publication No. Hei 10-162327 submitted on Nov. 27, 1996, for claiming priority. The read head, employing a ferromagnetic tunnel junction film, has a structure in which the vertical bias layer is not in contact with the free layer.

FIG. 1 is a fragmentary sectional view illustrating the prior-art ferromagnetic tunnel head described in Japanese Patent Laid-Open Publication No. Hei 10-162327. FIG. 1 illustrates the structure of a patterned ferromagnetic tunnel junction element, or a magneto-resistance effect element 30, having an insulation layer 11 disposed between a vertical bias layer 2b and a free layer 3b. This structure can prevent a sense current from flowing through the vertical bias layer 2b.

However, since the insulation layer 11 disposed between the vertical bias layer 2b and the free layer 3b acts also as a magnetic separation layer, it is difficult in the magneto-resistance effect element 30 to apply a vertical bias magnetic field of a sufficient magnitude to the free layer 3b. This presents such a problem that the magnetic domain of the free layer 3b is controlled insufficiently to cause the hysteresis of the R-H loop to increase for the shield type sensor, thereby providing a high-noise-level read signal upon reading magnetic information on a storage medium.

In order to overcome this problem, a read head was disclosed in Japanese Patent Laid-Open Publication No. Hei 10-255231 submitted on Mar. 7, 1997, 1996, for claiming priority. The read head, employing a ferromagnetic tunnel junction film, has a structure in which the vertical bias layer is in contact with the free layer.

FIGS. 2 and 3 are fragmentary sectional views of the ferromagnetic tunnel head described in Japanese Patent Laid-Open Publication No. Hei 10-255231. FIGS. 2 and 3 illustrate the structure of a layered body comprising the free layer 3b, the non-magnetic layer 4, and the fixed layer 5, in which the vertical bias layer 2b is in direct contact with the end portion of either the free layer 3b or the fixed layer 5.

However, the structure shown in FIGS. 2 and 3 presents the following problem. As will be described in the preferred embodiments of the present invention, the read head, which was actually fabricated to the structure shown in FIGS. 2 and 3, caused the sense current to flow into the vertical bias layer 2b and thus insufficiently flow through the non-magnetic layer 4. It is thereby made impossible to provide sufficient output of the sense current. The low output made it impossible to provide sufficient (S/N) ratios and bit error rates. As described above, this structure may make it possible in principle to prevent the sense current from flowing through the vertical bias layer 2b and thereby bypassing the non-magnetic layer 4. However, the vertical bias layer 2b is disposed in close proximity to the end portion of the non-magnetic layer 4 in the layered body made up of the free layer 3b, the non-magnetic layer 4, and the fixed layer 5. Thus, it is difficult to fabricate this structure precisely enough to prevent the sense current from flowing through the vertical bias layer 2b and thereby bypassing the non-magnetic layer 4.

SUMMARY OF THE INVENTION

It is an object of the present invention to provide a magneto-resistance effect element, a magneto-resistance effect head, a magneto-resistance transducer system, and a magnetic storage system, which can prevent the sense current from flowing into the vertical bias layer, provide a read signal of a low noise level, and a good (S/N) ratio and bit error rate.

A magneto-resistance effect element according to the present invention comprises a lower conductive layer and a free layer provided on the lower conductive layer and having an orientation of magnetization varied by a magnetic field applied thereto. The magneto-resistance effect element also comprises a non-magnetic layer provided on top of the free layer, a fixed layer provided on the non-magnetic layer and having a pinned orientation of magnetization, and a vertical bias layer, provided on the lower conductive layer, for applying a magnetic field to the free layer. The magneto-resistance effect element is adapted that the free layer is greater in length in the direction of a magnetic field applied thereto by the vertical bias layer than the fixed layer, and a sense current for detecting a change in electrical resistance of the non-magnetic layer flows substantially in perpendicular relation to the non-magnetic layer.

In the present invention, the free layer is made greater in length than the fixed layer in the direction of magnetic field applied by the vertical bias layer, thereby allowing only the free layer to be disposed near the vertical bias layer. This allows the vertical bias layer to effectively apply a vertical bias magnetic field to the free layer and makes it possible to prevent the leakage of a sense current from the fixed layer to the vertical bias layer. This allows almost all the sense current, which is applied to the magneto-resistance effect element to detect a change in electrical resistance, to flow through the non-magnetic layer, thereby making it possible to reduce noise in the read signal waveform and improve the (S/N) ratio and bit error rate. Incidentally, that the sense current flows substantially in perpendicular relation to the aforementioned non-magnetic layer means that the sense current flows in orthogonal relation thereto to such an extent as to measure a change in electrical resistance of the non-magnetic layer without any trouble. In addition, the direction of the magnetic field applied by the aforementioned vertical bias layer agrees with the direction perpendicular to the direction in which the aforementioned sense current flows on a plane parallel to an air bearing surface of the magneto-resistance effect head.

In addition, it is preferable that the lower conductive layer has a recessed portion, and at least part of the vertical bias layer is buried in the recessed portion.

This makes it possible to place the vertical bias layer and the free layer to be flush with each other, and allows the vertical bias layer to apply a vertical bias magnetic field smoothly and effectively to the free layer.

Furthermore, at least part of the free layer can be brought into direct contact with the vertical bias layer. Alternatively, the underlying layer for free layer may be provided below the free layer such that the underlying layer for free layer is brought into contact with the vertical bias layer. A vertical bias layer protective layer may be provided on the vertical bias layer such that the vertical bias layer protective layer is brought into contact with the free layer or the underlying layer for free layer.

This allows the vertical bias layer to apply a vertical bias magnetic field more positively and effectively to the free layer.

A magneto-resistance effect element according to the present invention comprises a lower conductive layer, a magnetic layer provided on the lower conductive layer, and a free layer provided on the magnetic layer and having an orientation of magnetization varied by a magnetic field coupled magnetically to the magnetic layer and applied thereto. The magneto-resistance effect element also comprises a non-magnetic layer provided on the free layer, a fixed layer provided on the non-magnetic layer and having a pinned orientation of magnetization, and a vertical bias layer, provided on the lower conductive layer, for applying a magnetic field to the free layer. The magneto-resistance effect element is adapted that the magnetic layer is greater in length in the direction of a magnetic field applied thereto by the vertical bias layer than the free layer, and a sense current for detecting a change in electrical resistance of the non-magnetic body flows substantially in perpendicular relation to the non-magnetic layer.

In addition, the magnetic layer can be magnetically coupled to the free layer by anti-ferromagnetic coupling or ferromagnetic coupling. Furthermore, a second non-magnetic layer may be provided between the magnetic layer and the free layer.

In the present invention, a vertical bias magnetic field is once applied to the magnetic layer from the vertical bias layer, and then the vertical bias magnetic field is applied to the free layer from the magnetic layer. The vertical bias magnetic field is thus applied to the free layer through the two steps, thereby facilitating the control of the vertical bias magnetic field applied to the free layer. In addition, in the direction of the magnetic field applied by the vertical bias layer, the free layer is made greater in length than the free layer, thereby placing only the magnetic layer near the vertical bias layer. This allows the vertical bias layer to effectively apply the vertical bias magnetic field to the magnetic layer and makes it possible to prevent the leakage of sense current from the layered body to the vertical bias layer, thereby allowing almost all sense current to conduct through the non-magnetic layer.

Furthermore, at least part of the magnetic layer can be brought into direct contact with the vertical bias layer. Alternatively, the underlying layer for magnetic layer may be provided below the magnetic layer such that the underlying layer for magnetic layer is brought into contact with the vertical bias layer. A vertical bias layer protective layer may be provided on the vertical bias layer such that the vertical bias layer protective layer is brought into contact with the magnetic layer or the underlying layer for magnetic layer.

This allows the vertical bias layer to apply a vertical bias magnetic field more positively and effectively to the magnetic layer.

A magneto-resistance effect element according to the present invention comprises a lower conductive layer, a fixed layer provided on the lower conductive layer and having a pined orientation of magnetization, and a non-magnetic layer provided on the fixed layer. The magneto-resistance effect element also comprises a free layer provided on the non-magnetic layer and having an orientation of magnetization varied by a magnetic field applied thereto, a magnetic layer provided on the free layer and magnetically coupled to the free layer, and a vertical bias layer for applying a magnetic field to the magnetic layer. The magneto-resistance effect element is adapted that a sense current for detecting a change in electrical resistance of the non-magnetic layer flows substantially in perpendicular relation to the non-magnetic layer.

In addition, a fixing layer for pinning the orientation of magnetization of the fixed layer may be provided below the fixed layer.

Furthermore, it is preferable that at least part of the magnetic layer is brought into direct contact with the vertical bias layer. Alternatively, the underlying layer for magnetic layer may be provided below the magnetic layer such that the underlying layer for magnetic layer is brought into contact with the vertical bias layer. A vertical bias layer protective layer may be provided on the vertical bias layer such that the vertical bias layer protective layer is brought into contact with the magnetic layer or the underlying layer for magnetic layer.

In addition, the magnetic layer can be magnetically coupled to the free layer by anti-ferromagnetic coupling or ferromagnetic coupling. Furthermore, the second non-magnetic layer may be provided between the magnetic layer and the free layer.

A magneto-resistance effect element according to the present invention comprises a lower conductive layer, a fixed layer provided on the lower conductive layer and having a pinned orientation of magnetization, and a first non-magnetic layer provided on the fixed layer. The magneto-resistance effect element also comprises a free layer provided on the first non-magnetic layer and having an orientation of magnetization varied by a magnetic field applied thereto. The magneto-resistance effect element further comprises a first magnetic layer provided on the free layer and magnetically coupled to the free layer, a second magnetic layer provided on the first magnetic layer and magnetically coupled to the first magnetic layer, and a vertical bias layer for applying a magnetic field to the first and second magnetic layers. The magneto-resistance effect element is adapted that a sense current for detecting a change in electrical resistance of the first non-magnetic layer flows substantially in perpendicular relation to the first non-magnetic layer.

In addition, the first magnetic layer and the second magnetic layer are equal to or greater than the free layer in length in the direction of the magnetic field applied by the vertical bias layer, respectively.

Furthermore, a second non-magnetic layer can be provided between the free layer and the first magnetic layer, while a third non-magnetic layer can be provided between the first magnetic layer and the second magnetic layer. In addition, an underlying layer for fixing layer may be provided under the fixing layer.

In the present invention, a vertical bias magnetic field can be once applied to a three-layered film made up of the first magnetic layer, the third non-magnetic layer, and the second magnetic layer, from the vertical bias layer and then to the free layer from the three-layered film. As described above, the vertical bias magnetic field is applied to the free layer from the vertical bias layer through two steps, thereby facilitating the control of the vertical bias magnetic field applied to the free layer.

Still furthermore, the product of saturation magnetization and film thickness of the first magnetic layer can be substantially equal to the product of saturation magnetization and film thickness of the second magnetic layer, and the three-layered film made up of the first magnetic layer, the third non-magnetic layer, and the second magnetic layer can be a layered antiferromagnetic body.

This eliminates the sensitivity of the three-layered film to magnetic fields but provides only the free layer with the sensitivity to magnetic fields. For this reason, when the magneto-resistance effect element is incorporated into a read head, the read track width is determined only by the width of the free layer, thus making it possible to prevent the broadening of the effective track width. Incidentally, "being substantially equal" means "being equal to such an extent that an effect of reduction in sensitivity of the three-layered film to magnetic fields can be recognized".

In addition, it is desirable that at least part of the first magnetic layer is in direct contact with the vertical bias layer. Alternatively, a first underlying layer for magnetic layer may be provided below the first magnetic layer such that the first underlying layer for magnetic layer is brought into contact with the vertical bias layer. A vertical bias layer protective layer may be provided on the vertical bias layer such that the vertical bias layer protective layer is brought into contact with the first magnetic layer or the first underlying layer for magnetic layer. Similarly, it is desirable that at least part of the second magnetic layer is in direct contact with the vertical bias layer. Alternatively, a second underlying layer for magnetic layer may be provided below the second magnetic layer such that the second underlying layer for magnetic layer is brought into contact with the vertical bias layer. The vertical bias layer protective layer may also be brought into contact with the second magnetic layer or the second underlying layer for magnetic layer.

A magneto-resistance effect element according to the present invention comprises a lower conductive layer, a fixed layer provided on the lower conductive layer and having a pinned orientation of magnetization, and a non-magnetic layer provided on the fixed layer. The magneto-resistance effect element also comprises a free layer provided on the non-magnetic layer and having an orientation of magnetization varied by a magnetic field applied thereto, a magnetic layer provided on the free layer, and a vertical bias layer, provided on the magnetic layer, for applying a magnetic field to the magnetic layer. The magneto-resistance effect element is adapted that a sense current for detecting a change in electrical resistance of the non-magnetic layer flows substantially in perpendicular relation to the non-magnetic layer.

A magneto-resistance effect element according to the present invention comprises a lower conductive layer, a first fixed layer provided on the lower conductive layer and having a pinned orientation of magnetization, and a first non-magnetic layer provided on the first fixed layer. The magneto-resistance effect element also comprises a first free layer provided on the first non-magnetic layer and having an orientation of magnetization varied by a magnetic field applied thereto. The magneto-resistance effect element further comprises a magnetic layer provided on the first free layer and magnetically coupled to the first free layer, and a second free layer provided on the magnetic layer and magnetically coupled to the magnetic layer. The magneto-resistance effect element also comprises a second non-magnetic layer provided on the second free layer, a second fixed layer provided on the second non-magnetic layer and having a pinned orientation of magnetization, and a vertical bias layer for applying a magnetic field to the magnetic layer. The magneto-resistance effect element is adapted that a sense current for detecting a change in electrical resistance of the first and second non-magnetic layers flows substantially in perpendicular relation to the first and second non-magnetic layers.

In addition, it is preferable that the magnetic layer is equal to or greater than the first and second free layers in length in the direction of the magnetic field applied by the vertical bias layer.

In the present invention, two pairs of free layers and fixed layers are provided to be vertically symmetric. This makes it possible to cancel out the effects of the magnetic field caused by sense current flowing through the free layers and the fixed layers, thereby providing a linear response to the magnetic field.

In addition, the first fixing layer for pinning the orientation of magnetization of the first fixed layer may be disposed below the first fixed layer, while the second fixing layer for pinning the orientation of magnetization of the second fixed layer may be disposed above the second fixed layer. Furthermore, the first underlying layer for fixing layer may be provided below the first fixing layer.

In addition, the first free layer can be magnetically coupled to the magnetic layer by anti-ferromagnetic coupling or ferromagnetic coupling. Furthermore, the third non-magnetic layer may be provided between the first free layer and the magnetic layer. Likewise, the magnetic layer can be magnetically coupled to the second free layer by anti-ferromagnetic coupling or ferromagnetic coupling. Furthermore, a fourth non-magnetic layer may be provided between the magnetic layer and the second free layer.

In addition, it is preferable that at least part of the magnetic layer is in direct contact with the vertical bias layer. Alternatively, the underlying layer for magnetic layer may be provided below the magnetic layer such that the underlying layer for magnetic layer is brought into contact with the vertical bias layer. A vertical bias layer protective layer may be provided on the vertical bias layer such that the vertical bias layer protective layer is brought into contact with the magnetic layer or the underlying layer for magnetic layer.

A magneto-resistance effect element according to the present invention comprises a lower conductive layer, a first magnetic layer provided on the lower electrically conductive, and a second magnetic layer provided on the first magnetic layer and magnetically coupled to the first magnetic layer. The magneto-resistance effect element also comprises a free layer provided on the second magnetic layer, magnetically coupled to the second magnetic layer, and having an orientation of magnetization varied by a magnetic field applied thereto. The magneto-resistance effect element further comprises a first non-magnetic layer provided on the free layer, a fixed layer provided on the first non-magnetic layer and having a pinned orientation of magnetization, and a vertical bias layer for applying a magnetic field to the first magnetic layer. The magneto-resistance effect element is adapted that a sense current for detecting a change in electrical resistance of the first non-magnetic layer flows substantially in perpendicular relation to the first non-magnetic layer.

In addition, it is preferable that the first magnetic layer is equal to or greater than the free layer in length in the direction of the magnetic field applied by the vertical bias layer. It is also preferable that the second magnetic layer is equal to or greater than the free layer in length in the direction of the magnetic field applied by the vertical bias layer.

Furthermore, a fixing layer for pinning the orientation of magnetization of the fixed layer may be disposed below the fixed layer.

Still furthermore, the first magnetic layer can be magnetically coupled to the second magnetic layer by anti-ferromagnetic coupling or ferromagnetic coupling. Furthermore, a second non-magnetic layer may be disposed between the first magnetic layer and the second magnetic layer. Likewise, the second magnetic layer can be magnetically coupled to the free layer by anti-ferromagnetic coupling or ferromagnetic coupling. Furthermore, a third non-magnetic layer may be disposed between the second magnetic layer and the free layer.

Still furthermore, it is preferable that the product of saturation magnetization and film thickness of the first magnetic layer is substantially equal to the product of saturation magnetization and film thickness of the second magnetic layer. It is also preferable that a three-layered film made up of the first magnetic layer, the second non-magnetic layer, and the second magnetic layer is a layered antiferromagnetic body.

Still furthermore, it is preferable that at least part of the first magnetic layer is in direct contact with the vertical bias layer. Alternatively, a first underlying layer for magnetic layer may be provided below the first magnetic layer such that the underlying layer for magnetic layer is brought into contact with the vertical bias layer. A vertical bias layer protective layer may be provided on the vertical bias layer such that the vertical bias layer protective layer is brought into contact with the magnetic layer or the underlying layer for magnetic layer. Likewise, it is preferable that at least part of the second magnetic layer is in direct contact with the vertical bias layer. Alternatively, an upper layer may be provided on the second magnetic layer such that the upper layer is brought into contact with the vertical bias layer. The vertical bias layer protective layer may be provided below the vertical bias layer such that the vertical bias layer protective layer is brought into contact with the magnetic layer or the upper layer.

A magneto-resistance effect element according to the present invention comprises a lower conductive layer, a vertical bias layer provided on the lower conductive layer, a first magnetic layer provided on the vertical bias layer, and a second magnetic layer provided on the first magnetic layer and magnetically coupled to the first magnetic layer. The magneto-resistance effect element also comprises a free layer provided on the second magnetic layer, magnetically coupled to the second magnetic layer, and having an orientation of magnetization varied by a magnetic field applied thereto. The magneto-resistance effect element further comprises a first non-magnetic layer provided on the free layer, and a fixed layer provided on the first non-magnetic layer and having a pinned orientation of magnetization. The magneto-resistance effect element is adapted that a sense current for detecting a change in electrical resistance of the first non-magnetic layer flows substantially in perpendicular relation to the first non-magnetic layer.

In addition, it is preferable that the first magnetic layer is equal to or greater than the free layer in length in the direction of the magnetic field applied by the vertical bias layer. It is also preferable that the second magnetic layer is equal to or greater than the free layer in length in the direction of the magnetic field applied by the vertical bias layer. Furthermore, an underlying layer for vertical bias layer may be provided below the vertical bias layer.

Still furthermore, the first magnetic layer can be magnetically coupled to the second magnetic layer by anti-ferromagnetic coupling or ferromagnetic coupling. Furthermore, a second non-magnetic layer may be provided between the first magnetic layer and the second magnetic layer. Likewise, the second magnetic layer can be magnetically coupled to the free layer by anti-ferromagnetic coupling or ferromagnetic coupling. Furthermore, a third non-magnetic layer may be provided between the second magnetic layer and the free layer.

Still furthermore, it is preferable that the product of saturation magnetization and film thickness of the first magnetic layer is substantially equal to the product of saturation magnetization and film thickness of the second magnetic layer. It is preferable that a three-layered film made up of the first magnetic layer, the second non-magnetic layer, and the second magnetic layer is a layered antiferromagnetic body.

Still furthermore, it is preferable that at least part of the first magnetic layer is in direct contact with the vertical bias layer. Alternatively, an underlying layer for magnetic layer may be provided below the first magnetic layer such that the underlying layer for magnetic layer is brought into contact with the vertical bias layer. A vertical bias layer protective layer may be provided on the vertical bias layer such that the vertical bias layer protective layer is brought into contact with the magnetic layer or the underlying layer for magnetic layer. Similarly, it is desirable that at least part of the second magnetic layer is in direct contact with the vertical bias layer. Alternatively, an upper layer may be provided on the second magnetic layer such that the upper layer is brought into contact with the vertical bias layer. An underlying layer for vertical bias layer may be provided below the vertical bias layer such that the underlying layer for vertical bias layer is brought into contact with the magnetic layer or the upper layer.

A magneto-resistance effect head according to the present invention comprises the magneto-resistance effect element and a lower shield layer serving as a substrate for the magneto-resistance effect element. The magneto-resistance effect head also comprises an upper conductive layer, provided on the magneto-resistance effect element, for inputting a sense current for detecting a change in electrical resistance of the magneto-resistance effect element into the magneto-resistance effect element; and an upper shield layer provided on the upper electrically conductive.

A magneto-resistance transducer system according to the present invention comprises the magneto-resistance effect head, an electric current generator circuit for supplying a sense current to the magneto-resistance effect head, and a data read circuit for detecting a change in electrical resistance of the magneto-resistance effect head to determine a magnetic field applied to the magneto-resistance effect head.

A magnetic storage system according to the present invention comprises the magneto-resistance transducer system and a magnetic storage medium having a plurality of tracks for allowing the magneto-resistance transducer system to write and read data thereon. The magnetic storage system also comprises a first actuator for moving the magneto-resistance transducer system to where a selected track is located in the magnetic storage medium, and a second actuator for rotatably driving the track.

The present invention makes it possible to provide a magneto-resistance effect head which has reduced noise in the read signal waveform and improved (S/N) ratio and bit error rate in comparison with the prior art. It is also possible to employ the magneto-resistance effect head to provide a high-performance magnetic read/write device and a magnetic memory device.

DETAILED DESCRIPTION OF THE PREFERRED EMBODIMENTS

Now, the present invention will be explained below more specifically with reference to the accompanying drawings in accordance with the embodiments. Incidentally, all the fragmentary sectional views employed in the embodiments of the present invention illustrate a magneto-resistance effect head cut in parallel to the surface of an air bearing. In addition, in the embodiments of the present invention, the expression of "patterning" of layers or the like denotes allowing part of the layers or the like to remain and part thereof to be removed by etching or like means in illustrated regions within illustrated sections. Thus, this expression will never mean allowing part of the layers or the like to remain and part thereof to be removed by etching or like means in non-illustrated sections or regions. In other words, in the embodiments of the present invention, the layers or the like that are not denoted with the expression of "patterning" may also allow part thereof to remain and part thereof to be removed by etching or like means in non-illustrated sections or regions.

Now, described below are a magneto-resistance effect head according to a first embodiment of the present invention and a method for fabricating the head. FIGS. 4-10 are fragmentary sectional views illustrating the steps of the method for fabricating the magneto-resistance effect head according to this embodiment in the order in which they appear in the method.

Figure 4:
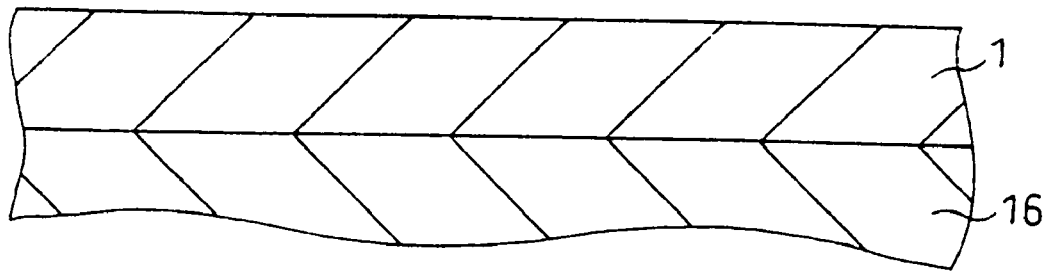
FIGS. 4-10 are fragmentary sectional views illustrating a method for fabricating a magneto-resistance effect head according to a first embodiment of the present invention.

First, as shown in FIG. 4, a lower shield layer 16 and a lower conductive layer 1 are formed successively on a substrate (not shown).

Figure 5:
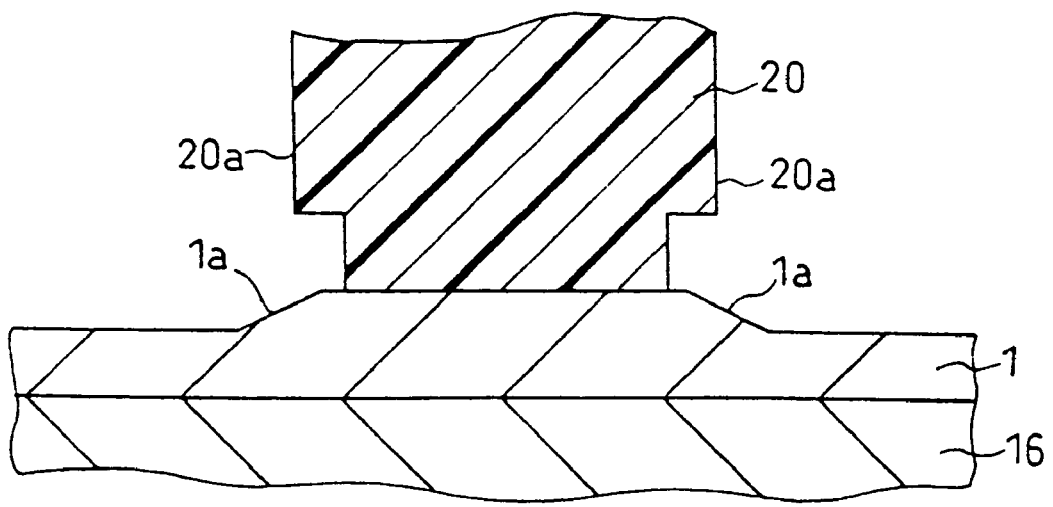

Then, as shown in FIG. 5, a photoresist 20 having an opening portion 20a is formed on the lower conductive layer 1, which is in turn etched by dry etching or like means to form a recessed portion 1a on the surface of lower conductive layer 1.

Figure 6:
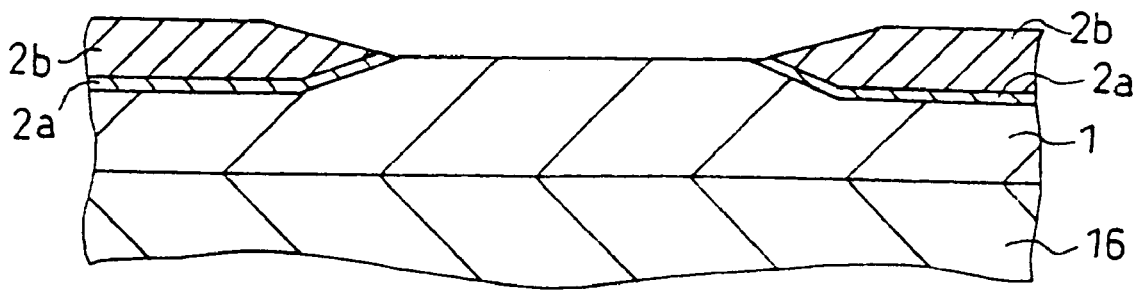

Then, as shown in FIG. 6, on the recessed portion 1a of the lower conductive layer 1, deposited are an underlying layer for vertical bias layer 2a and a vertical bias layer 2b so as to be partially buried in the recessed portion of the lower conductive layer 1, and thereafter the photoresist 20 is removed.

Figure 7:
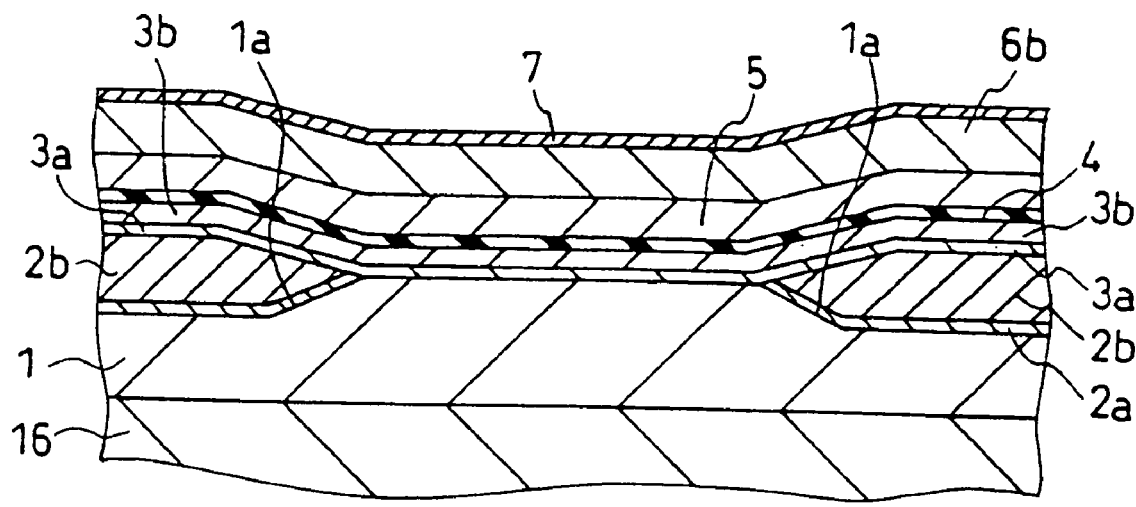

Then, as shown in FIG. 7, on the lower conductive layer 1 and the vertical bias layer 2b, formed and stacked in the following order are an underlying layer for free layer 3a, a the free layer 3b, a non-magnetic layer 4, a fixed layer 5, a fixing layer 6b, and an upper layer 7.

Figure 8:
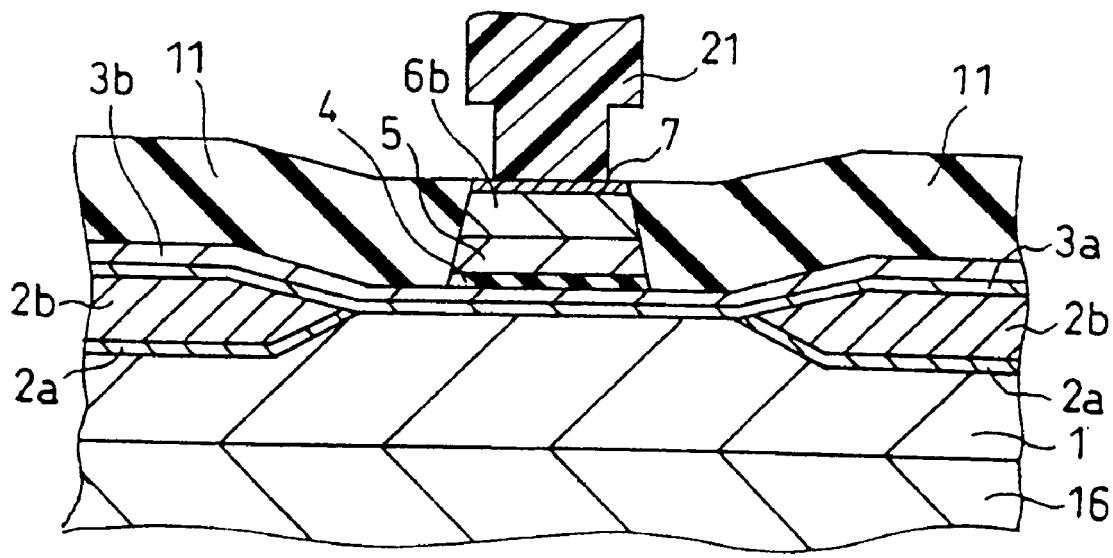

Then, as shown in FIG. 8, there is formed a photoresist 21 immediately below the upper surface of the upper layer 7 so as to cover the central portion of the region where the vertical bias layer 2b is not formed. Then, with the photoresist 21 being employed as a mask, the non-magnetic layer 4, the fixed layer 5, the fixing layer 6b, and the upper layer 7 are etched by dry etching or the like to form an insulation layer 11 so as to be buried in the etched portion. At this time, the upper surface of the upper layer 7 is exposed on the upper surface of the insulation layer 11.

Figure 9:
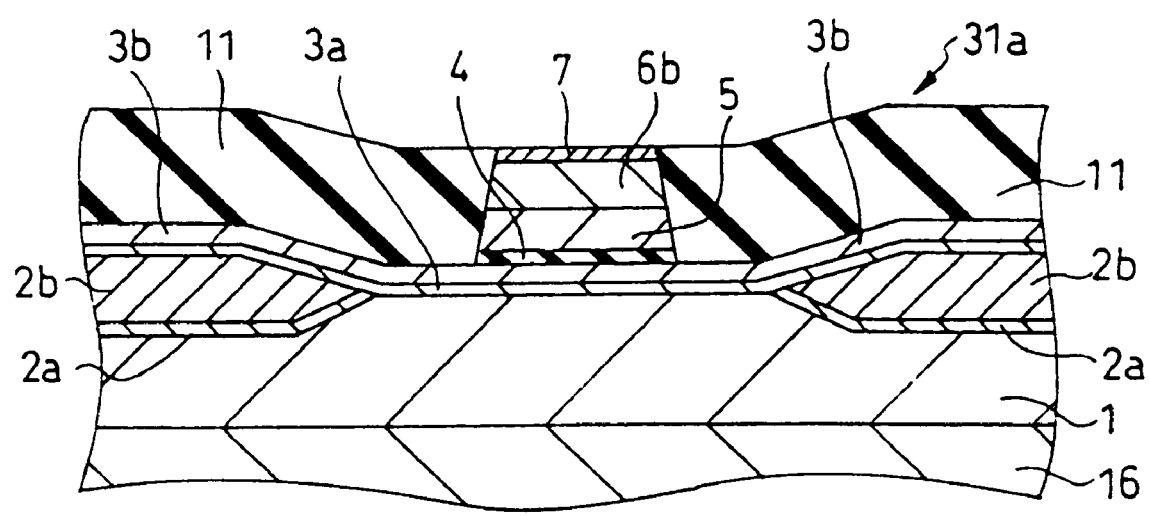

Then, as shown in FIG. 9, the photoresist 21 is removed. Then, a magneto-resistance effect element 31a is formed which is made up of the lower conductive layer 1, the underlying layer for vertical bias layer 2a, the vertical bias layer 2b, the underlying layer for free layer 3a, the free layer 3b, the non-magnetic layer 4, the fixed layer 5, the fixing layer 6b, and the upper layer.

Figure 10:
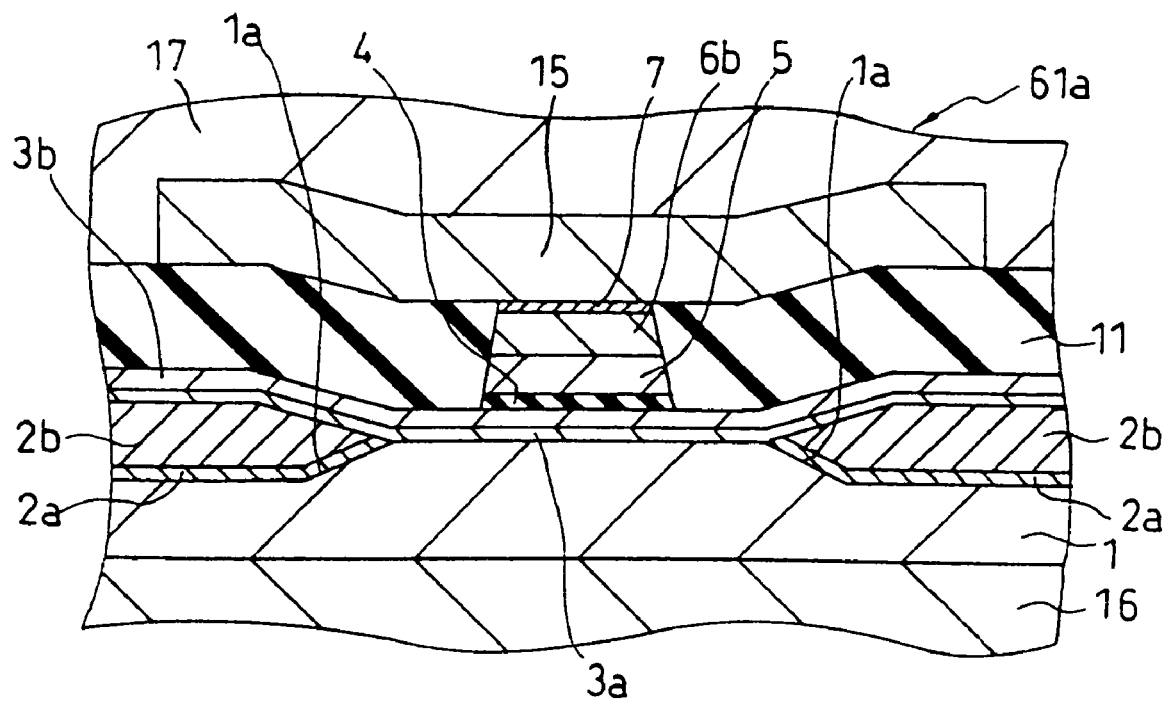

Then, as shown in FIG. 10, there is deposited an upper conductive layer 15 on the upper layer 7 and the insulation layer 11, and a photoresist (not shown) is formed, which is in turn employed as a mask to pattern the upper conductive layer 15 by dry etching or the like. Thereafter, the photoresist is removed on which formed is an upper shield layer 17, thereby forming a magneto-resistance effect head 61a.

Now, the structure of the magneto-resistance effect head 61a according to this embodiment is described. As shown in FIG. 10, provided are the lower shield layer 16 and the lower conductive layer 1. The lower conductive layer 1 has the recessed portion 1a, and the recessed portion 1a is provided with the underlying layer for vertical bias layer 2a and the vertical bias layer 2b. The underlying layer for free layer 3a and the free layer 3b are provided in the portion of the lower conductive layer 1, where provided is neither the underlying layer for vertical bias layer 2a nor the vertical bias layer 2b, and on the vertical bias layer 2b. On top of the free layer 3b, formed in the following order are the non-magnetic layer 4 patterned so as not to be disposed immediately above the vertical bias layer 2b, the fixed layer 5, the fixing layer 6b, and the upper layer 7.

In addition, the non-magnetic layer 4, the fixed layer 5, the fixing layer 6b, and the upper layer 7 are buried in the insulation layer 11, and the upper surface of the upper layer 7 is exposed to the upper surface of the insulation layer 11. Furthermore, on top of the upper layer 7 and the insulation layer 11, provided is the upper conductive layer 15, on top of which the upper shield layer 17 is formed.

In the aforementioned structure, the lower conductive layer 1 and the upper conductive layer 15 act as the upper and lower electrodes for conducting a sense current in the direction perpendicular to stacked layer planes. Here, the stacked layer planes are formed of the underlying layer for free layer 3a disposed between the lower conductive layer 1 and the upper conductive layer 15, the free layer 3b, the non-magnetic layer 4, the fixed layer 5, the fixing layer 6b, and the upper layer 7. Materials forming the lower conductive layer 1 and the upper conductive layer 15 include a single material of one type, a mixture of materials of two or more types, a compound of materials of two or more types, or a multi-layered film formed of materials of two or more types, which are selected from the group consisting of Au, Ag, Cu, Mo, W, Y, Ti, Zr, Hf, V, Nb, Pt, and Ta. In particular, Au, Ag, Cu, Pt, and Ta are more favorable. In addition, materials forming the substrate include an altic, SiC, and alumina.

In addition, the vertical bias layer 2b is to apply a vertical bias magnetic field to the free layer 3b, while the underlying layer for vertical bias layer 2a is to improve the film quality such as the crystallization property of the vertical bias layer 2b and the magnetic properties of the vertical bias layer 2b. Materials forming the underlying layer for vertical bias layer 2a include a single material of one type, a mixture of materials of two or more types, or a multi-layered film formed of materials of two or more types, which are selected from the group consisting of Ta, Hf, Zr, W, Cr, Ti, Mo, Pt, Ni, Ir, Cu, Ag, Co, Zn, Ru, Rh, Re, Au, Os, Pd, Nb, V, Fe, FeCo, FeCoNi, and NiFe. In particular, Cr, Fe, and CoFe are more favorable. On the other hand, materials forming the vertical bias layer 2b include a single material of one type, a mixture of materials of two or more types, or a multi-layered film formed of materials of two or more types, which are selected from the group consisting of CoCrPt, CoCr, CoPt, CoCrTa, FeMn, NiMn, Ni oxide, NiCo oxide, Fe oxide, NiFe oxide, IrMn, PtMn, PtPdMn, ReMn, Co ferrite, and Ba ferrite. In particular, CoCrPt, CoCrTa, CoPt, NiMn, and IrMn are more favorable.

When an external magnetic field is applied to a magnetic sensor including the magneto-resistance effect head 61a, the free layer 3b acting as a magnetic layer changes the orientation of magnetization in accordance with the direction and the magnitude of the magnetic field. An external magnetic field is applied to the free layer 3b via the vertical bias layer 2b. In addition, the underlying layer for free layer 3a is to improve the film quality such as the crystallization property of the free layer 3b and the magnetic properties of the free layer 3b. Materials forming the underlying layer for free layer 3a include a single material of one type, a mixture of materials of two or more types, a compound of materials of two or more types, or a multi-layered film formed of materials of two or more types, which are selected from the group consisting of Ta, Hf, Zr, W, Cr, Ti, Mo, Pt, Ni, Ir, Cu, Ag, Co, Zn, Ru, Rh, Re, Au, Os, Pd, Nb, and V. In particular, Ta, Zr, and Hf are more favorable. Materials forming the free layer 3b include alloys and amorphous magnetic materials such as NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, and CoZrMoNi. As an additive element, one or more types of elements selected from the group consisting of Ta, Hf, Zr, W, Cr, Ti, Mo, Pt, Ni, Ir, Cu, Ag, Co, Zn, Ru, Rh, Re, Au, Os, Pd, Nb, and V can also be employed. More favorable are NiFe, a two-layer film of NiFe/CoFe, a two-layer film of NiFe/NiFeCo, and a two-layer film of NiFe/Co.

The fixing layer 6b is to pin the orientation of magnetization of the fixed layer 5, while the underlying layer for fixing layer 6a is to improve the film quality such as the crystallization property of the fixing layer 6b and the magnetic properties of the fixing layer 6b. On the other hand, the fixed layer 5 has an orientation of magnetization that is pinned by the fixing layer 6b.

Materials forming the underlying layer for fixing layer 6a include a single material of one type, a mixture of materials of two or more types, a compound of materials of two or more types, or a multi-layered film formed of materials of two or more types, which are selected from the group consisting of Ta, Hf, Zr, W, Cr, Ti, Mo, Pt, Ni, Ir, Cu, Ag, Co, Zn, Ru, Rh, Re, Au, Os, Pd, Nb, and V. In particular, Ta, Zr, and Hf are more favorable. On the other hand, as a material for the fixing layer 6b, it is possible to employ FeMn, NiMn, IrMn, RhMn, PtPdMn, ReMn, PtMn, PtCrMn, CrMn, CrAl, TbCo, CoCr, CoCrPt, CoCrTa, PtCo and the like. In particular, a favorable material is PtMn or PtMn to which doped is at least one type of element selected from the group consisting of Ti, V, Cr, Co, Cu, Zn, Y, Zr, Nb, Mo, Tc, Ru, Rh, Pd, Ag, Hf, Ta, W, Re, Os, Ir, Pt, Au, Si, and Al.

As materials forming the fixed layer 5, it is possible to use alloys and amorphous magnetic materials such as NiFe, Co, CoFe, NiFeCo, FeCo, CoFeB, CoZrMo, CoZrNb, CoZr, CoZrTa, CoTa, CoTaHf, CoNbHf, CoZrNb, CoHfPd, CoTaZrNb, and CoZrMoNi.

In addition, it is also possible to use a layered film of those materials combined with at least one type of metal or an alloy of the metals selected from the group consisting of Ti, V, Cr, Cu, Zn, Y, Zr, Nb, Mo, Tc, Ra, Rh, Pd, Ag, Hf, Ta, W, Re, Os, Ir, Pt, Au, Si, Al, and Ni. In particular, three-layer films such as Co/Ru/Co, CoFe/Ru/CoFe, CoFeNi/Ru/CoFeNi, Co/Cr/Co. CoFe/Cr/CoFe, and CoFeNi/Cr/CoFeNi are favorable.

Then, non-magnetic layer 4 is disposed between the free layer 3b and the fixed layer 5, varying in electrical resistance in accordance with the angle between the orientation of magnetization of the free layer 3b and that of the fixed layer 5. As materials forming the non-magnetic layer 4, used are metal, oxide, nitride, a mixture of oxide and nitride, a multi-layered film of metal and oxide, a multi-layered film of metal and nitride, or a multi-layered film a mixture of metal, oxide, and nitride. And, the metals include at least one type of metal selected from the group consisting of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V. The oxides are formed of these metals and the nitrides are also formed of these metals. In particular, Al oxide and Cu are favorable.

In addition, the upper layer 7 is to prevent the layer disposed thereunder from being corroded during the processes for fabricating the magneto-resistance effect head 61a and in the service environment. Materials forming the upper layer 7 include a single material of one type, a mixture of materials of two or more types, a compound of materials of two or more types, or a multi-layered film formed of materials of two or more types, which are selected from the group consisting of Au, Ag, Cu, Mo, W, Y, Ti, Pt, Zr, Hf, V, Nb, Ta, and Ru. In particular, Ta, Zr, and Ti are favorable.

Furthermore, the insulation layer 11 is to prevent the leakage of a sense current flowing through the non-magnetic layer 4. Materials forming the insulation layer 11 include a single material, a mixture of materials, and a multi-layered film formed of materials, which are selected from the group consisting of Al oxide, Si oxide, aluminum nitride, silicon nitride, and diamond-like carbon.

Still furthermore, materials forming the lower shield layer 16 and the upper shield layer 17 include a single material of one type, a mixture of materials of two or more types, or a multi-layered film formed of materials of two or more types, which are selected from the group consisting of NiFe, CoZr, CoFeB, CoZrMo, CoZrNb, CoZrTa, CoHf, CoTa, CoTaHf, CoNbHf, CoZrNb, CoHfPd, CoTaZrNb, CoZrMoNi, FeAlSi, a Fe nitride base material, MnZn ferrite, NiZn ferrite, and MgZn ferrite.

Now, the operation of the magneto-resistance effect head 61a is explained below. When an external magnetic field is applied to the magneto-resistance effect head 61a, a magnetic field is applied to the free layer 3b via the vertical bias layer 2b, causing the orientation of magnetization of the free layer 3b to change in accordance with the direction and magnitude of the magnetic field applied thereto. And, since the orientation of magnetization of the fixed layer 5 is pinned by the fixing layer 6b, a change occurs in orientation of magnetization between the fixed layer 5 and the free layer 3b, causing a change in electrical resistance of the non-magnetic layer 4. In this state, the lower conductive layer 1 and the upper conductive layer 15 allow a sense current to flow in the direction perpendicular to the non-magnetic layer 4 to measure the electrical resistance of the non-magnetic layer 4, thereby making it possible to detect the external magnetic field.

Now, an effect of this embodiment is described. As shown in FIG. 10, the magneto-resistance effect head 61a according to this embodiment has the free layer 3b which is greater than the fixed layer 5 in length, and only the free layer 3b is disposed near the vertical bias layer 2b. This allows the vertical bias layer 2b to apply a magnetic field positively and effectively to the free layer 3b and makes it possible to prevent the leakage of a sense current from the fixed layer 5 to the vertical bias layer 2b. This allows almost all the sense current applied to flow through the non-magnetic layer 4, thereby improving the performance of the magneto-resistance effect head 61a.

Furthermore, part of the direction of thickness of the patterned underlying layer for vertical bias layer 2a and the vertical bias layer 2b is buried in the recessed portion 1a of the lower conductive layer 1. This provides a gradual slope to the end portion of the underlying layer for vertical bias layer 2a and the vertical bias layer 2b, thereby allowing the vertical bias layer 2b to apply a vertical bias magnetic field to the free layer 3b more effectively.

Figure 11:
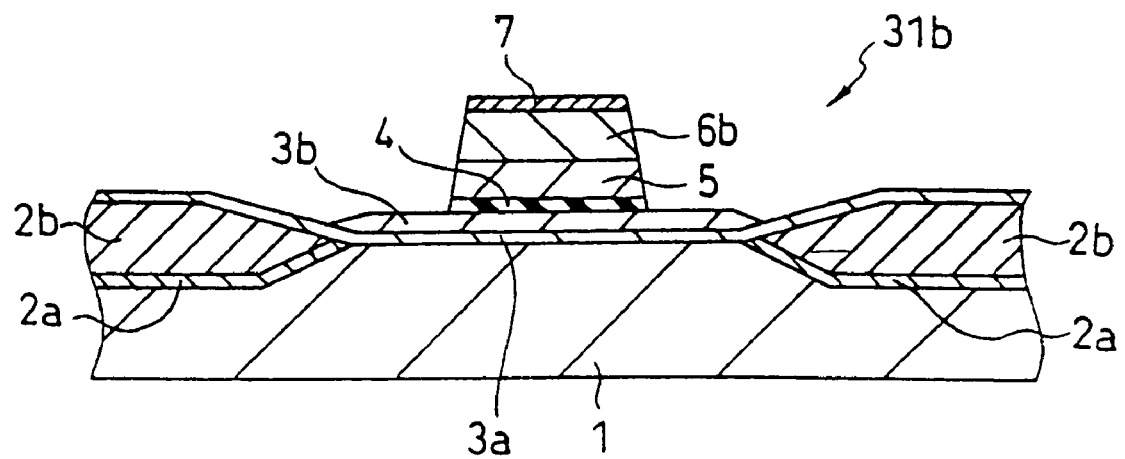
FIG. 11 is a fragmentary sectional view illustrating the structure of a magneto-resistance effect head according to a variation of this embodiment.
Figure 12:
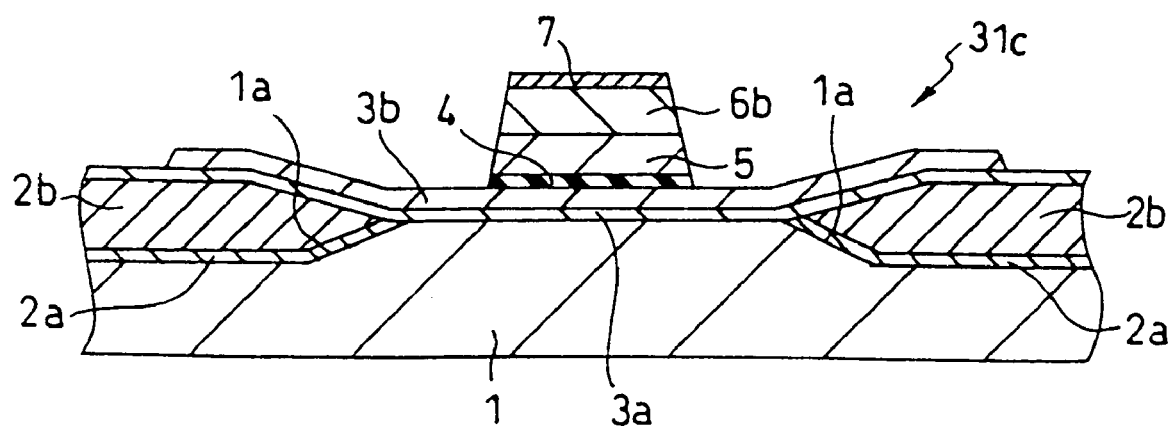
FIG. 12 is a fragmentary sectional view illustrating the structure of a magneto-resistance effect head according to another variation of this embodiment.

FIGS. 11 and 12 are fragmentary sectional views illustrating a variation of the magneto-resistance effect element according to this embodiment. FIG. 11 illustrates a magneto-resistance effect element 31b having the free layer 3b patterned to bring the end portion thereof into contact with that of the vertical bias layer 2b.

On the other hand, FIG. 12 illustrates a magneto-resistance effect element 31c having the free layer 3b patterned to make the end portion thereof overlap that of the vertical bias layer 2b. Like the magneto-resistance effect element 31a, the magneto-resistance effect element 31c shown in FIGS. 11, 12 can constitute the magneto-resistance effect head.

Incidentally, this embodiment has shown that the non-magnetic layer 4 is patterned in conjunction with the fixed layer 5, the fixing layer 6b, and the upper layer 7. However, the non-magnetic layer 4 can be extended like the free layer 3b. Alternatively, the non-magnetic layer 4 may be patterned to be larger than the fixing layer 6b and the fixing layer 6b and smaller than the free layer 3b.

In addition, the underlying layer for vertical bias layer 2a, the underlying layer for free layer 3a, and the upper layer 7 may be omitted, and a protective layer for protecting the vertical bias layer may be provided on top of the vertical bias layer 2b.

Furthermore, this embodiment has shown that the lower shield layer 16 and the lower conductive layer 1 are provided separately. However, the lower shield layer 16 and lower conductive layer 1 may be a common layer. In this case, the lower conductive layer 1 is omitted. In addition, the upper conductive layer 15 and the upper shield 17 may be a common layer. In this case, the upper conductive layer 15 is omitted. This allows the gap between the top and bottom shield layers to be made smaller. Furthermore, an upper gap layer may be provided between the upper conductive layer 15 and the shield layer 17 or a lower gap layer may be provided between the lower shield layer 16 and the lower conductive layer 1.

Now, a second embodiment of the present invention is described below. FIGS. 13-21 are fragmentary sectional views illustrating the steps of a method for fabricating a magneto-resistance effect head according to this embodiment in the order in which they appear.

Figure 13:
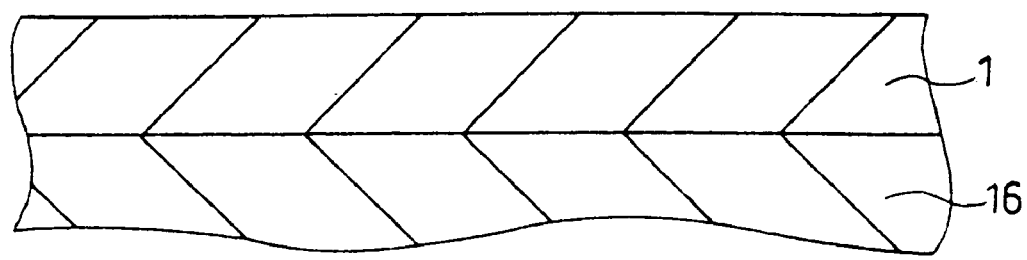
FIGS. 13-21 are fragmentary sectional views illustrating a method for fabricating a magneto-resistance effect head according to a second embodiment of the present invention.

First, as shown in FIG. 13, the lower shield layer 16 and the lower conductive layer 1 are successively formed on a substrate (not shown).

Figure 14:
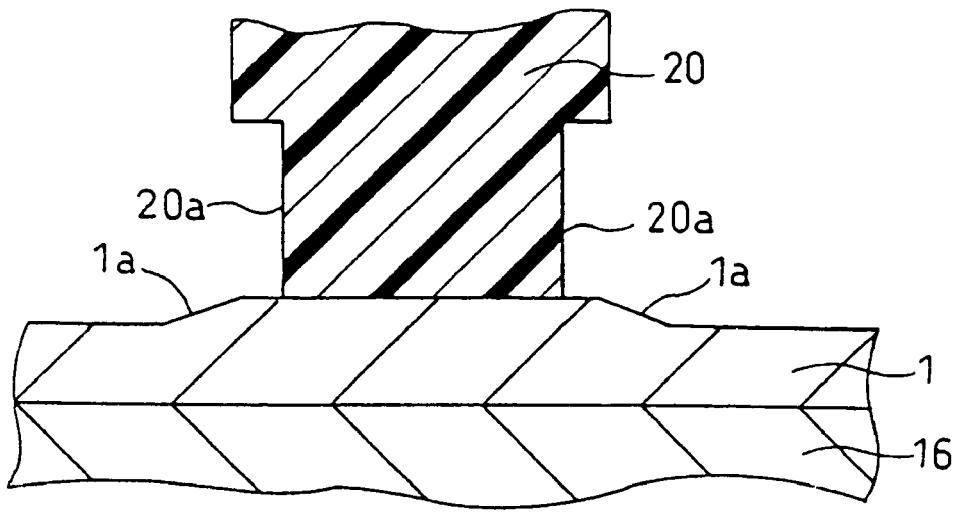

Then, as shown in FIG. 14, the photoresist 20 having the opening portion 20a is formed on top of the lower conductive layer 1 which is etched by dry etching or like means to form the recessed portion 1a on the surface of the lower conductive layer 1.

Figure 15:
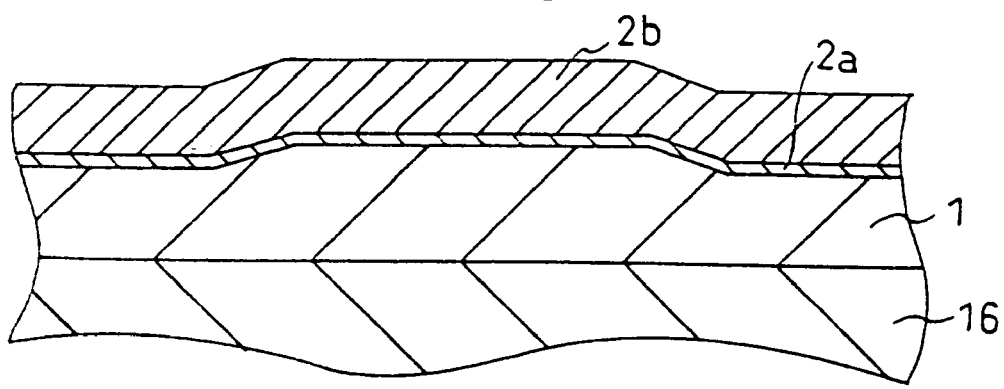

Then, as shown in FIG. 15, the underlying layer for vertical bias layer 2a and the vertical bias layer 2b are deposited on top of the lower conductive layer 1 after the photoresist 20 has been removed.

Figure 16:
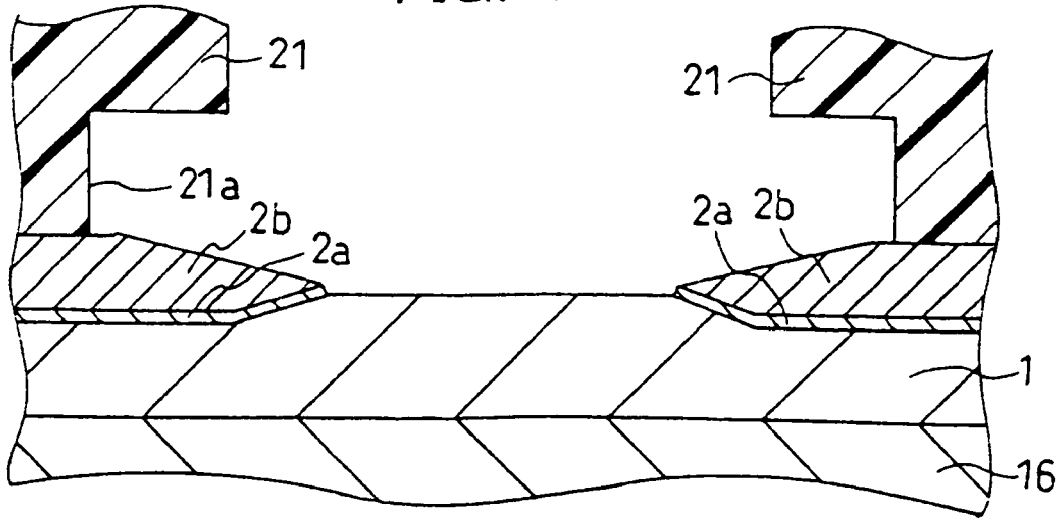

Then, as shown in FIG. 16, the photoresist 21 is formed to cover the region having the recessed portion 1a arranged immediately below the vertical bias layer 2b and provide an opening portion 21a for the region having no recessed portion 1a arranged immediately below the vertical bias layer 2b. Subsequently, with the photoresist 21 being employed as a mask, the underlying layer for vertical bias layer 2a and the vertical bias layer 2b are etched and thereby patterned by dry etching or like means.

Figure 17:
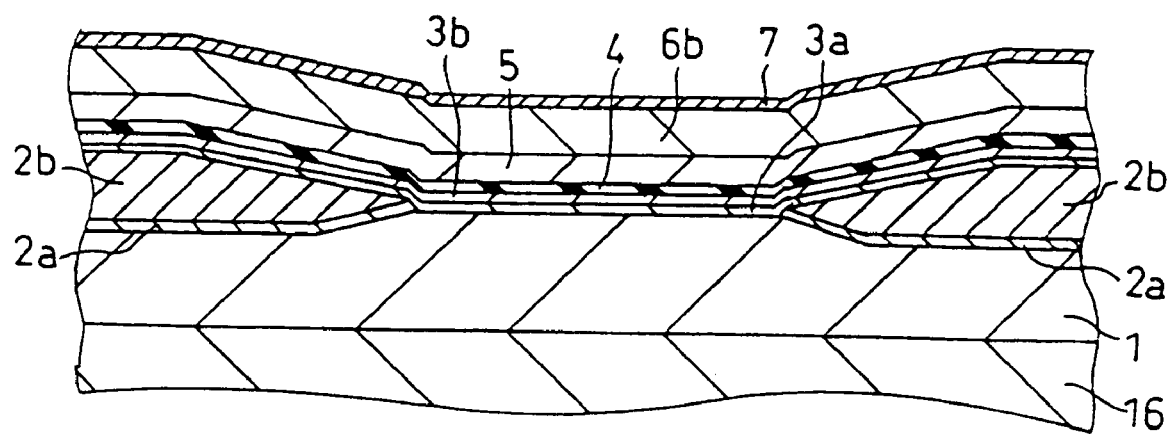

Then, as shown in FIG. 17, on top of the lower conductive layer 1 and vertical bias layer 2b, formed and layered in the following order are the underlying layer for free layer 3a, the free layer 3b, the non-magnetic layer 4, the fixed layer 5, the fixing layer 6b, and the upper layer 7.

Figure 18:
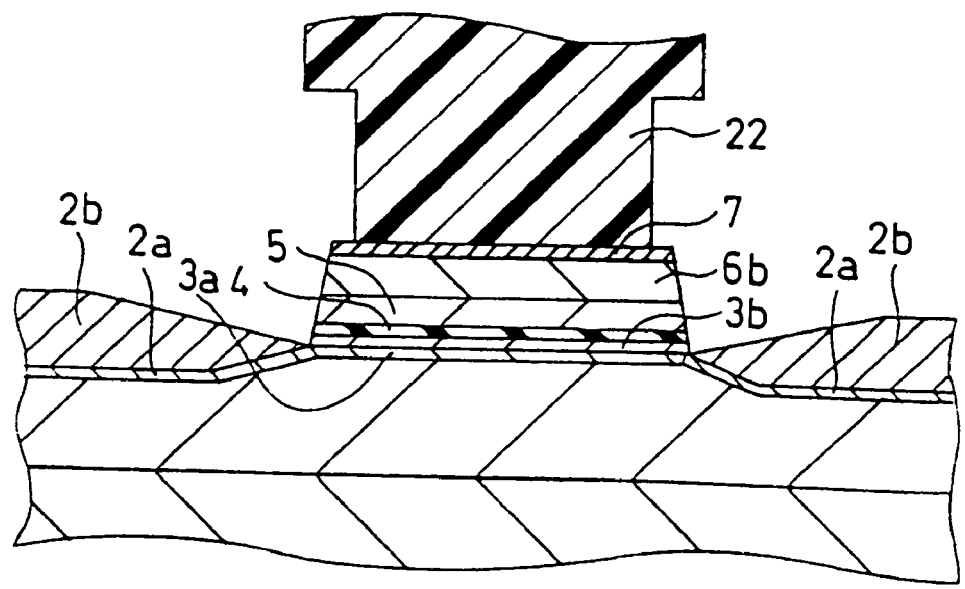

Then, as shown in FIG. 18, a photoresist 22 is provided to cover the region having no vertical bias layer 2b arranged immediately below the upper layer 7. With the photoresist 22 being employed as a mask, the underlying layer for free layer 3a, the free layer 3b, the non-magnetic layer 4, the fixed layer 5, the fixing layer 6b, and the upper layer 7 are patterned by dry etching or like means.

Figure 19:
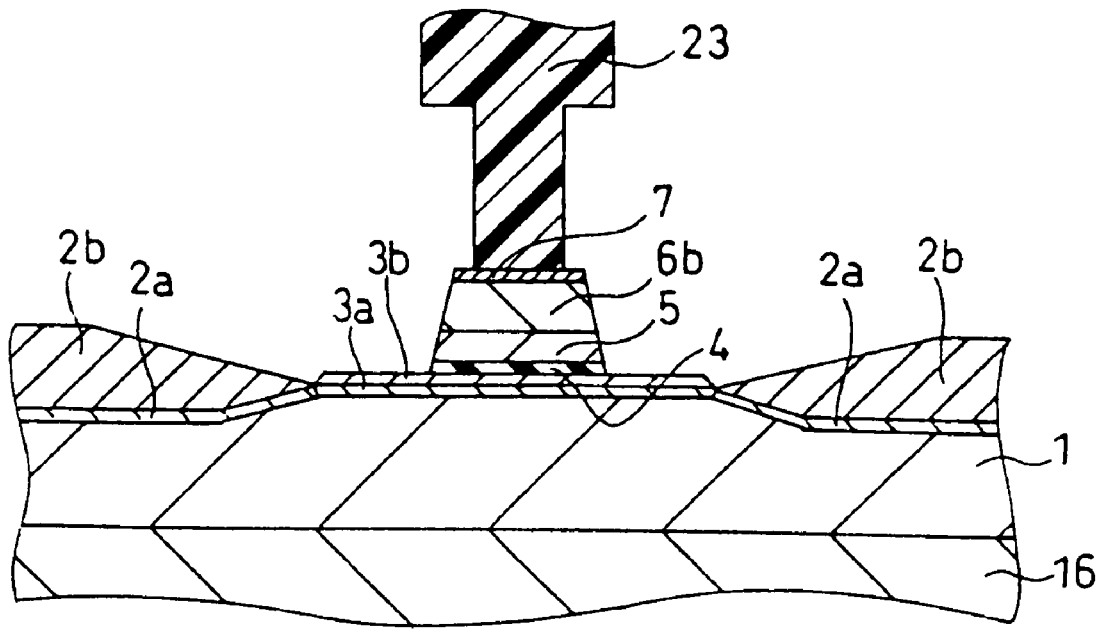

Then, as shown in FIG. 19, the photoresist 22 is removed to form a photoresist 23 on top of the upper layer 7 to cover the central portion of the upper layer 7. With the photoresist 23 being employed as a mask, the non-magnetic layer 4, the fixed layer 5, the fixing layer 6b, and the upper layer 7 are patterned by dry etching or like means.

Figure 20:
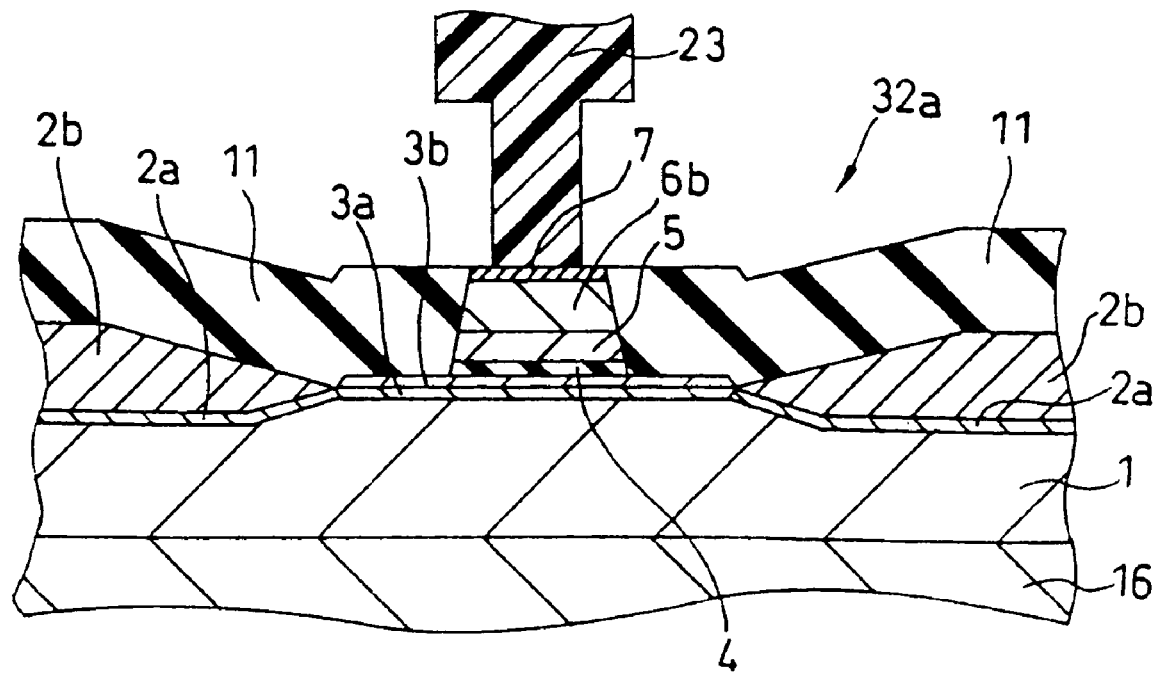
Figure 21:
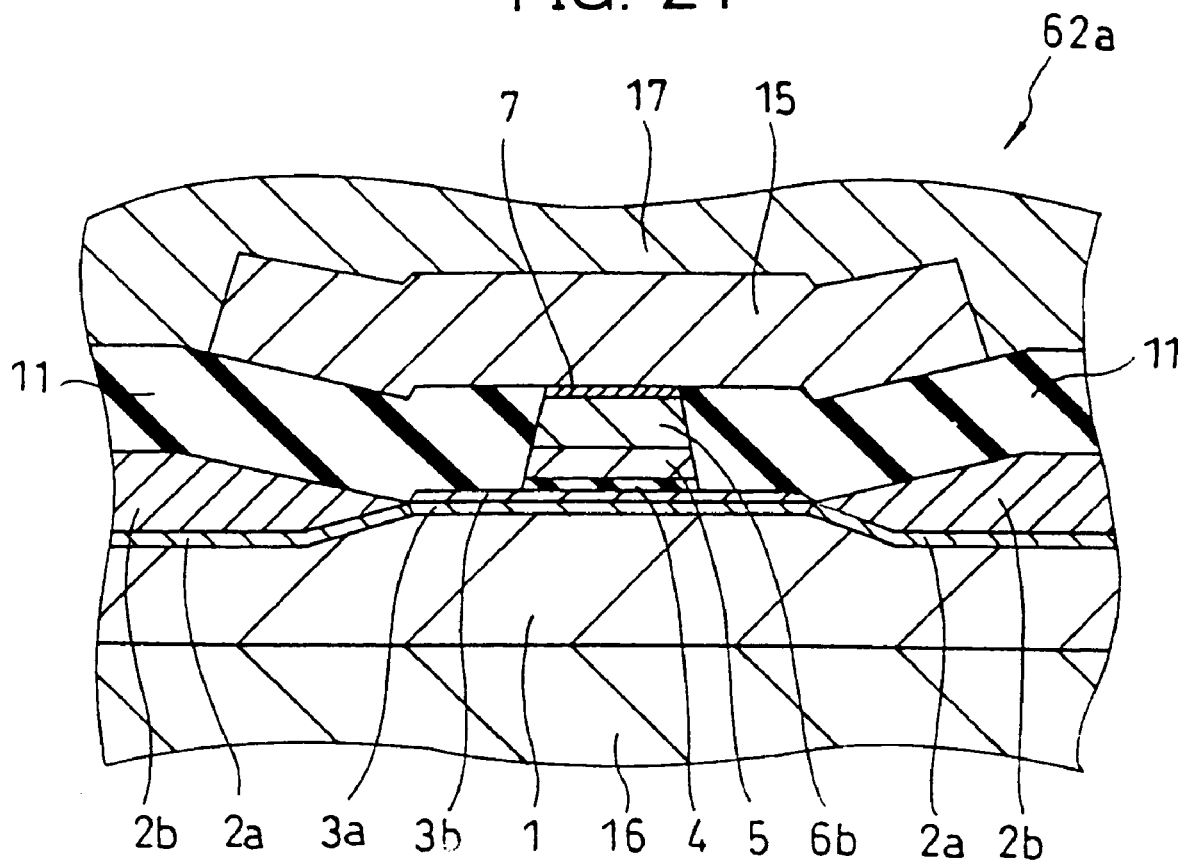

Then, as shown in FIG. 20, the periphery of the pattern of the non-magnetic layer 4, the fixed layer 5, the fixing layer 6b, and the upper layer 7 is buried in the insulation layer 11, thereby forming a magneto-resistance effect element 32a. Then, as shown in FIG. 21, after the photoresist 23 has been removed, the upper conductive layer 15 is deposited on top of the upper layer 7 and the insulation layer 11 and then a photoresist (not shown) is formed. With this photoresist being employed as a mask, the upper conductive layer 15 is patterned by dry etching or like means. Then, this photoresist is removed to form the upper shield layer 17 thereon and thus a magneto-resistance effect head 62a is formed.

Now, the structure of the magneto-resistance effect head 62a according to this embodiment is described below. As shown in FIG. 21, the magneto-resistance effect head 62a according to this embodiment has a different shape of the underlying layer for free layer 3a and the free layer 3b in comparison with the magneto-resistance effect head 61a according to the first embodiment shown in FIG. 10. In this embodiment, the end portion of the underlying layer for free layer 3a and the free layer 3b are flush and in contact with that of the underlying layer for vertical bias layer 2a and the vertical bias layer 2b. In the magneto-resistance effect head 62a according to this embodiment, the structure and operation thereof is the same as those of the magneto-resistance effect head 61a according to the aforementioned first embodiment except for the shape of the underlying layer for free layer 3a and the free layer 3b.

Incidentally, in this embodiment, it has been explained in which the non-magnetic layer 4 is patterned in conjunction with the fixed layer 5, the fixing layer 6b, and the upper layer 7. However, like the first embodiment, the non-magnetic layer 4 may be extended as the free layer 3b. Alternatively, the non-magnetic layer 4 may be patterned to be larger than the pattern of the fixed layer 5, the fixing layer 6b, and the upper layer 7, and smaller than the pattern of the free layer 3b.

Furthermore, in this embodiment, it has been explained in which the upper conductive layer 15 is patterned, however, the upper conductive layer 15 may be extended without being patterned.

Now, described below is a third embodiment according to the present invention. FIGS. 22-28 are fragmentary sectional views illustrating the steps of a method for fabricating a magneto-resistance effect head according to this embodiment in the order in which they appear.

Figure 22:
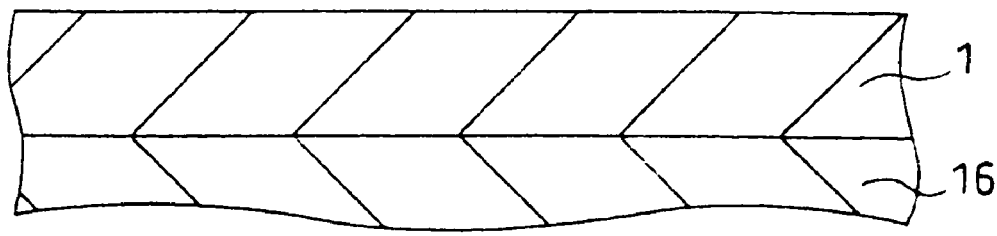
FIGS. 22-28 are fragmentary sectional views illustrating a method for fabricating a magneto-resistance effect head according to a third embodiment of the present invention.

First, as shown in FIG. 22, the lower shield layer 16 and the lower conductive layer 1 are successively formed on a substrate (not shown).

Figure 23:
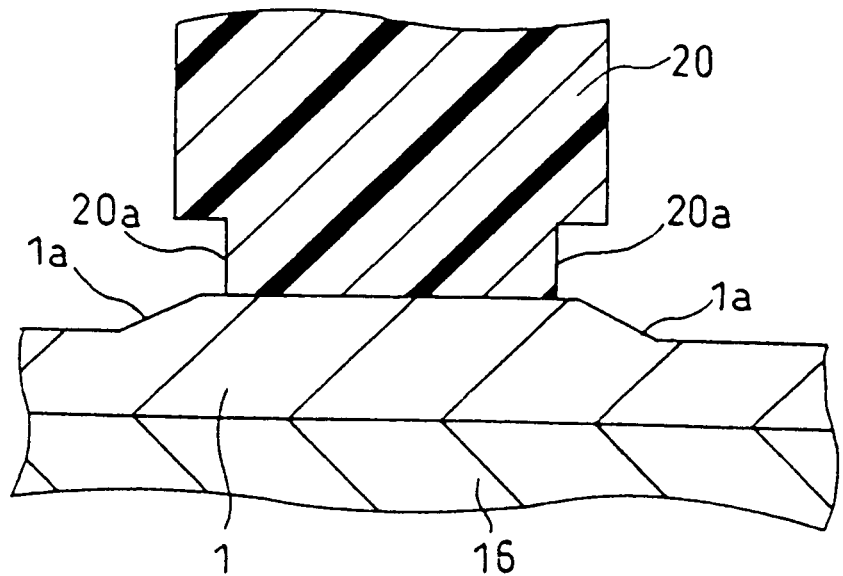

Then, as shown in FIG. 23, the photoresist 20 having the opening portion 20a is formed on top of the lower conductive layer 1, which is then etched by dry etching or like means to form the recessed portion 1a on the surface of the lower conductive layer 1.

Figure 24:
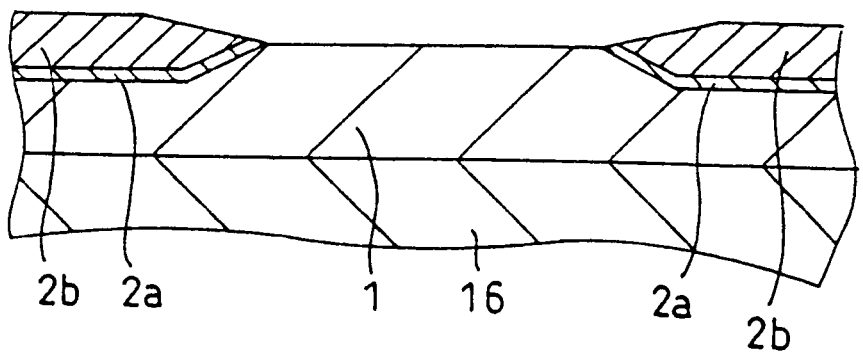

Then, as shown in FIG. 24, with the photoresist 20 being employed as a mask, the underlying layer for vertical bias layer 2a and the vertical bias layer 2b are deposited so as to partially fill in the recessed portion 1a of the lower conductive layer 1, and then the photoresist 20 is removed.

Figure 25:
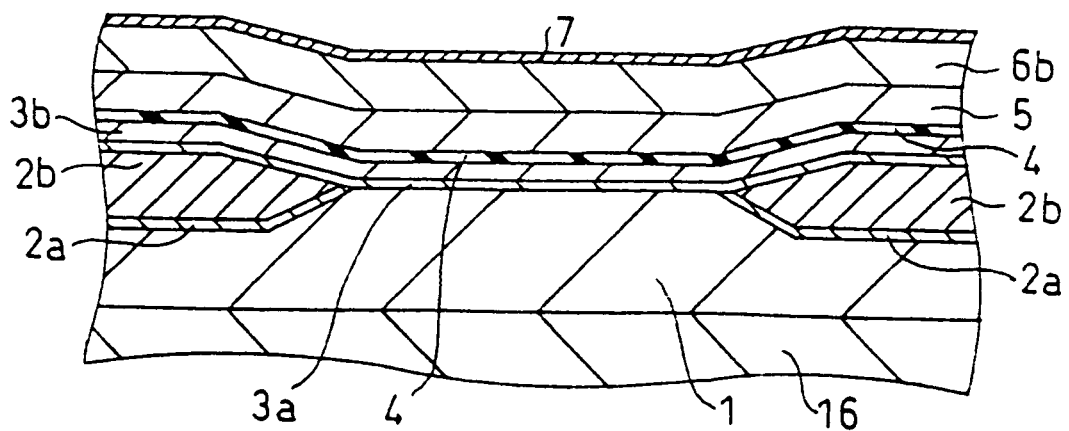

Then, as shown in FIG. 25, on top of the lower conductive layer 1 and the vertical bias layer 2b, formed and layered in the following order are the underlying layer for free layer 3a, the free layer 3b, the non-magnetic layer 4, the fixed layer 5, the fixing layer 6b, and the upper layer 7.

Figure 26:
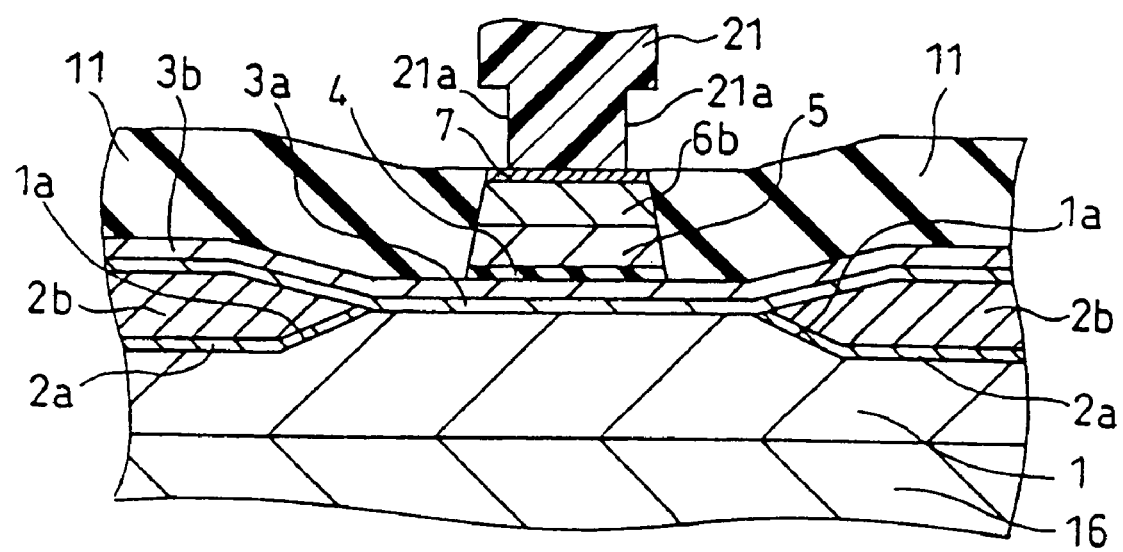

Then, as shown in FIG. 26, the photoresist 21 is provided to cover the central portion of the region having no vertical bias layer 2b arranged immediately below the upper surface of the upper layer 7. With the photoresist 21 being employed as a mask, the non-magnetic layer 4, the fixed layer 5, the fixing layer 6b, and the upper layer 7 are patterned by dry etching or like means. Then, the periphery of the non-magnetic layer 4, the fixed layer 5, the fixing layer 6b, and the upper layer 7 is buried in the insulation layer 11.

Figure 27:
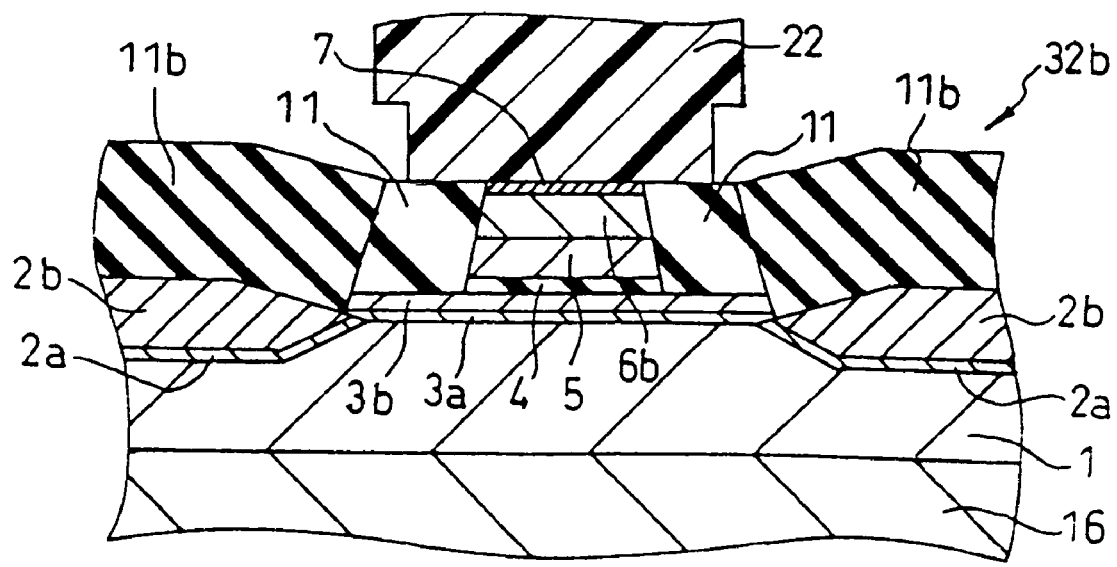

Then, as shown in FIG. 27, the photoresist 21 is removed to form the photoresist 22, patterned to cover a region broader than that covered by the photoresist 21, at a position on the upper layer 7 and the insulation layer 11 where the photoresist 21 has once been formed. With the photoresist 22 being employed as a mask, the underlying layer for free layer 3a, the free layer 3b, and the insulation layer 11 are etched by dry etching or like means and thereby patterned. Subsequently, this etched region is buried in the insulation layer 11b to thereby form a magneto-resistance effect element 32b.

Figure 28:
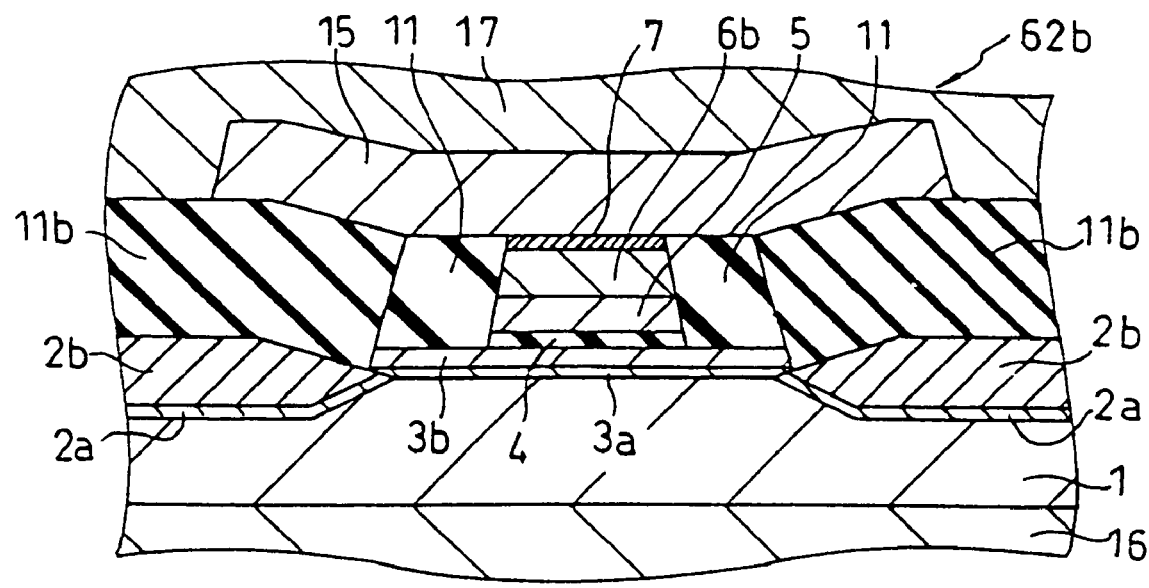

Then, as shown in FIG. 28, the photoresist 22 is removed. Thereafter, the upper conductive layer 15 is deposited on top of the upper layer 7, the insulation layer 11, and the insulation layer 11b to form a photoresist (not shown), which is in turn employed to pattern the upper conductive layer 15 by dry etching or like means. Then, this photoresist is removed and the upper shield layer 17 is formed thereupon to form a magneto-resistance effect head 62b.

The magneto-resistance effect head 62b formed according to this embodiment has the same structure and operation as those of the magneto-resistance effect head 62a according to the second embodiment except that the insulation layers 11 and 11b are formed through two steps.

Now, a magneto-resistance effect head according to a fourth embodiment of the present invention and the method for fabricating the head are described below. FIGS. 29-34 are fragmentary sectional views illustrating the steps of the method for fabricating the magneto-resistance effect head according to this embodiment in the order in which they appear.

First, by the steps shown in FIGS. 4-6 in the first embodiment, a layered body as shown in FIG. 6 is formed.

Figure 29:
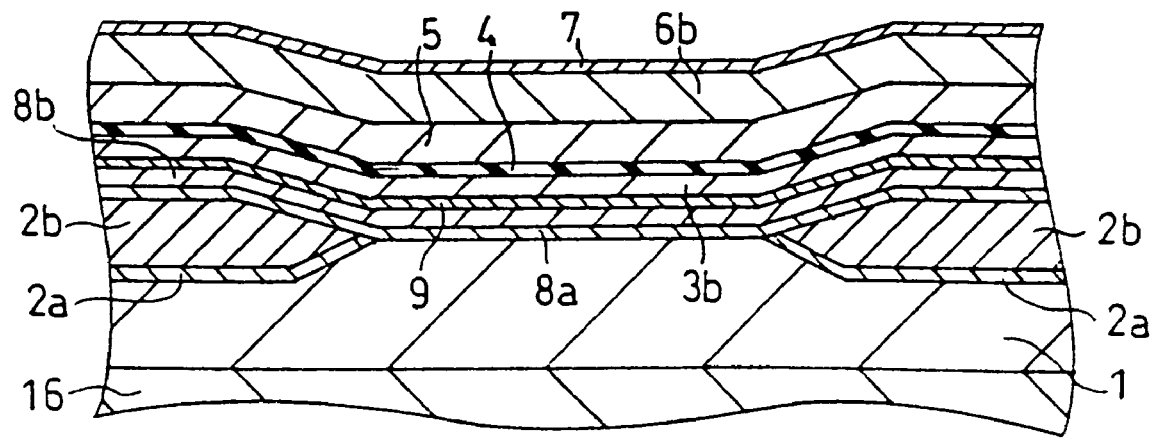
FIGS. 29-31 are fragmentary sectional views illustrating a method for fabricating a magneto-resistance effect head according to a fourth embodiment of the present invention.

Then, as shown in FIG. 29, on top of the lower conductive layer 1 and the vertical bias layer 2b, the following layers are formed and layered. That is, an underlying layer for magnetic layer 8a, a magnetic layer 8b, a second non-magnetic layer 9, the free layer 3b, the first non-magnetic layer 4, the fixed layer 5, the fixing layer 6b, and the upper layer 7 are formed and layered in that order.

Figure 30:
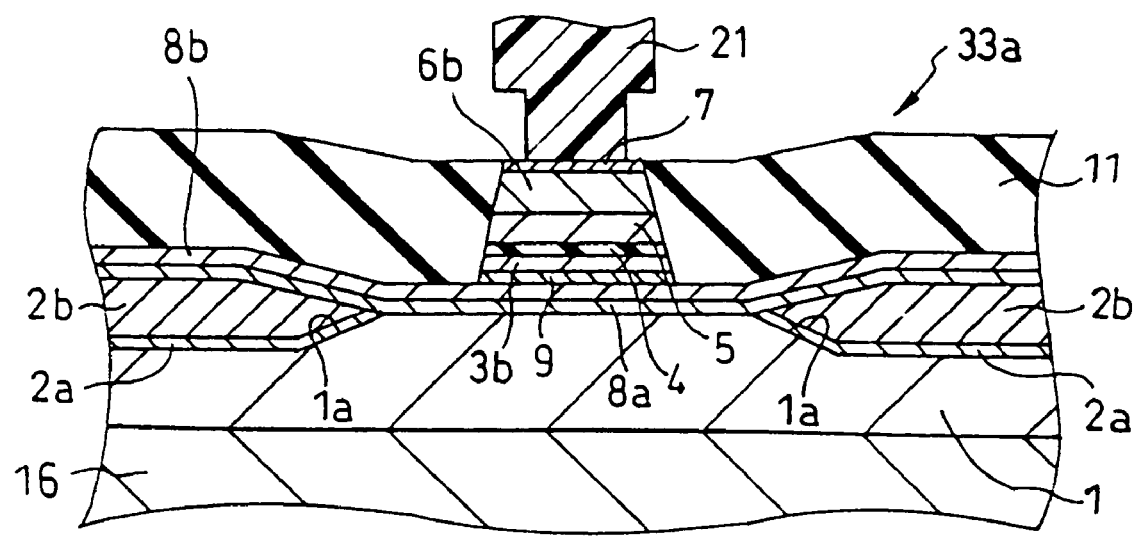

Then, as shown in FIG. 30, the photoresist 21 is formed so as to partially cover the region having no vertical bias layer 2b arranged immediately below the upper surface of the upper layer 7. Then, the second non-magnetic layer 9, the free layer 3b, the first non-magnetic layer 4, the fixed layer 5, the fixing layer 6b, and the upper layer 7 are etched by dry etching or the like. Then, the insulation layer 11 is formed to bury the etched portion therein, thus forming a magneto-resistance effect element 33a on top of the lower shield layer 16.

Figure 31:
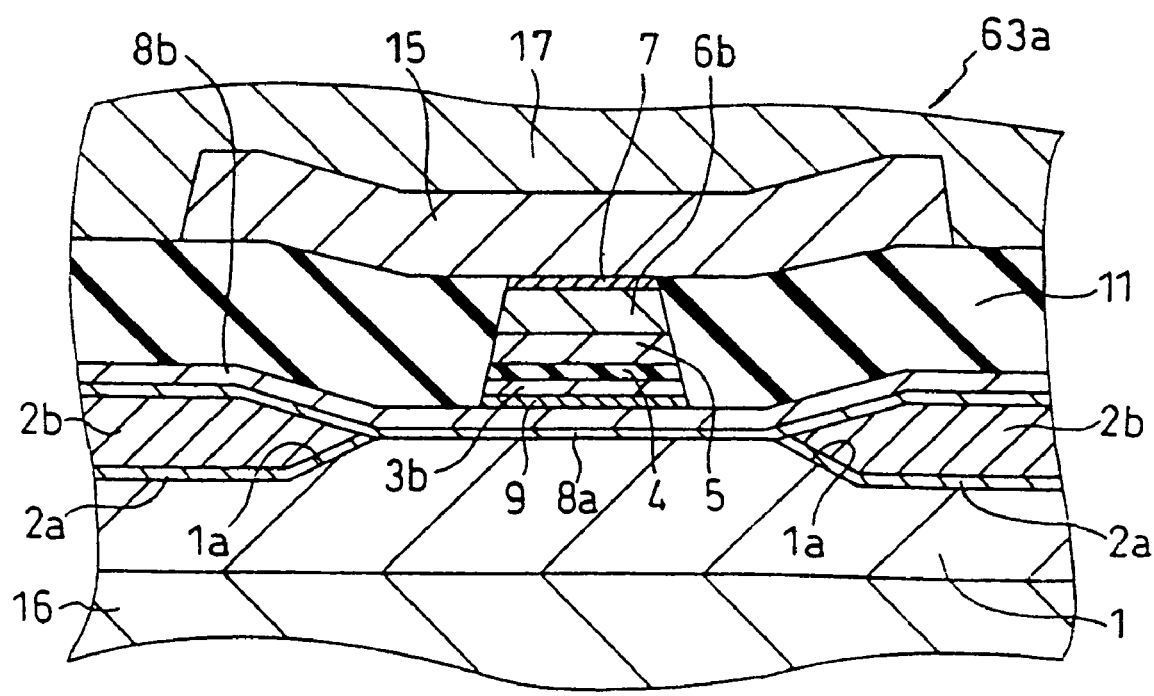

Then, as shown in FIG. 31, the photoresist 21 is removed and the upper conductive layer 15 is deposited on the upper layer 7 and the insulation layer 11. Then, a photoresist (not shown) is formed to pattern the upper conductive layer 15 by dry etching or the like and thereafter the photoresist is removed, on which the upper shield layer 17 is formed, thereby forming a magneto-resistance effect head 63a.

Now, the structure of the magneto-resistance effect head 63a according to this embodiment is described below. As shown in FIG. 31, the magneto-resistance effect head 63a is characterized in that the magnetic layer 8b is provided below the free layer 3b via the non-magnetic layer 9.

As shown in FIG. 31, the lower shield layer 16 and the lower conductive layer 1 are provided on the substrate (not shown), the lower conductive layer 1 has the recessed portion 1a, and the underlying layer for vertical bias layer 2a and the vertical bias layer 2b are provided on the recessed portion 1a. On top of the portion having no underlying layer for vertical bias layer 2a and no vertical bias layer 2b on the lower conductive layer 1 and on top of the vertical bias layer 2b, provided are the underlying layer for magnetic layer 8a and the magnetic layer 8b. On top of the magnetic layer 8b, layered in the following order are the second non-magnetic layer 9 that is not patterned immediately above the vertical bias layer 2b, the free layer 3b, the first non-magnetic layer 4, the fixed layer 5, the fixing layer 6b, and the upper layer 7.

In addition, the second non-magnetic layer 9, the free layer 3b, the first non-magnetic layer 4, the fixed layer 5, the fixing layer 6b, and the upper layer 7 are buried in the insulation layer 11, the upper surface of upper layer 7 is exposed to the upper surface of the insulation layer 11. Furthermore, the upper conductive layer 15 is patterned on the upper layer 7 and the insulation layer 11, and the upper shield layer 17 is provided on the upper conductive layer 15.

In the aforementioned structure, the magnetic layer 8b is to transmit a vertical bias magnetic field applied by the vertical bias layer 2b to the free layer 3b by means of magnetic coupling such as ferromagnetic coupling, antiferromagnetic coupling, or magneto-static coupling. In addition, the second non-magnetic layer 9 allows the component material and the film thickness thereof to control the magnetic coupling between the magnetic layer 8b and the free layer 3b. The underlying layer for magnetic layer 8a is to improve film quality such as the crystallization properties of the magnetic layer 8b and provide good magnetic properties for the magnetic layer 8b. Incidentally, the non-magnetic layer 4 is an insulation layer for conducting a tunneling current therethrough, whereas the second non-magnetic layer 9 is an electrically conductive layer for controlling the magnetic coupling between the magnetic layer 8b and the free layer 3b.

As materials forming the magnetic layer 8b, employed are alloys such as NiFe, Co, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, and CoZrMoNi, a single-layer film of an amorphous magnetic material, a mixture film, or a multi-layered film. In particular, NiFe, Co, CoFe, NiFeCo, or FeCo is favorable. On the other hand, as an additive element, it is possible to use one or more types of elements selected from the group consisting of Ta, Hf, Zr, W, Cr, Ti, Mo, Pt, Ni, Ir, Cu, Ag, Co, Zn, Ru, Rh, Re, Au, Os, Pd, Nb, and V.

Materials forming the second non-magnetic layer 9 include a single material of one type, a mixture of materials of two or more types, a compound of two or more types, or a multi-layered film formed of materials of two or more types, which are selected from the group consisting of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V. In particular, Ru and Cr are favorable. Materials forming the underlying layer for magnetic layer 8a include a single material of one type, a mixture of materials of two or more types, a compound of two or more types, or a multi-layered film formed of materials of two or more types, which are selected from the group consisting of Ta, Hf, Zr, W, Cr, Ti, Mo, Pt, Ni, Ir, Cu, Ag, Co, Zn, Ru, Rh, Re, Au, Os, Pd, Nb, and V. In particular, Ta and Zr are more favorable.

The component material and the function of other layers of the magneto-resistance effect head 63a according to this embodiment are the same as those of each of the layers of the magneto-resistance effect head 61a according to the aforementioned first embodiment.

Now, described below is the operation of the magneto-resistance effect head 63a. Application of an external magnetic field to the magneto-resistance effect head 63a will cause a magnetic field to be applied to the magnetic layer 8b via the vertical bias layer 2b. Then, a vertical bias magnetic field is applied by the magnetic layer 8b via the second non-magnetic layer 9 to the free layer 3b by means of magnetic coupling such as ferromagnetic coupling, antiferromagnetic coupling, or magneto-static coupling. And, the orientation of magnetization of the free layer 3b changes in accordance with the direction and the magnitude of this magnetic field. Since the orientation of magnetization of the fixed layer 5 is pinned by the fixing layer 6b, a change occurs in orientation of magnetization between the fixed layer 5 and the free layer 3b, causing a change in electrical resistance of the non-magnetic layer 4. In this state, the lower conductive layer 1 and the upper conductive layer 15 allow a sense current to flow in the direction perpendicular to the non-magnetic layer 4 to measure the electrical resistance of the non-magnetic layer 4, thereby making it possible to detect the external magnetic field.

Now, an effect of this embodiment is described below. In the magneto-resistance effect head 63a according to this embodiment, a vertical bias magnetic field is applied to the free layer 3b from the vertical bias layer 2b through two steps of process, thereby assuring the application of the vertical bias magnetic field and facilitating the control of the amount of application of the magnetic field. In addition, as shown in FIG. 31, the free layer 3b and the fixed layer 5 are not arranged near the vertical bias layer 2b but only the magnetic layer 8b is disposed near the vertical bias layer 2b. This allows the vertical bias layer 2b to apply a magnetic field to the magnetic layer 8b positively and effectively, also making it possible to prevent the leakage of sense current from the free layer 3b or the fixed layer 5 to the vertical bias layer 2b.

Figure 32:
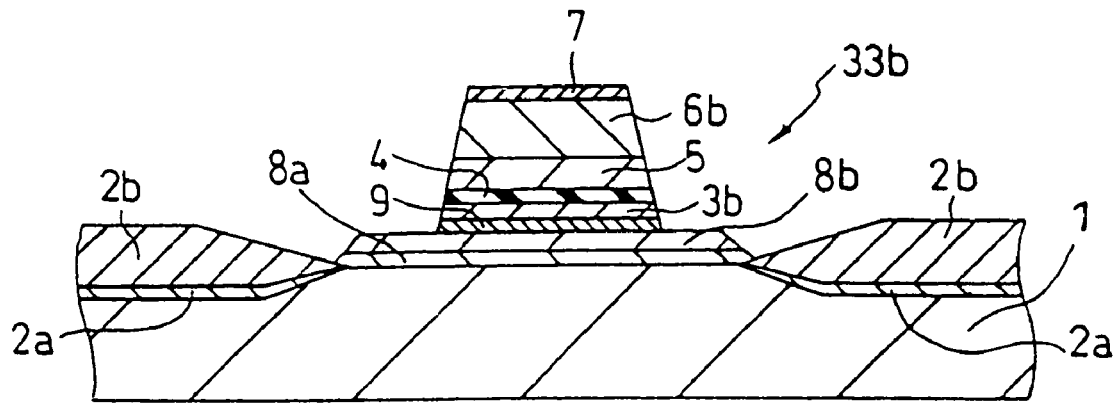
FIG. 32 is a fragmentary sectional view illustrating the structure of a magneto-resistance effect head according to a variation of this embodiment.
Figure 33:
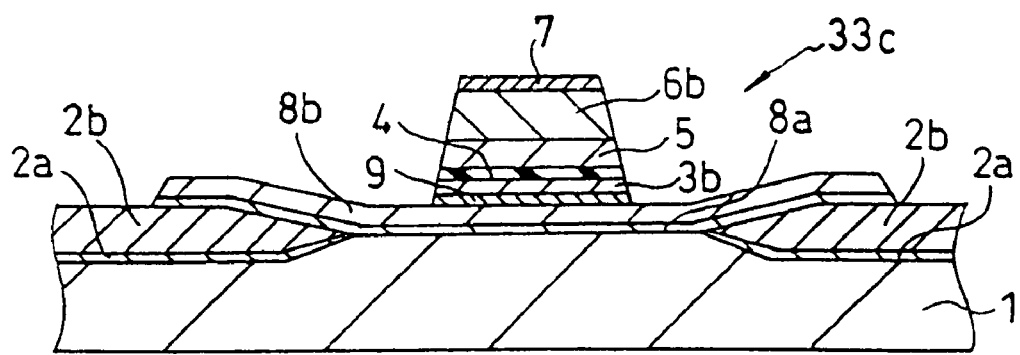
FIG. 33 is a fragmentary sectional view illustrating the structure of a magneto-resistance effect head according to another variation of this embodiment.

FIG. 32 and FIG. 33 are fragmentary sectional views illustrating a variation of the magneto-resistance effect element according to this embodiment. FIG. 32 illustrates a magneto-resistance effect element 33b in which the magnetic layer 8b is patterned so that the end portion of the magnetic layer 8b is in contact with that of the vertical bias layer 2b.

In addition, FIG. 33 illustrates a magneto-resistance effect element 33c in which the magnetic layer 8b is patterned so that the end portion of the magnetic layer 8b overlaps the vertical bias layer 2b. The magneto-resistance effect elements 33b, 33c, shown in FIGS. 32 and 33, can constitute the magneto-resistance effect head.

Incidentally, in this embodiment, it has been explained in which the second non-magnetic layer 9, the free layer 3b, and the non-magnetic layer 4 are patterned in conjunction with the fixed layer 5, the fixing layer 6b, and the upper layer 7. However, the second non-magnetic layer 9, the free layer 3b, and the non-magnetic layer 4 may be extended as the magnetic layer 8b or may be patterned to be larger than the pattern of the fixed layer 5, the fixing layer 6b, and the upper layer 7 and smaller than the pattern of the magnetic layer 8b. Furthermore, the pattern of the second non-magnetic layer 9 may be extended further than that of the free layer 3b or the pattern of the free layer 3b may be extended further than that of the non-magnetic layer 4.

In addition, the underlying layer for vertical bias layer 2a, the underlying layer for magnetic layer 8a, the second non-magnetic layer 9, and the upper layer 7 may be omitted, and a protective layer for protecting the vertical bias layer may be provided on top of the vertical bias layer 2b.

Furthermore, this embodiment has shown that the lower shield layer 16 and the lower conductive layer 1 provided separately. However, like the aforementioned embodiments 1 to 3, the lower shield layer 16 and lower conductive layer 1 may be a common layer. In this case, the lower conductive layer 1 is omitted. In addition, the upper shield 17 and the upper conductive layer 15 may be a common layer. In this case, the upper conductive layer 15 is omitted. This allows the gap between the top and bottom shield layers to be made smaller. Furthermore, an upper gap insulation layer may be provided between the upper conductive layer 15 and the shield layer 17 or a lower gap insulation layer may be provided between the lower shield layer 16 and the lower conductive layer 1.

Now, a fifth embodiment according to the present invention is described below. FIGS. 34-37 are fragmentary sectional views illustrating the steps of a method for fabricating a magneto-resistance effect head according to this embodiment in the order in which they appear.

First, a layered body as shown in FIG. 16 is formed through the steps according to the aforementioned second embodiment shown in FIGS. 13-19.

Figure 34:
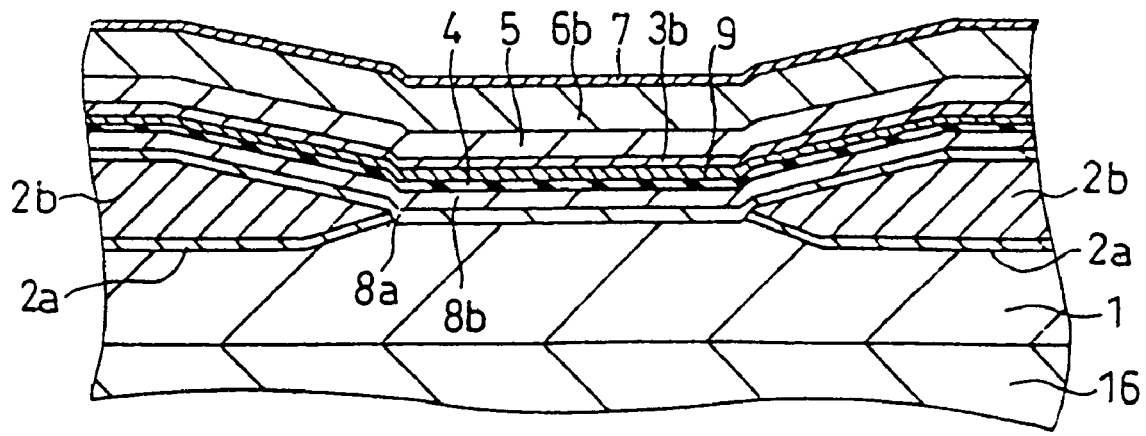
FIGS. 34-37 are fragmentary sectional views illustrating a method for fabricating a magneto-resistance effect head according to a fifth embodiment of the present invention.

Then, as shown in FIG. 34, the photoresist 21 is removed. Then, on top of the exposed portion of the lower conductive layer 1 and the vertical bias layer 2b, formed and layered are the following layers. That is, the underlying layer for magnetic layer 8a, the magnetic layer 8b, the second non-magnetic layer 9, the free layer 3b, the non-magnetic layer 4, the fixed layer 5, the fixing layer 6b, and the upper layer 7 are formed and layered in that order.

Figure 35:
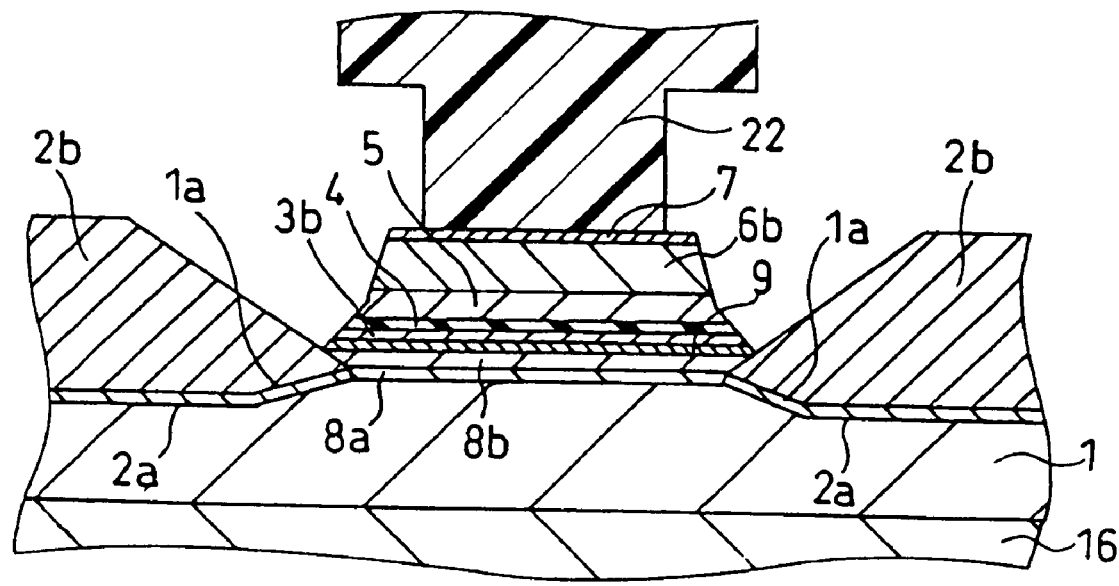

Then, as shown in FIG. 35, the photoresist 22 is provided to cover the region having no vertical bias layer 2b arranged immediately below the upper surface of the upper layer 7. With the photoresist 22 being employed as a mask, patterned by dry etching or like means are the underlying layer for magnetic layer 8a, the magnetic layer 8b, the second non-magnetic layer 9, the free layer 3b, the non-magnetic layer 4, the fixed layer 5, the fixing layer 6b, and the upper layer 7.

Figure 36:
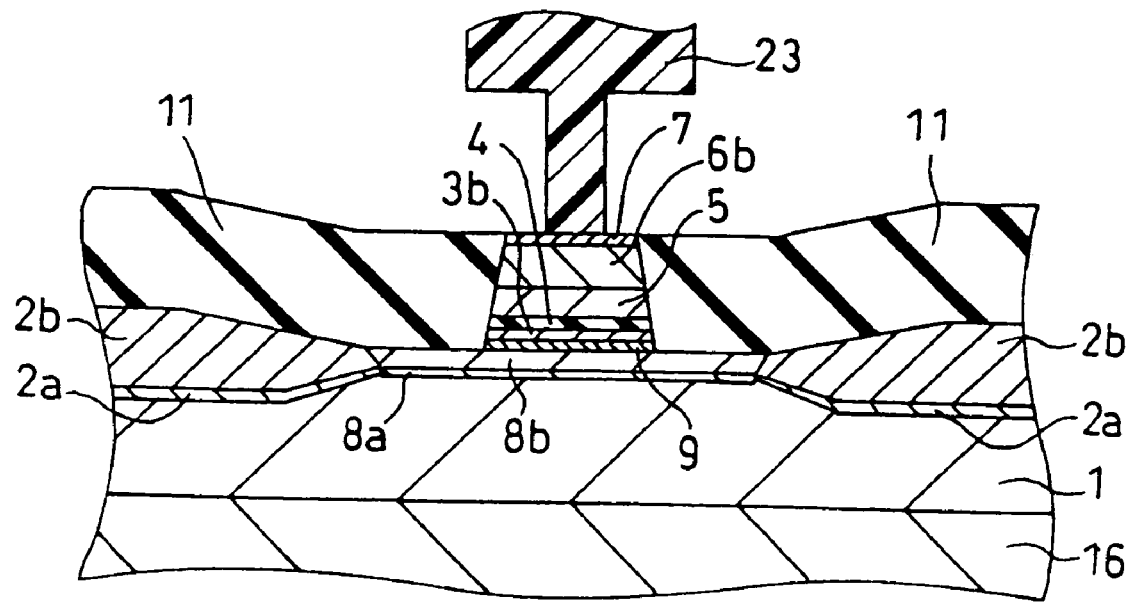

Then, as shown in FIG. 36, the photoresist 22 is removed to form the photoresist 23 on the upper layer 7 to cover the central portion of the upper layer 7. With the photoresist 23 being employed as a mask, patterned by dry etching or like means are the second non-magnetic layer 9, the free layer 3b, the non-magnetic layer 4, the fixed layer 5, the fixing layer 6b, and the upper layer 7. Then, the periphery of the pattern of the second non-magnetic layer 9, the free layer 3b, the non-magnetic layer 4, the fixed layer 5, the fixing layer 6b, and the upper layer 7 is buried in the insulation layer 11, thereby forming a magneto-resistance effect element 34a on top of the lower shield layer 16.

Figure 37:
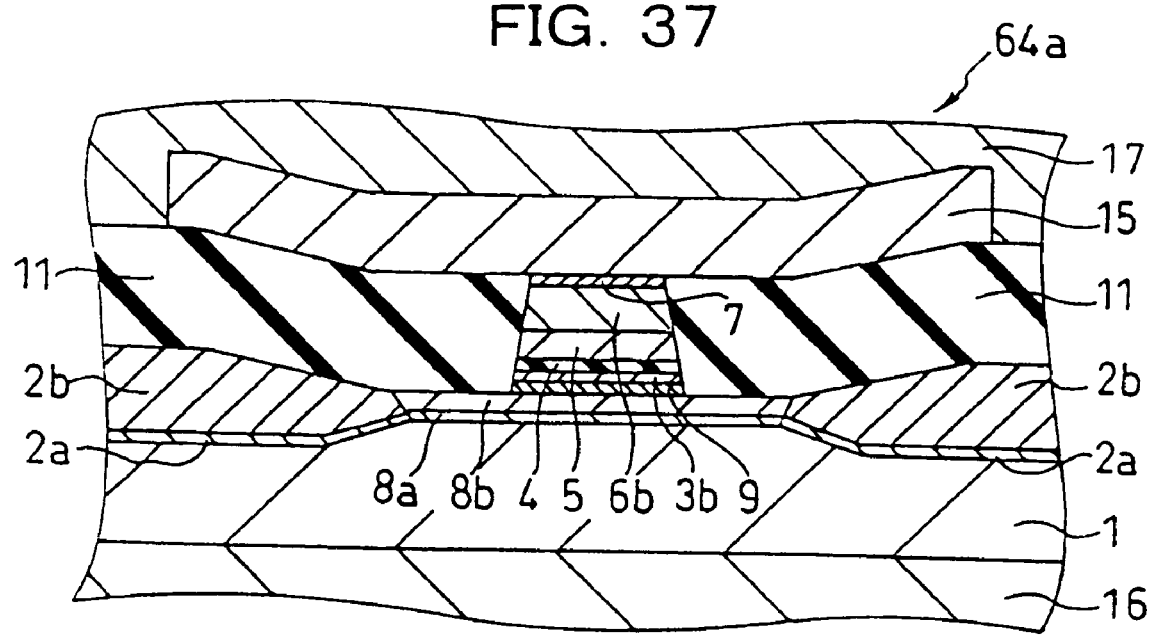

Then, as shown in FIG. 37, after the photoresist 23 has been removed, the upper conductive layer 15 is deposited on the upper layer 7 and the insulation layer 11 to form a photoresist (not shown). Then, the upper conductive layer 15 is patterned by dry etching or like means and thereafter this photoresist is removed, on which the upper shield layer 17 is formed, thereby forming a magneto-resistance effect head 64a.

Now, the structure of the magneto-resistance effect head 64a according to this embodiment is described below. As shown in FIG. 37, the magneto-resistance effect head 64a according to this embodiment has a different shape of the underlying layer for magnetic layer 8a and the magnetic layer 8b in comparison with the magneto-resistance effect head 63a according to the fourth embodiment shown in FIG. 31. In this embodiment, the underlying layer for magnetic layer 8a and the magnetic layer 8b are patterned to allow their end portions to be flush with the end portions of the underlying layer for vertical bias layer 2a and the vertical bias layer 2b and in contact with each other. In the magneto-resistance effect head 64a according to this embodiment, the structural operation and effect thereof are the same as those of the magneto-resistance effect head 63a according to the aforementioned fourth embodiment except the shape of the underlying layer for magnetic layer 8a and the magnetic layer 8b.

Incidentally, in this embodiment, it has been explained in which the non-magnetic layer 4 is patterned in conjunction with the fixed layer 5, the fixing layer 6b, and the upper layer 7. However, like the aforementioned fourth embodiment, the non-magnetic layer 4 may be extended as the magnetic layer 8b or may be patterned to be larger than the pattern of the fixed layer 5, the fixing layer 6b, and the upper layer 7 and smaller than the pattern of the free layer 3b.

Furthermore, the pattern of the second non-magnetic layer 9 may be extended further than that of the magnetic layer 8b or the pattern of the magnetic layer 8b may be extended further than that of the non-magnetic layer 4.

In addition, in this embodiment, it has been explained in which the upper conductive layer 15 is patterned, however, the upper conductive layer 15 may not be patterned but extended.

Now, a sixth embodiment according to the present invention is described below. FIGS. 38-42 are fragmentary sectional views illustrating the steps of a method for fabricating a magneto-resistance effect head according to this embodiment in the order in which they appear.

First, a layered body as shown in FIG. 5 is formed through the steps according to the aforementioned first embodiment shown in FIGS. 4 and 5.

Figure 38:
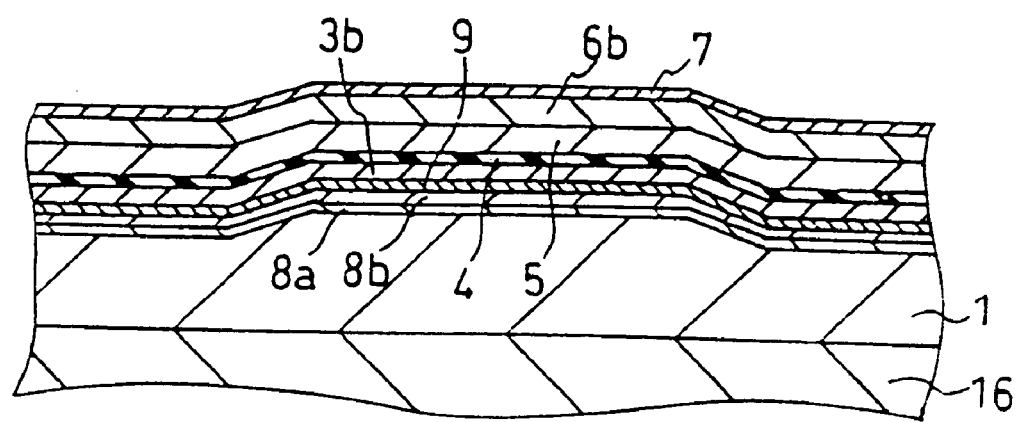
FIGS. 38-42 are fragmentary sectional views illustrating a method for fabricating a magneto-resistance effect head according to a sixth embodiment of the present invention.

Then, as shown in FIG. 38, the photoresist 20 is removed. Then, on the lower conductive layer 1, formed and layered in the following order are the underlying layer for magnetic layer 8a, the magnetic layer 8b, the second non-magnetic layer 9, the free layer 3b, the non-magnetic layer 4, the fixed layer 5, the fixing layer 6b, and the upper layer 7.

Figure 39:
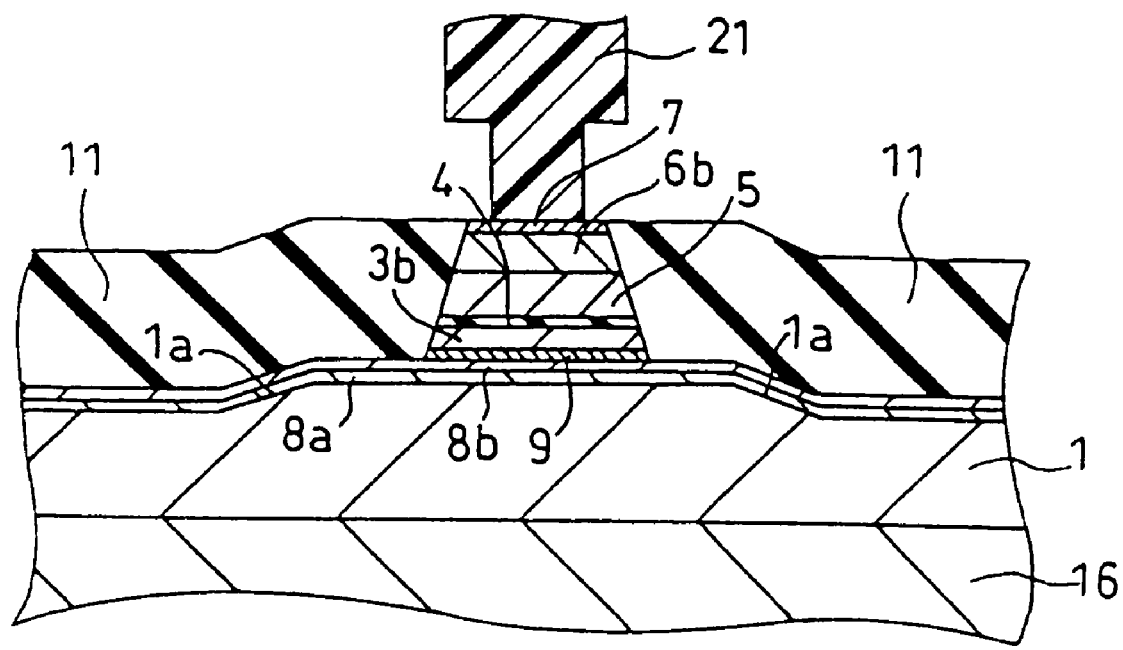

Then, as shown in FIG. 39, the photoresist 21 is provided to cover the region having no recessed portion 1a of the lower conductive layer 1 arranged immediately below the upper surface of the upper layer 7. With the photoresist 21 being employed as a mask, the second non-magnetic layer 9, the free layer 3b, the non-magnetic layer 4, the fixed layer 5, the fixing layer 6b, and the upper layer 7 are patterned. This allows the insulation layer 11 to bury therein the periphery of the second non-magnetic layer 9, the free layer 3b, the non-magnetic layer 4, the fixed layer 5, the fixing layer 6b, and the upper layer.

Figure 40:
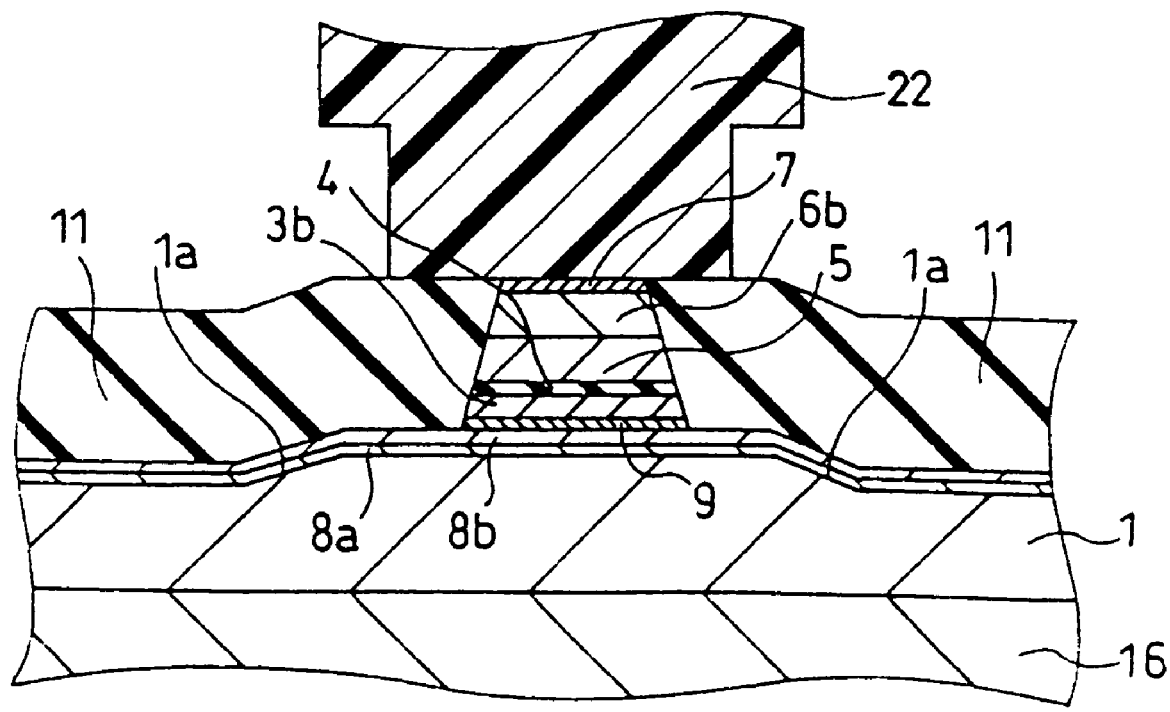

Then, as shown in FIG. 40, the photoresist 21 is removed to form the photoresist 22 to cover the region having no recessed portion 1a immediately below the upper surface of the upper layer 7 and the insulation layer. And, the region covered with the photoresist 21 is included in the region to be covered by the photoresist 22.

Figure 41:
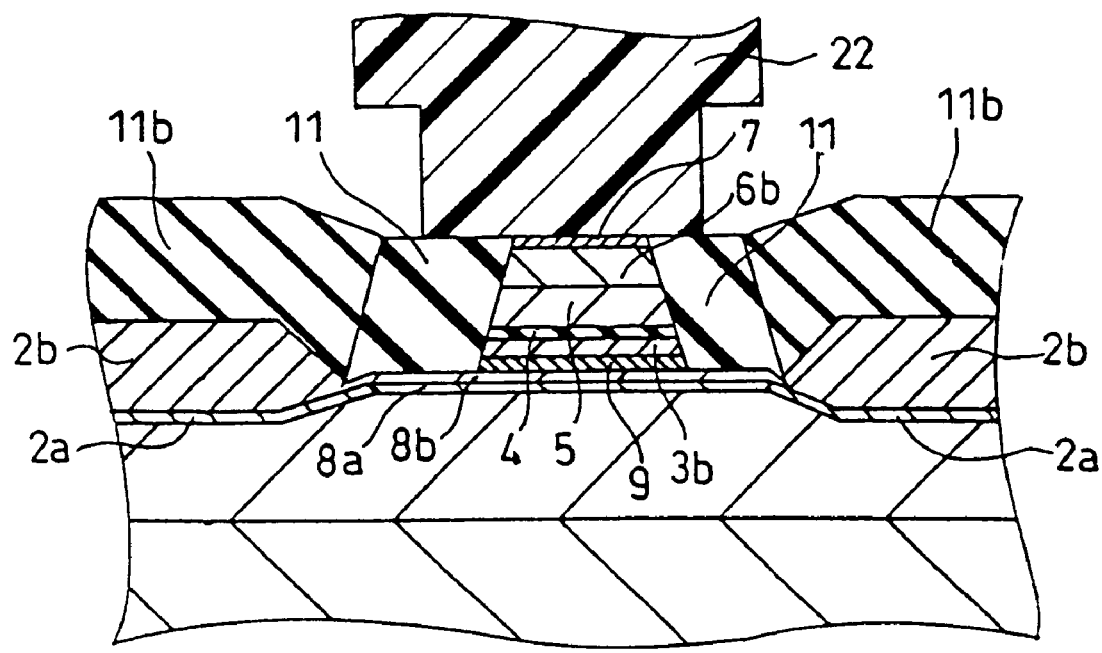
Figure 42:
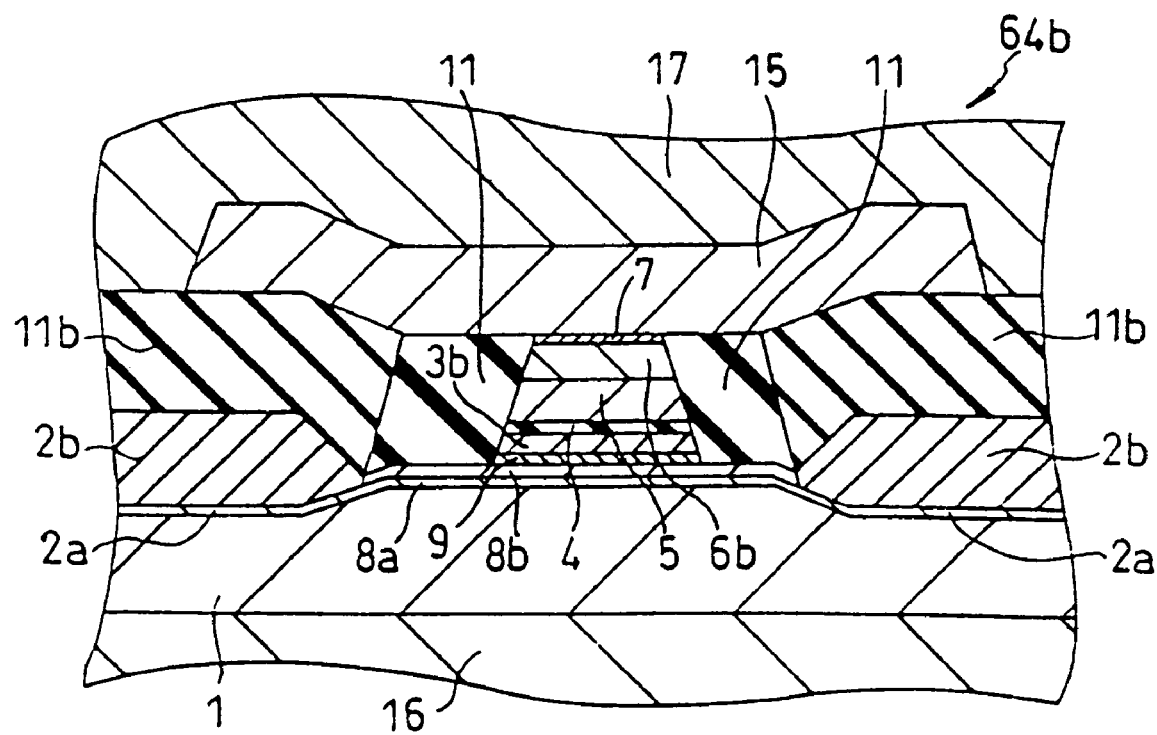

Then, as shown in FIG. 41, with the photoresist 22 being employed as a mask, the insulation layer 11, the underlying layer for magnetic layer 8a, and the magnetic layer 8b are patterned by etching. Subsequently, the Underlying layer vertical bias 2a and the vertical bias layer 2b are formed successively, a second insulation layer 11b is formed on the vertical bias layer 2b, and a magneto-resistance effect element 34b is formed on the lower conductive layer 16.

Then, as shown in FIG. 41, the photoresist 22 is removed. Thereafter, on the upper layer 7, the insulation layer 11, and the second insulation layer 11b, the upper conductive layer 15 is deposited to form a photoresist (not shown). After the upper conductive layer 15 has been patterned by dry etching or like means, the photoresist is removed and the upper shield layer 17 is formed thereupon to form the magneto-resistance effect head 64b.

The magneto-resistance effect head 64b formed according to this embodiment has the same structure and operation as those of the magneto-resistance effect head 64a according to the fifth embodiment except that the insulation layers 11 and 11b are formed through two steps.

Now, described below is a seventh embodiment according to the present invention. FIGS. 43-49 are fragmentary sectional views illustrating the steps of a method for fabricating a magneto-resistance effect head according to this embodiment in the order in which they appear.

Figure 43:
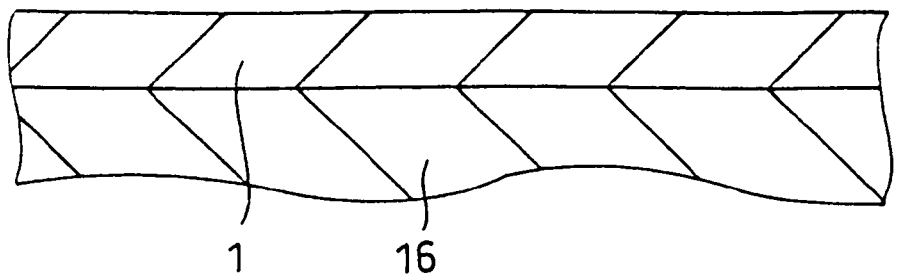
FIGS. 43-49 are fragmentary sectional views illustrating a method for fabricating a magneto-resistance effect head according to a seventh embodiment of the present invention.

First, as shown in FIG. 43, the lower shield layer 16 and the lower conductive layer 1 are successively formed on top of a substrate (not shown).

Figure 44:
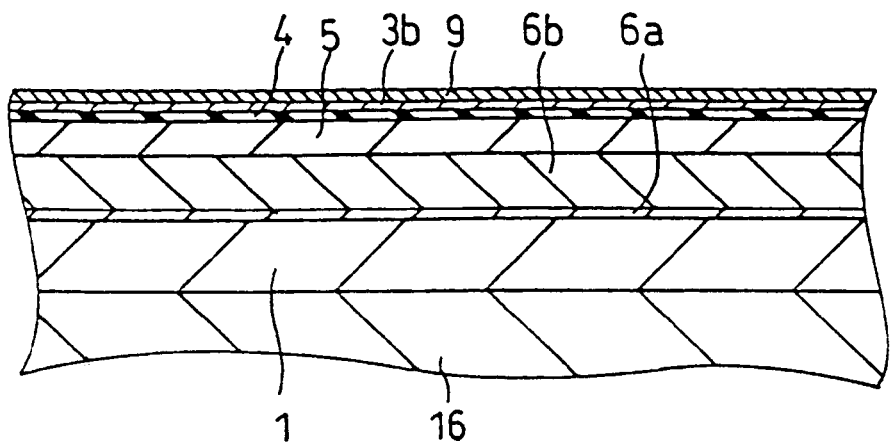

Then, as shown in FIG. 44, formed and layered in the following order are the underlying layer for fixing layer 6a, the fixing layer 6b, the fixed layer 5, the first non-magnetic layer 4, the free layer 3b, and the second non-magnetic layer 9.

Figure 45:
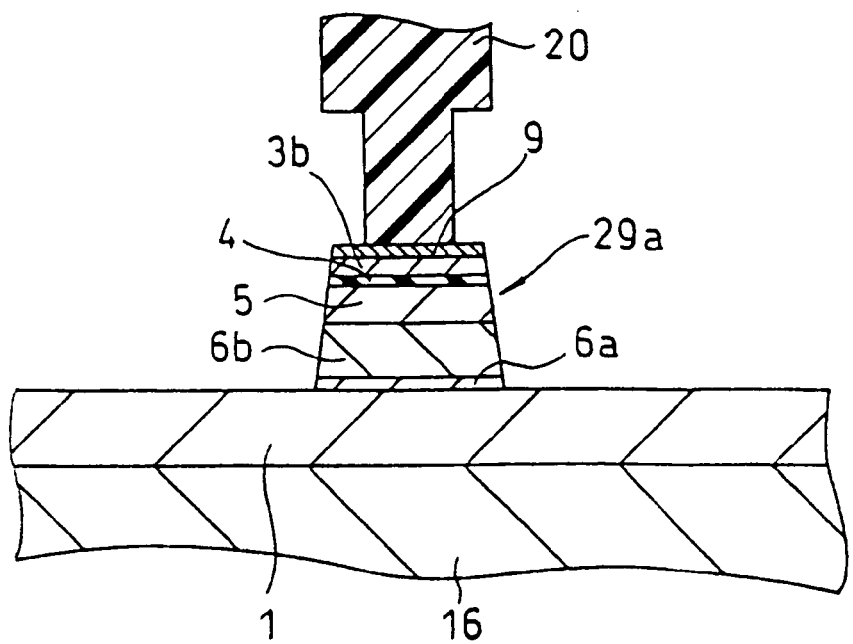

Then, as shown in FIG. 45, the photoresist 20 is patterned on the second non-magnetic layer 9. Then, the underlying layer for fixing layer 6a, the fixing layer 6b, the fixed layer 5, the first non-magnetic layer 4, the free layer 3b, and the second non-magnetic layer 9 are patterned by dry etching or like means. A pattern 29a is thereby formed which comprises the underlying layer for fixing layer 6a, the fixing layer 6b, the fixed layer 5, the first non-magnetic layer 4, the free layer 3b, and the second non-magnetic layer 9, which have been patterned.

Figure 46:
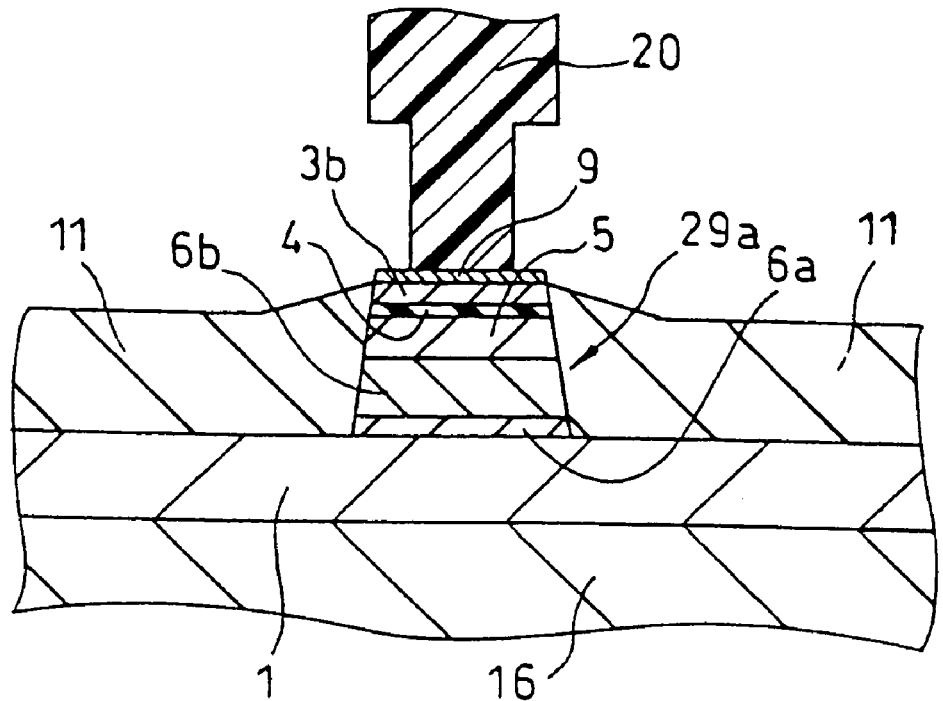

Then, as shown in FIG. 46, the insulation layer 11 is formed to bury the pattern 29a therein. The insulation layer 11 is made equal in height to the pattern 29a near the pattern 29a but is slightly lower than the pattern 29a at a given distance from the pattern 29a, between which a smooth slope connects.

Figure 47:
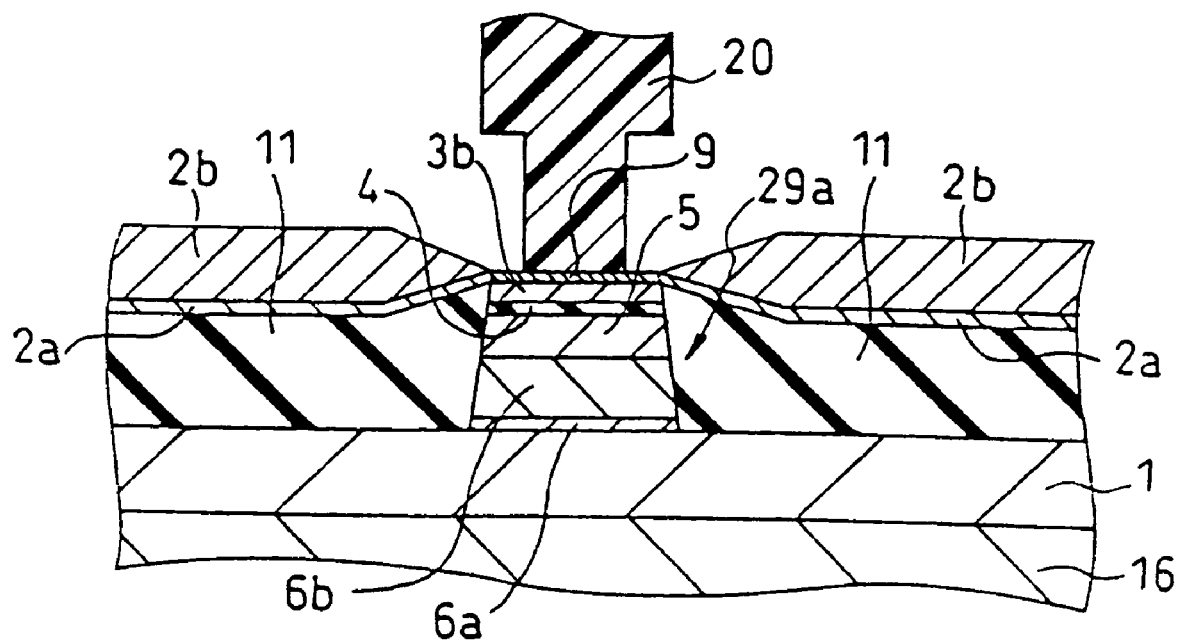

Then, as shown in FIG. 47, on the insulation layer 11, formed are the underlying layer for vertical bias layer 2a and the vertical bias layer 2b. And, the vertical bias layer 2b is varied in thickness along the slope of the insulation layer 11, allowing the vertical bias layer 2b to be thick in thickness at a given distance from the pattern 29a and reduced in thickness with increasing proximity to the pattern 29a.

Figure 48:
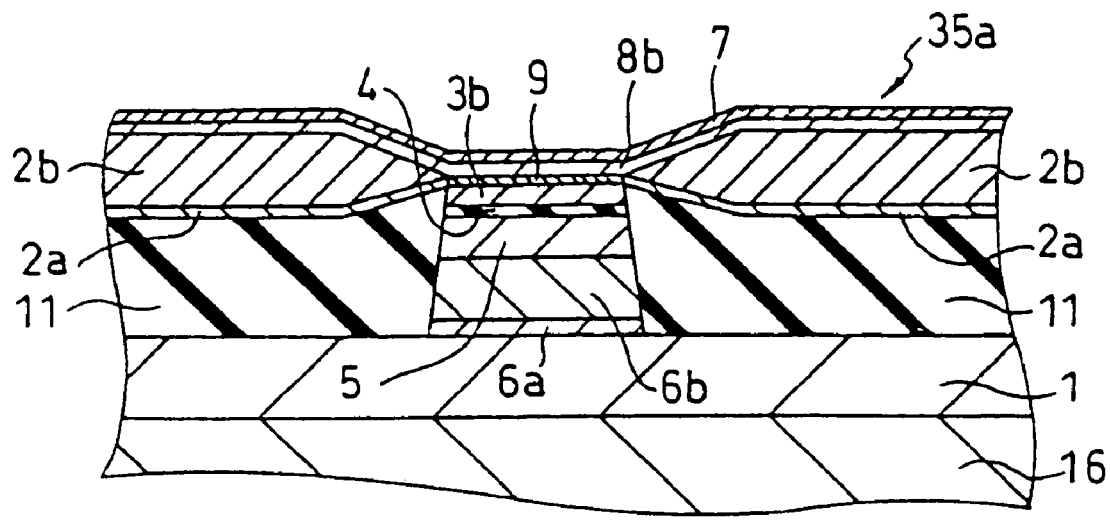

Then, as shown in FIG. 48, the photoresist 20 is removed to form the magnetic layer 8b and the upper layer 7 on the vertical bias layer 2b, thereby forming a magneto-resistance effect element 35a.

Figure 49:
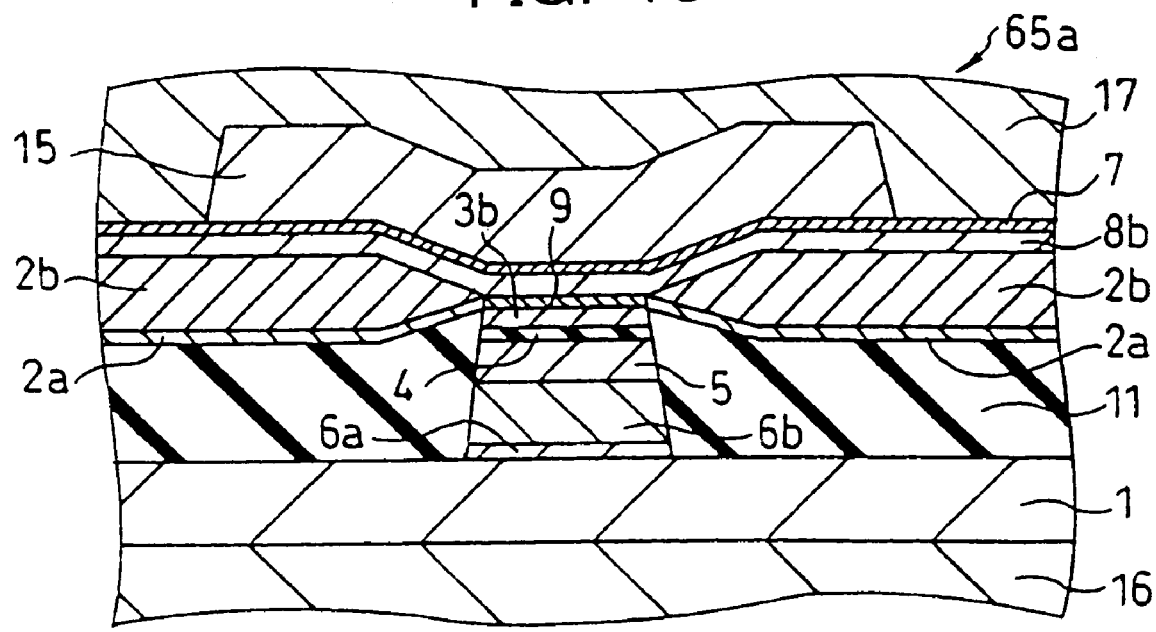

Then, as shown in FIG. 49, the upper conductive layer 15 is deposited on the upper layer 7 and the photoresist (not shown) is formed. After the upper conductive layer 15 has been patterned by dry etching or like means, the photoresist is removed to form the upper shield layer 17 thereupon, thus forming a magneto-resistance effect head 65a.

Now, the structure of the magneto-resistance effect head 65a according to this embodiment is described below. As shown in FIG. 49, the lower shield layer 16 is provided and the lower conductive layer 1 is provided on the lower shield layer 16. On top of the lower conductive layer 1, formed is the pattern 29a made up of the underlying layer for fixing layer 6a, the fixing layer 6b, the fixed layer 5, the first non-magnetic layer 4, the free layer 3b, and the second non-magnetic layer 9, which have been patterned. The insulation layer 11 is arranged on the periphery of the pattern 29a, and the pattern 29a is buried in the insulation layer 11.

The upper surface of the insulation layer 11 is flush with that of the pattern 29a near the pattern 29a but is slightly lower than the upper surface of the pattern 29a at a given distance from the pattern 29a, between which a smooth slope connects. The vertical bias layer 2b is provided on the insulation layer 11 along the topography of the upper surface of the insulation layer 11 in a maimer such that at least part of the vertical bias layer 2b in the direction of its thickness is buried in the insulation layer 11. And, the vertical bias layer 2b is thick in thickness at a given distance from the pattern 29a and reduced in thickness with increasing proximity to the pattern 29a. On the vertical bias layer 2b and the pattern 29a, provided are the magnetic layer 8b and the upper layer 7.

On the upper layer 7, provided is the upper conductive layer 15, on top of which provided is the upper shield layer 17.

Now, the operation of the magneto-resistance effect head 65a according to this embodiment is described below. Application of an external magnetic field to the magneto-resistance effect head 65a will cause the magnetic field to be applied to the magnetic layer 8b via the vertical bias layer 2b. Subsequently, a vertical bias magnetic field is applied from the magnetic layer 8b to the free layer 3b via the second non-magnetic layer 9 by means of a magnetic coupling such as ferromagnetic coupling, anti-ferromagnetic coupling, or magneto-static coupling. And, the orientation of magnetization of the free layer 3b changes in accordance with the direction and magnitude of this magnetic field. Since the orientation of magnetization of the fixed layer is pinned by the fixing layer 6b, a change occurs in orientation of magnetization between the fixed layer 5 and the free layer 3b, causing a change in electrical resistance of the non-magnetic layer 4. In this state, the lower conductive layer 1 and the upper conductive layer 15 allow a sense current to flow in the direction perpendicular to the non-magnetic layer 4 to measure the electrical resistance of the non-magnetic layer 4, thereby making it possible to detect the external magnetic field.

Now, an effect of this embodiment is described below. In the magneto-resistance effect head 65a according to this embodiment, a vertical bias magnetic field is applied to the free layer 3b from the vertical bias layer 2b through two steps of process, thereby assuring the application of the vertical bias magnetic field and facilitating the control of the amount of application of the magnetic field.

Incidentally, in this embodiment, it has been explained in which the underlying layer for fixing layer 6a, the fixing layer 6b, the fixed layer 5, the first non-magnetic layer 4, the free layer 3b, and the second non-magnetic layer 9 are patterned in the same way. However, it is necessary to pattern at least the free layer 3b but not necessary to pattern the underlying layer for fixing layer 6a, the fixing layer 6b, the fixed layer 5, and the first non-magnetic layer 4. In addition, the pattern of the underlying layer for fixing layer 6a may be extended further than that of the fixing layer 6b. The pattern of the fixing layer 6b may be extended further than that of the fixed layer 5. The pattern of the fixed layer 5 may be extended further than that of the non-magnetic layer 4. The pattern of the non-magnetic layer 4 may be extended further than that of the free layer 3b. Furthermore, this embodiment has shown that the upper surface of the insulation layer 11 is lower than that of the pattern of the free layer 3b. However, the upper surface of the insulation layer 11 may be equal in height to the upper surface of the pattern of the free layer 3b and higher than the upper surface of the pattern of the free layer 3b.

Figure 50:
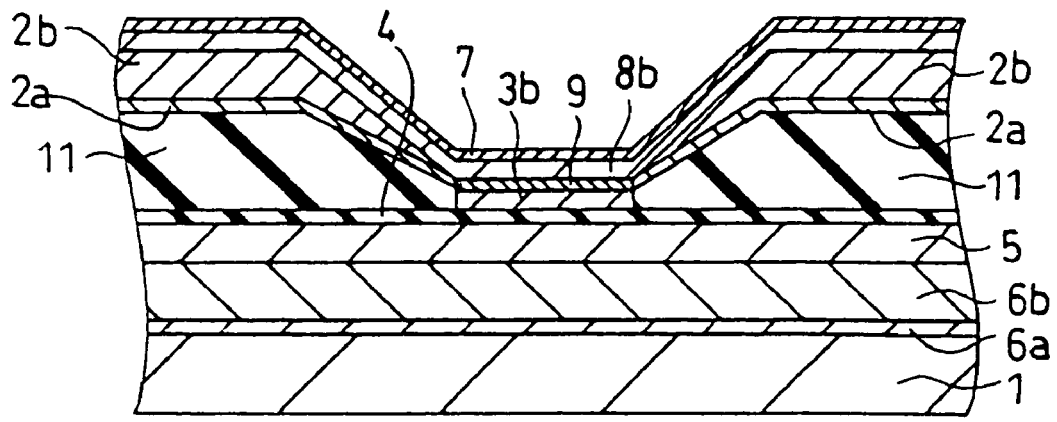
FIG. 50 is a fragmentary sectional view illustrating the structure of a magneto-resistance effect head according to a variation of this embodiment.

FIGS. 50-54 are fragmentary sectional views illustrating the structure of a magneto-resistance effect element according to a variation of this embodiment. A magneto-resistance effect element 35b shown in FIG. 50 is different from the magneto-resistance effect element 35a shown in FIG. 49 in that the underlying layer for fixing layer 6a, the fixing layer 6b, the fixed layer 5, and the first non-magnetic layer 4 are not patterned. On the first non-magnetic layer 4, provided are the free layer 3b and the second non-magnetic layer 9, and these patterns are buried in the insulation layer 11. The magneto-resistance effect element 35b has the same structure as that of the magneto-resistance effect element 35a except the topography of the underlying layer for fixing layer 6a, the fixing layer 6b, the fixed layer 5, and the first non-magnetic layer 4. The operation of the magneto-resistance effect element 35b is also the same as that of the magneto-resistance effect element 35a.

In comparison with the magneto-resistance effect element 35a, the magneto-resistance effect element 35b is advantageous in that the etching process for the underlying layer for fixing layer 6a, the fixing layer 6b, the fixed layer 5, and the first non-magnetic layer 4 can be omitted upon fabrication.

This variation has shown that the free layer 3b and the second non-magnetic layer 9 are patterned by etching of the first non-magnetic layer 4 using the photoresist as a mask. However, it is necessary to pattern at least the free layer 3b, and it can be selected as appropriate which layers to pattern in the layered body made up of the underlying layer for fixing layer 6a, the fixing layer 6b, the fixed layer 5, and the first non-magnetic layer.

Figure 51:
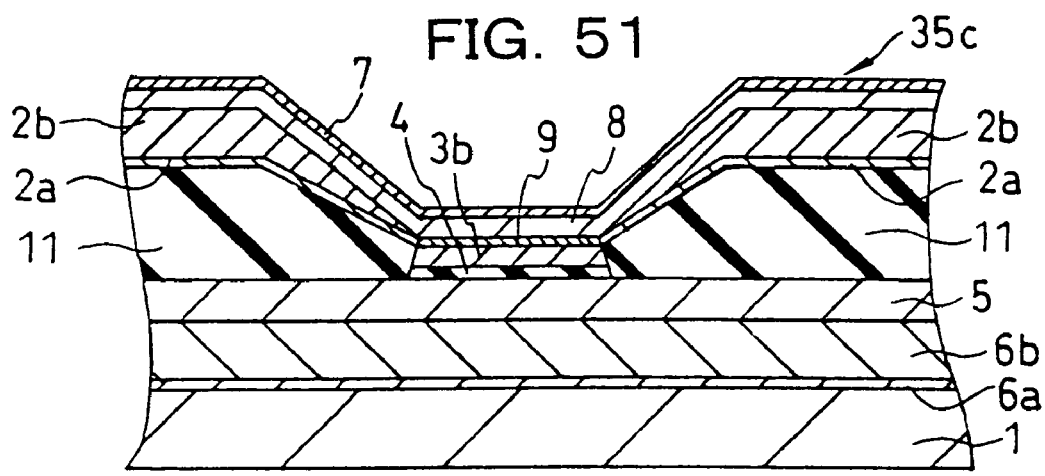
FIG. 51 is a fragmentary sectional view illustrating the structure of a magneto-resistance effect head according to another variation of this embodiment.

On the other hand, in a magneto-resistance effect element 35c shown in FIG. 51, the first non-magnetic layer 4, the free layer 3b, and the second non-magnetic layer 9 are patterned.

Figure 52:
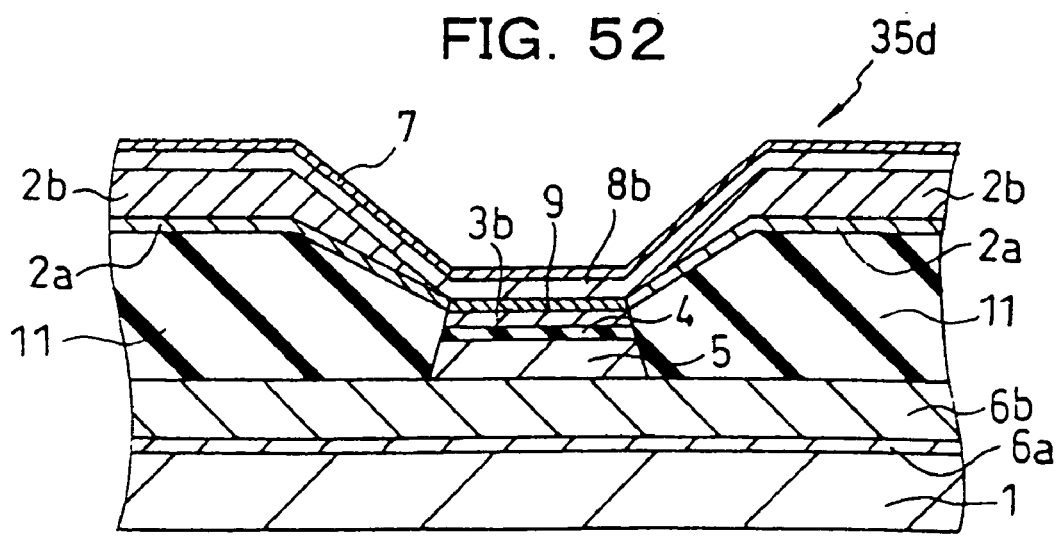
FIG. 52 is a fragmentary sectional view illustrating the structure of a magneto-resistance effect head according to still another variation of this embodiment.

Furthermore, in a magneto-resistance effect element 35d shown in FIG. 52, the fixed layer 5, the first non-magnetic layer 4, the free layer 3b, and the second non-magnetic layer 9 are patterned.

Figure 53:
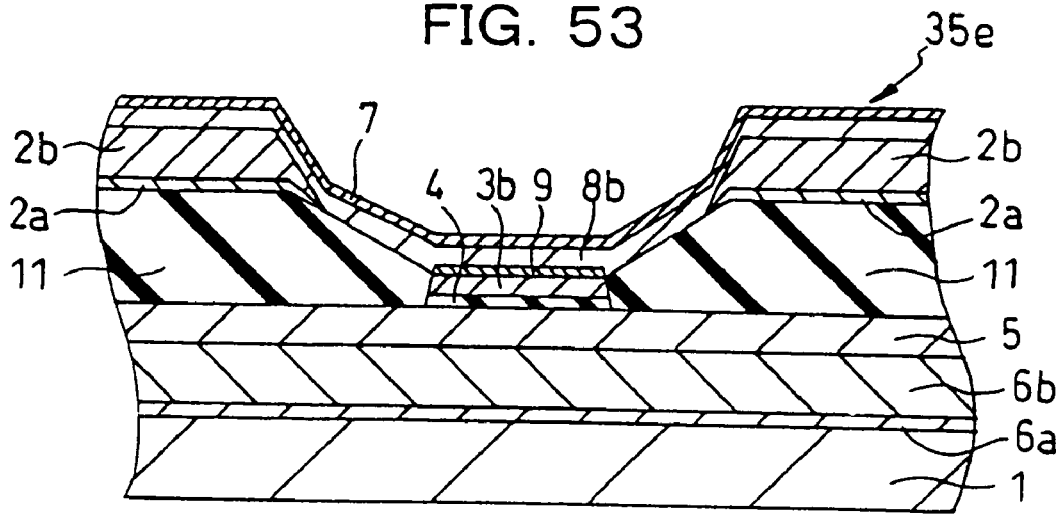
FIG. 53 is a fragmentary sectional view illustrating the structure of a magneto-resistance effect head according to still another variation of this embodiment.

Still furthermore, in a magneto-resistance effect element 35e shown in FIG. 53, the pattern of the vertical bias layer 2b is provided apart from a pattern 29b made up of the first non-magnetic layer 4, the free layer 3b, and the second non-magnetic layer 9. This makes it possible to prevent more positively the leakage of sense current to the vertical bias layer 2b. The structure and operation of the magneto-resistance effect element 35e is the same as those of the magneto-resistance effect element 35c shown in FIG. 51 except those mentioned in the foregoing.

This variation has shown that the free layer 3b and the second non-magnetic layer 9 are patterned. However, it is necessary to pattern at least the free layer 3b, but it can be selected as appropriate which layers to pattern in the layered body made up of the underlying layer for fixing layer 6a, the fixing layer 6b, the fixed layer 5, and the first non-magnetic layer.

In addition, this variation has shown that the upper surface of the insulation layer 11 is higher than that of the pattern of the free layer 3b. However, the upper surface of the insulation layer 11 may be generally equal in height to the upper surface of the pattern of the free layer 3b or lower than the upper surface of the pattern of the free layer 3b.

Furthermore, this variation has shown that the magnetic layer 8b is not patterned. However, at least part of the magnetic layer 8b is located near the vertical bias layer 2b just to allow a vertical bias magnetic field to be applied to the vertical bias layer 2b from the vertical bias layer 2b.

Figure 54:
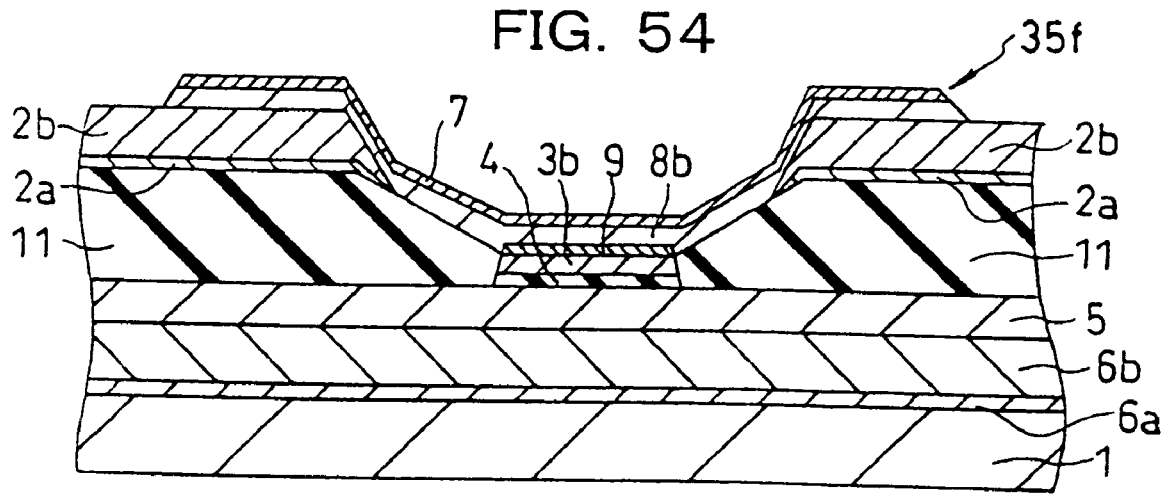
FIG. 54 is a fragmentary sectional view illustrating the structure of a magneto-resistance effect head according to still another variation of this embodiment.

In a magneto-resistance effect element 35f shown in FIG. 54, the end portion of the pattern of the magnetic layer 8b sits on part of the vertical bias layer 2b.

Figure 55:
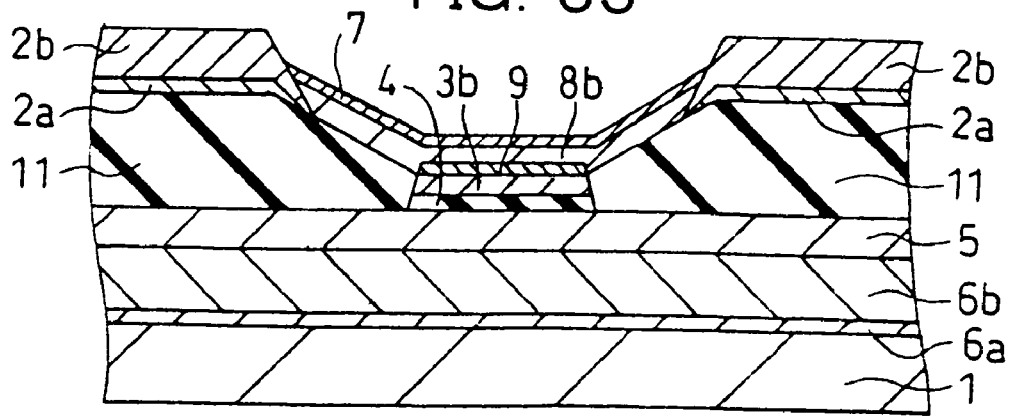
FIG. 55 is a fragmentary sectional view illustrating the structure of a magneto-resistance effect head according to still another variation of this embodiment.

In a magneto-resistance effect element 35g shown in FIG. 55, the end portion of the pattern of the magnetic layer 8b is in contact with that of the vertical bias layer 2b.

Figure 56:
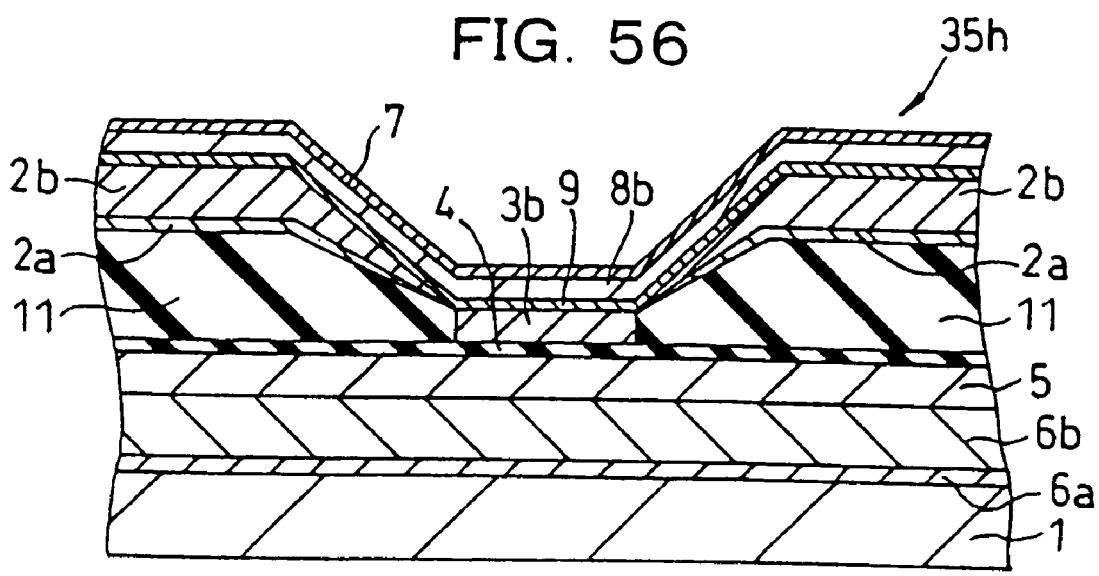
FIG. 56 is a fragmentary sectional view illustrating the structure of a magneto-resistance effect head according to still another variation of this embodiment.

This variation has shown that the free layer 3b and the second non-magnetic layer 9 are patterned in the same way. However, like a magneto-resistance effect element 35h shown in FIG. 56, the second non-magnetic layer 9 may be extended over the vertical bias layer 2b.

Figure 57:
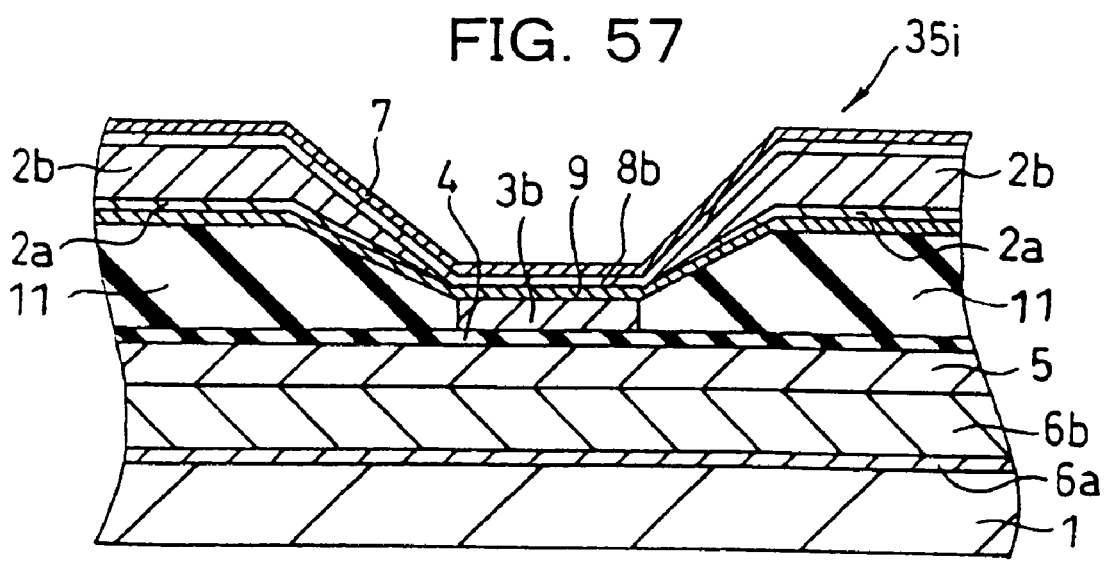
FIG. 57 is a fragmentary sectional view illustrating the structure of a magneto-resistance effect head according to still another variation of this embodiment.

In addition, like a magneto-resistance effect element 35i shown in FIG. 57, the second non-magnetic layer 9 may be extended over the insulation layer 11.

The magneto-resistance effect elements 35b, 35c, 35d, 35e, 35f, 35g, 35h, and 35i, shown in FIGS. 50-57, can also be employed for the magneto-resistance effect head in the same way as the magneto-resistance effect element 35a.

Incidentally, in this embodiment, the lower shield layer 16 and the lower conductive layer 1 may be the same layer, and the upper shield layer 17 and the upper conductive layer 15 may be the same layer. In addition, an upper gap layer may be provided between the upper conductive layer 15 and the shield layer 17, and a lower gap layer may be provided between the lower shield layer 16 and the lower conductive layer 1.

In addition, the underlying layer for vertical bias layer 2a, the underlying layer for fixing layer 6a, the second non-magnetic layer 9, and the upper layer 7 may be omitted, and a protective layer for protecting the vertical bias layers may be provided on the vertical bias layer 2b.

Now, an eighth embodiment according to the present invention is described below. FIGS. 58-64 are fragmentary sectional views illustrating the steps of a method for fabricating a magneto-resistance effect head according to this embodiment in the order in which they appear.

Figure 58:
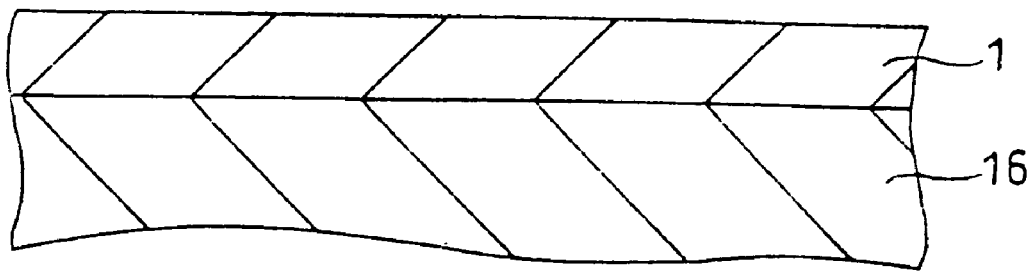
FIGS. 58-64 are fragmentary sectional views illustrating a method for fabricating a magneto-resistance effect head according to an eighth embodiment of the present invention.

First, as shown in FIG. 58, the lower shield layer 16 and the lower conductive layer 1 are successively formed on a substrate (not shown).

Figure 59:
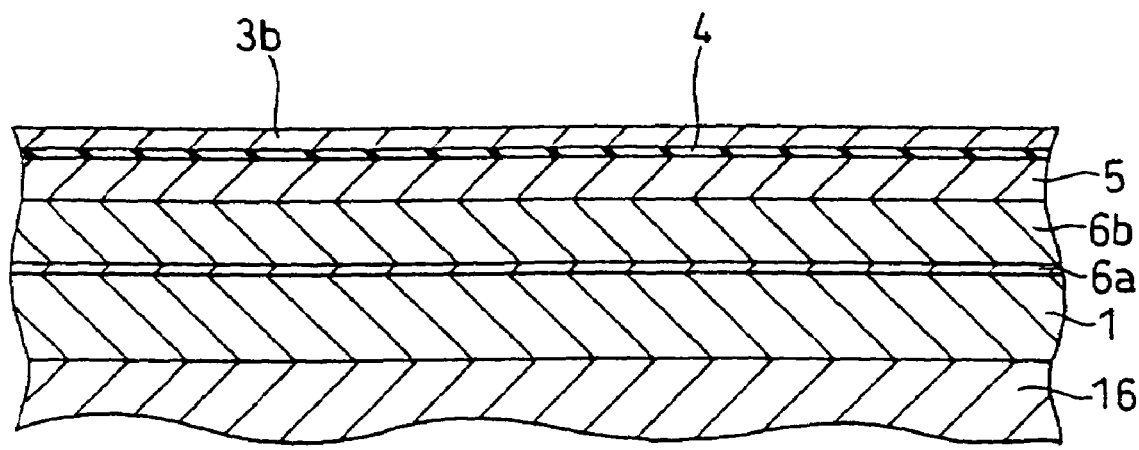

Then, as shown in FIG. 59, formed and layered in the following order are the underlying layer for fixing layer 6a, the fixing layer 6b, the fixed layer 5, the first non-magnetic layer 4, the free layer 3b, and the second non-magnetic layer.

Figure 60:
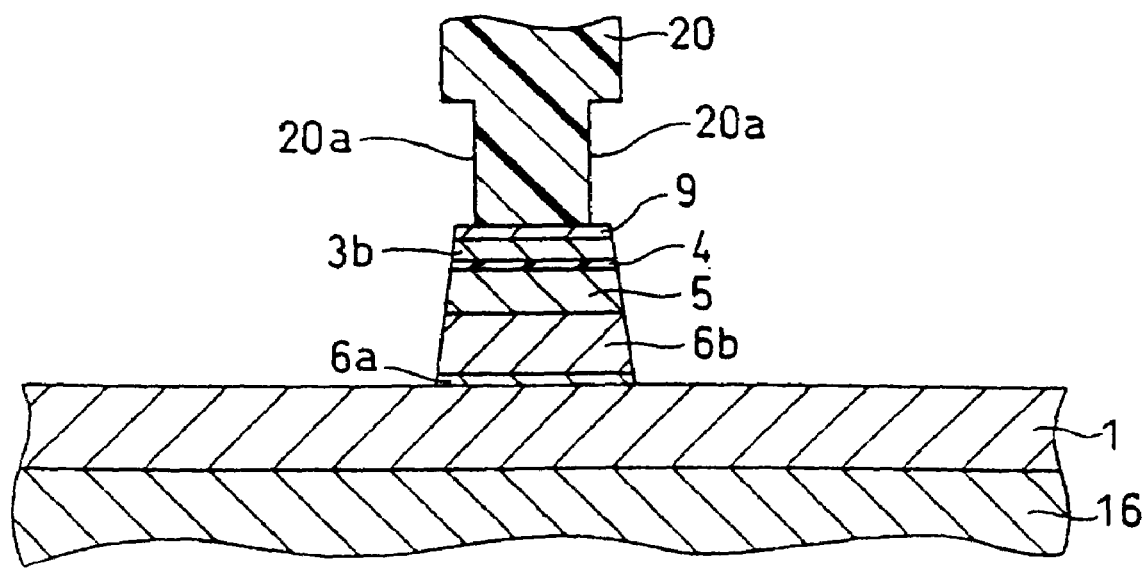

Then, as shown in FIG. 60, the photoresist 20 having the opening portion 20a is formed on top of the second non-magnetic layer 9. Then, patterned are the underlying layer for fixing layer 6a, the fixing layer 6b, the fixed layer 5, the first non-magnetic layer 4, the free layer 3b, and the second non-magnetic layer 9 by dry etching or like means. Thus, a pattern 29c is formed which is made up of the patterned the underlying layer for fixing layer 6a, the fixing layer 6b, the fixed layer 5, the first non-magnetic layer 4, the free layer 3b, and the second non-magnetic layer 9, which have been patterned.

Figure 61:
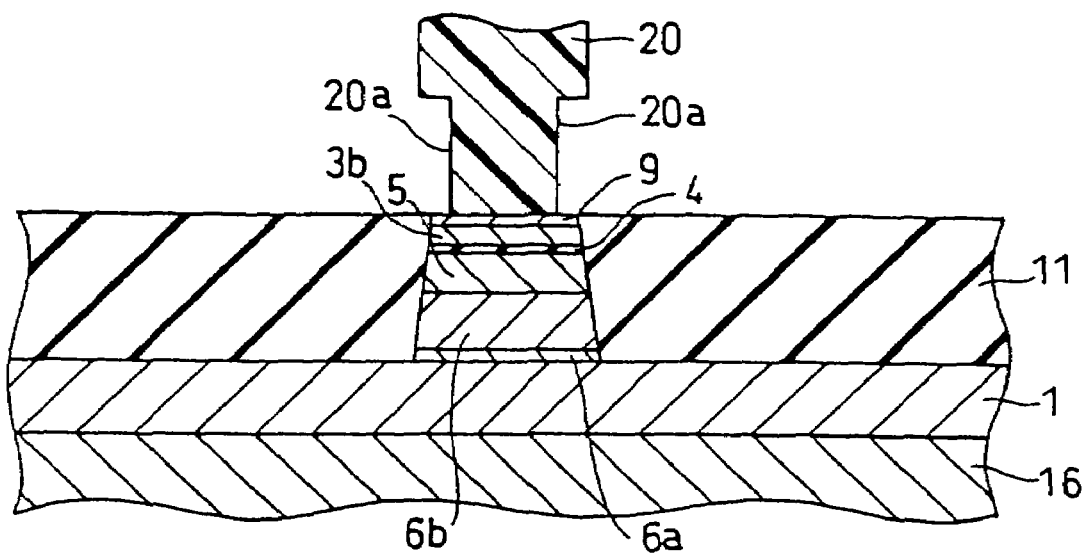

Then, as shown in FIG. 61, the insulation layer 11 is formed to bury the pattern 29c.

Figure 62:
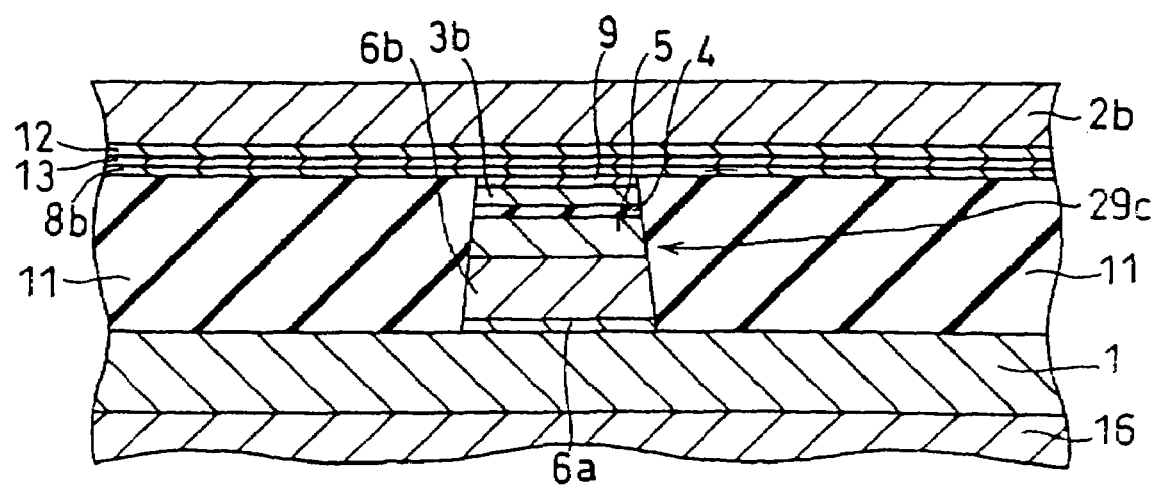

Then, as shown in FIG. 62, on the pattern 29c and the insulation layer 11, formed are the first magnetic layer 8b, the third non-magnetic layer 13, the second magnetic layer 12, and the vertical bias layer 2b.

Figure 63:
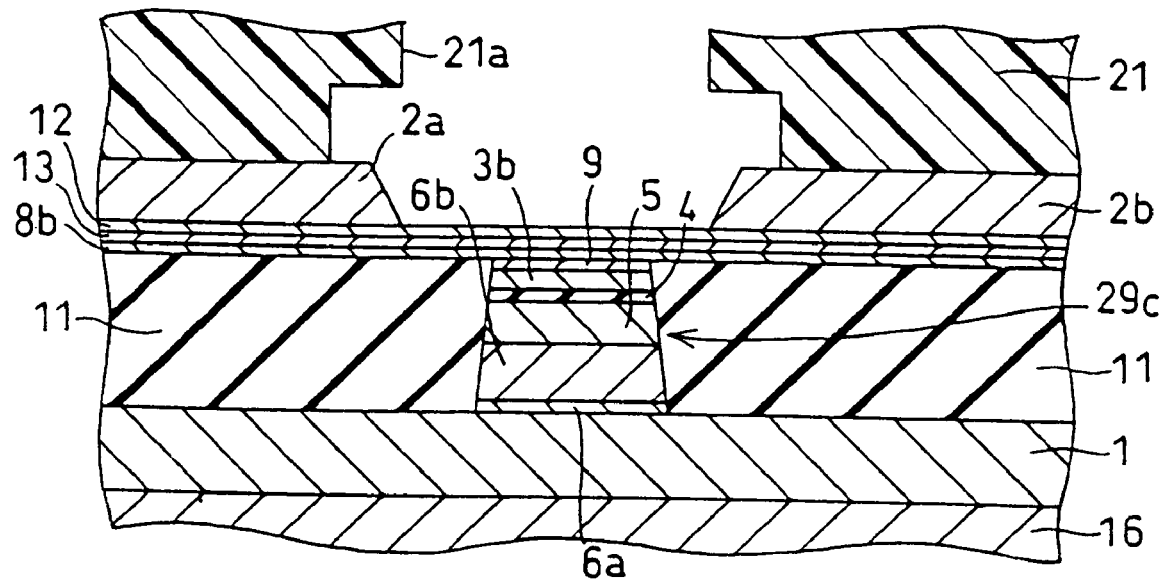

Then, as shown in FIG. 63, the photoresist 21 having the opening portion 21a is formed immediately above the patterned non-magnetic layer 9. Then, with the photoresist 21 being employed as a mask, the vertical bias layer 2b is patterned, thereby forming a magneto-resistance effect element 36a.

Figure 64:
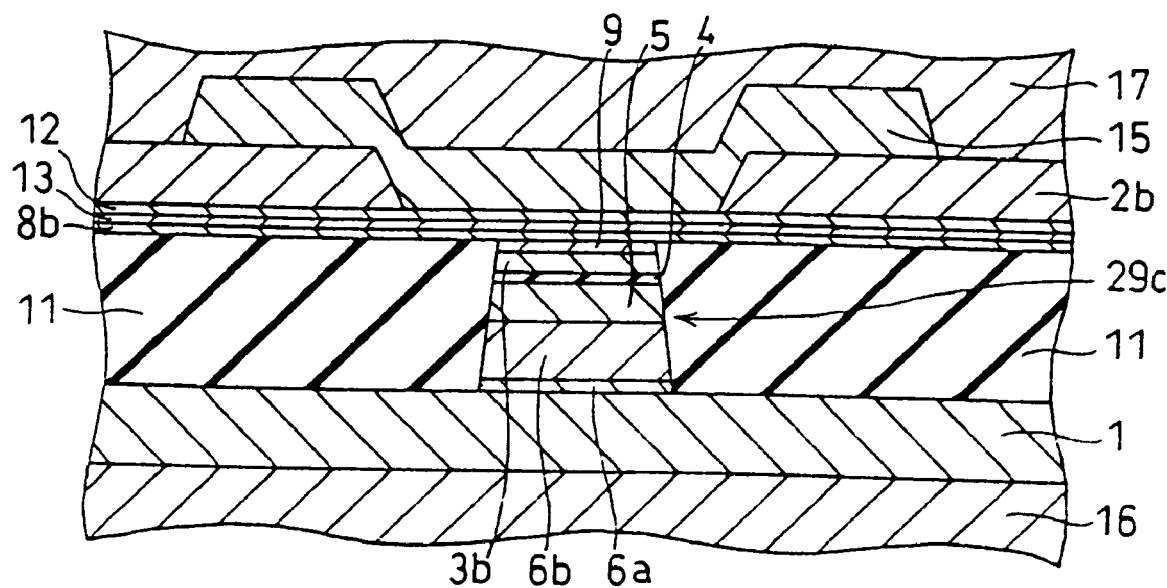

Then, as shown in FIG. 64, the photoresist 21 is removed. Then, the upper conductive layer 15 is deposited on the exposed portion of the second magnetic layer 12 and the pattern of the vertical bias layer 2b, and a photoresist (not shown) is formed to perform patterning by dry etching or like means. Thereafter, the photoresist is removed and the upper shield layer 17 is formed thereupon, thereby forming a magneto-resistance effect head 66a.

Now, the structure of the magneto-resistance effect head 66a according to this embodiment is described below. As shown in FIG. 64, the magneto-resistance effect head 66a is provided with the lower shield layer 16, and the lower conductive layer 1 is provided on top of the lower shield layer 16. Thus, on top of the lower conductive layer 1, formed is the pattern 29c made up of the underlying layer for fixing layer 6a, the fixing layer 6b, the fixed layer 5, the first non-magnetic layer 4, the free layer 3b, and the second non-magnetic layer 9, which have been patterned. The insulation layer 11 is arranged around the pattern 29c, and the pattern 29c is buried in the insulation layer 11.

On the pattern 29c and the insulation layer 11, provided are the first magnetic layer 8b, a third non-magnetic layer 13, and a second magnetic layer 12. On top of the second magnetic layer 12, the vertical bias layer 2b is provided so as not to be disposed immediately above the pattern 29c.

In addition, the third non-magnetic layer 13 allows the component material and the film thickness thereof to control the magnetic coupling between the second magnetic layer 12 and the magnetic layer 8b. Materials forming the third non-magnetic layer 13 include a single material of one type, a mixture of materials of two or more types, a compound of two or more types, or a multi-layered film formed of materials of two or more types, which are selected from the group consisting of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ta, Pt, and Ni. In particular, Ru and Cr are favorable.

On the other hand, materials forming the second magnetic layer 12 include a single material of one type, a mixture of materials of two or more types, or a multi-layered film formed of materials of two or more types, which are selected from the group consisting of alloys or amorphous magnetic materials such as NiFe, Co, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, and CoZrMoNi. In particular, NiFe, Co, CoFe, NiFeCo, and FeCo are favorable. In addition, as an additive element, one or more types of elements can be used which are selected from the group consisting of Ta, Hf, Zr, W, Cr, Ti, Mo, Pt, Ni, Ir, Cu, Ag, Co, Zn, Ru, Rh, Re, Au, Os, Pd, Nb, and V.

Now, the operation of the magneto-resistance effect head 66a according to this embodiment is described below. When an external magnetic field is applied to the magneto-resistance effect head 66a, the magnetic field is applied to the second magnetic layer 12 via the vertical bias layer 2b. Subsequently, a vertical bias magnetic field is applied from the second magnetic layer 12 to the magnetic layer 8b via the third non-magnetic layer 13 by means of magnetic coupling such as ferromagnetic coupling, anti-ferromagnetic coupling, or magneto-static coupling. Furthermore, the vertical bias magnetic field is applied from the magnetic layer 8b to the free layer 3b via the second non-magnetic layer 9 by means of magnetic coupling such as ferromagnetic coupling, anti-ferromagnetic coupling, or magneto-static coupling.

The orientation of magnetization of the free layer 3b changes in accordance with the direction and magnitude of this magnetic field. Since the orientation of magnetization of the fixed layer 5 is pinned by the fixing layer 6b, a change occurs in orientation of magnetization between the fixed layer 5 and the free layer 3b, causing a change in electrical resistance of the non-magnetic layer 4. In this state, the lower conductive layer 1 and the upper conductive layer 15 allow a sense current to flow in the direction perpendicular to the non-magnetic layer 4 to measure the electrical resistance of the non-magnetic layer 4, thereby making it possible to detect the external magnetic field.

Now, an effect of this embodiment is described below. In the magneto-resistance effect head 65a according to this embodiment, a vertical bias magnetic field is applied to the free layer 3b from the vertical bias layer 2b through three steps of process, thereby assuring the application of the vertical bias magnetic field and facilitating the control of the amount of application of the magnetic field.

Another advantage of the magneto-resistance effect head 65a is provided when the layered film made up of the magnetic layer 8b, the third non-magnetic layer 13, and the second magnetic layer 12 produces a strong anti-ferromagnetic coupling between the magnetic layer 8b and the second magnetic layer 12. The advantage is also provided when the magnetization of the magnetic layer 8b (the product of the saturation magnetization and the film thickness) is made substantially equal to that of the second magnetic layer 12. In this case, the foregoing layered film is turned to a merged film having effectively no magnetization, thus providing no sensitivity to the magnetic field of an external magnetic field applied. For this reason, in this case, only the free layer 3b, in the structure of FIG. 64, has sensitivity to an external magnetic field. Thus, the width of the tracks is determined only by the pattern width of the free layer 3b when the magneto-resistance effect head 65a functions as the read head. This is advantageous in making a narrow-track head. Incidentally, even in this case, a vertical bias magnetic field is applied precisely to the free layer 3b through the aforementioned process. In addition, that the magnetization of the magnetic layer 8b is substantially equal to that of the second magnetic layer 12 means that they are equal to each other to the degree that the aforementioned effect is recognized.

Incidentally, in this embodiment, the underlying layer for fixing layer 6a, the second non-magnetic layer 9, the third non-magnetic layer 13, and the upper layer 7 may be omitted. In addition, an underlying layer for vertical bias layer may be provided on the lower portion of the vertical bias layer 2b. In some cases, a protective layer for protecting a vertical bias layer is provided on the vertical bias layer 2b, and an upper layer is provided on the second magnetic layer 12.

Furthermore, in this embodiment, it has been explained in which the underlying layer for fixing layer 6a, the fixing layer 6b, the fixed layer 5, the first non-magnetic layer 4, the free layer 3b, and the second non-magnetic layer 9 are patterned in the same way. However, it is necessary to pattern at least the free layer 3b but not necessary to pattern the layered film made up of the underlying layer for fixing layer 6a, the fixing layer 6b, the fixed layer 5, and the first non-magnetic layer 4. In addition, the pattern of the underlying layer for fixing layer 6a may be extended further than that of the fixing layer 6b. The pattern of the fixing layer 6b may be extended further than that of the fixed layer 5. The pattern of the fixed layer 5 may be extended further than that of the non-magnetic layer 4. The pattern of the non-magnetic layer 4 may be extended further than that of the free layer 3b. In addition, this embodiment has shown such that the upper surface of the insulation layer 11 is equal in height to that of the pattern of the free layer 3b. However, the upper surface of the insulation layer 11 may be lower than that of the pattern of the free layer 3b or higher than the upper surface of the pattern of the free layer 3b. Furthermore, FIG. 64 has shown that the second non-magnetic layer 9 and the free layer 3b are patterned in the same way. However, the pattern of the second non-magnetic layer 9 may be extended further than that of the free layer 3b.

Figure 65:
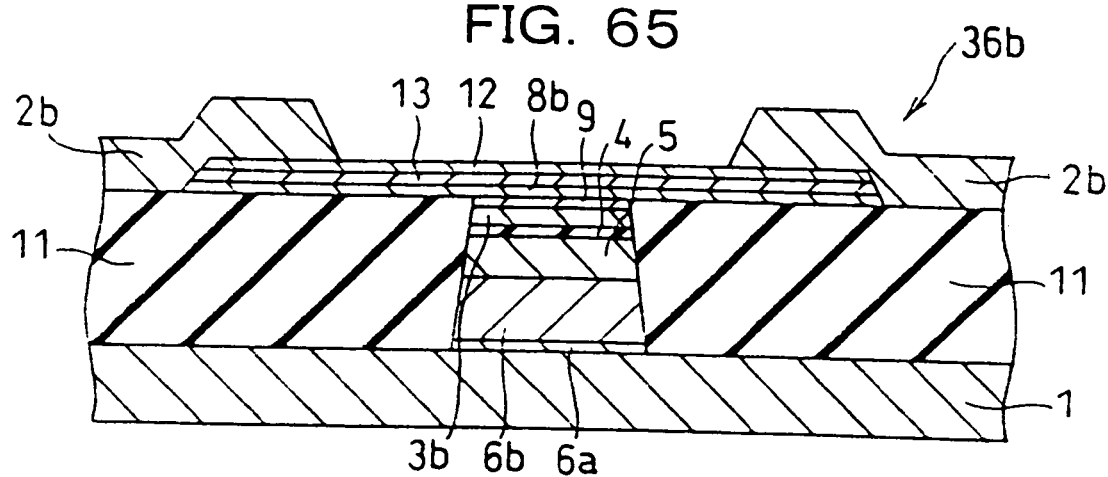
FIG. 65 is a fragmentary sectional view illustrating the structure of a magneto-resistance effect head according to a variation of this embodiment.
Figure 66:
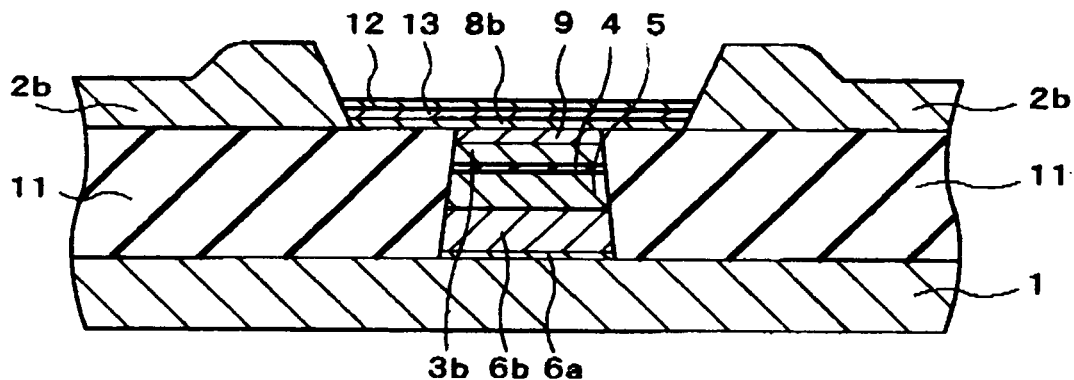
FIG. 66 is a fragmentary sectional view illustrating the structure of a magneto-resistance effect head according to another variation of this embodiment.

FIGS. 65-66 are fragmentary sectional views illustrating the structure of a magneto-resistance effect element according to a variation of this embodiment. With reference to FIG. 64, it has been shown in which the first magnetic layer 8b, the third non-magnetic layer 13, and the second magnetic layer 12 are not patterned. However, in a magneto-resistance effect element 36b shown in FIG. 65, the end portions of patterns of the magnetic layer 8b, the third non-magnetic layer 13, and the second magnetic layer 12 are arranged under the pattern of the vertical bias layer 2b.

In addition, in the magneto-resistance effect element 36c shown in FIG. 66, the end portions of patterns of the magnetic layer 8b the third non-magnetic layer 13, and the second magnetic layer 12 are in contact with the end portions of the pattern of the vertical bias layer 2b. Incidentally, the magneto-resistance effect elements 36b and 36c can also be employed for the magneto-resistance effect head, like the magneto-resistance effect element 36a.

Now, a ninth embodiment of the present invention is described below. FIGS. 67-70 are fragmentary sectional views illustrating the steps of a method for fabricating a magneto-resistance effect head according to this embodiment in the order in which they appear.

First, a structure body as shown in FIG. 61 is formed through the steps, shown in FIGS. 58-61, according to the aforementioned eighth embodiment.

Figure 67:
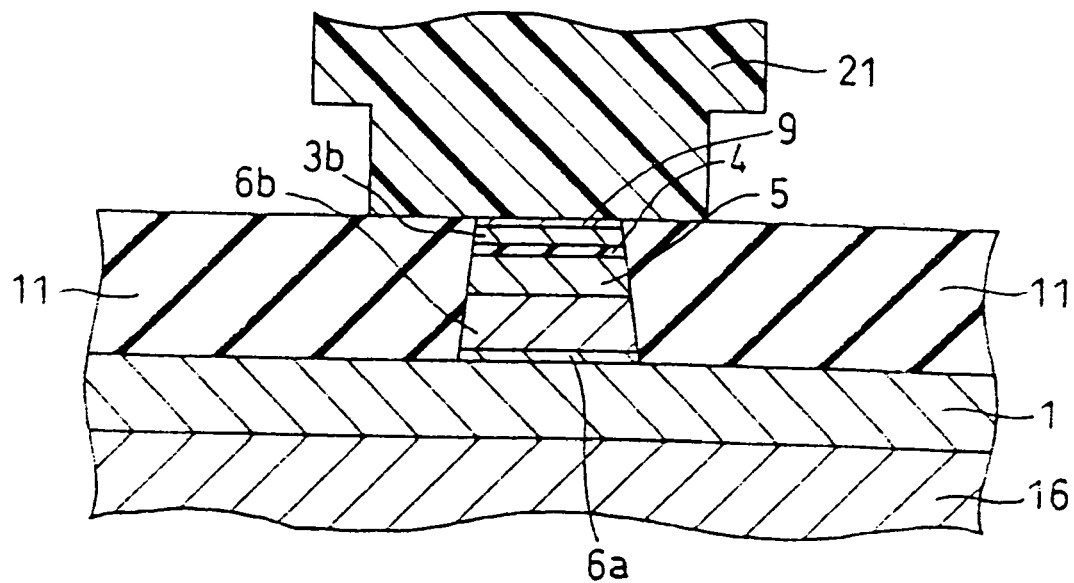
FIGS. 67-70 are fragmentary sectional views illustrating a method for fabricating a magneto-resistance effect head according to a ninth embodiment of the present invention.

Then, as shown in FIG. 67, the photoresist 20 is removed, and the photoresist 21 is formed to cover the peripheral region of the second non-magnetic layer 9 and the second non-magnetic layer 9 in the insulation layer 11.

Figure 68:
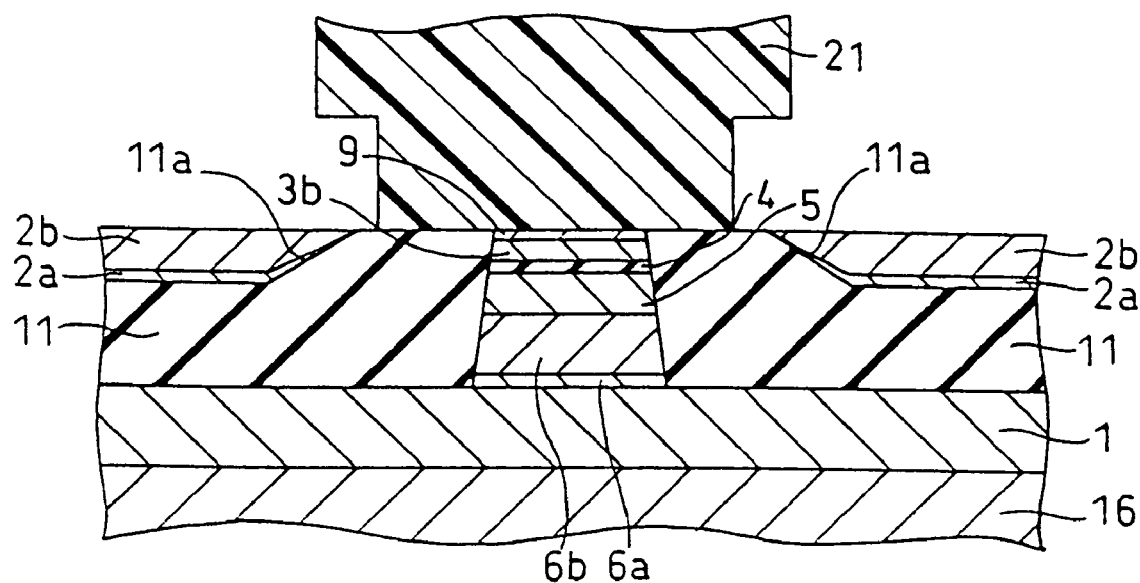

Then, as shown in FIG. 68, with the photoresist 21 being employed as a mask, a recessed portion 11a is formed in the insulation layer 11, and the underlying layer for vertical bias layer 2a and the vertical bias layer 2b are formed so as to be buried in the recessed portion 11a.

Figure 69:
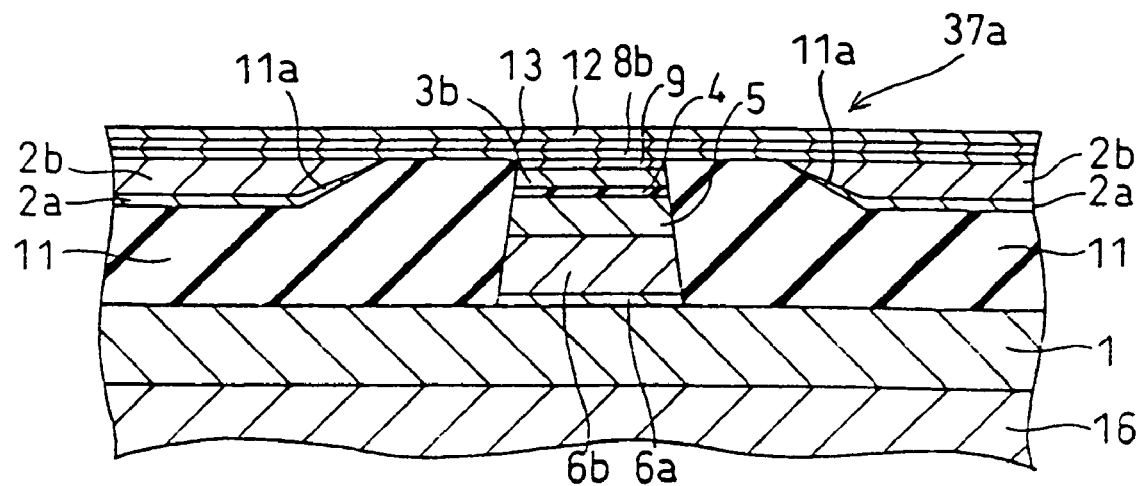

Then, as shown in FIG. 69, the photoresist 21 is removed to form the first magnetic layer 8b, the third non-magnetic layer 13, and the second magnetic layer 12 in that order, thereby forming a magneto-resistance effect element 37a.

Figure 70:
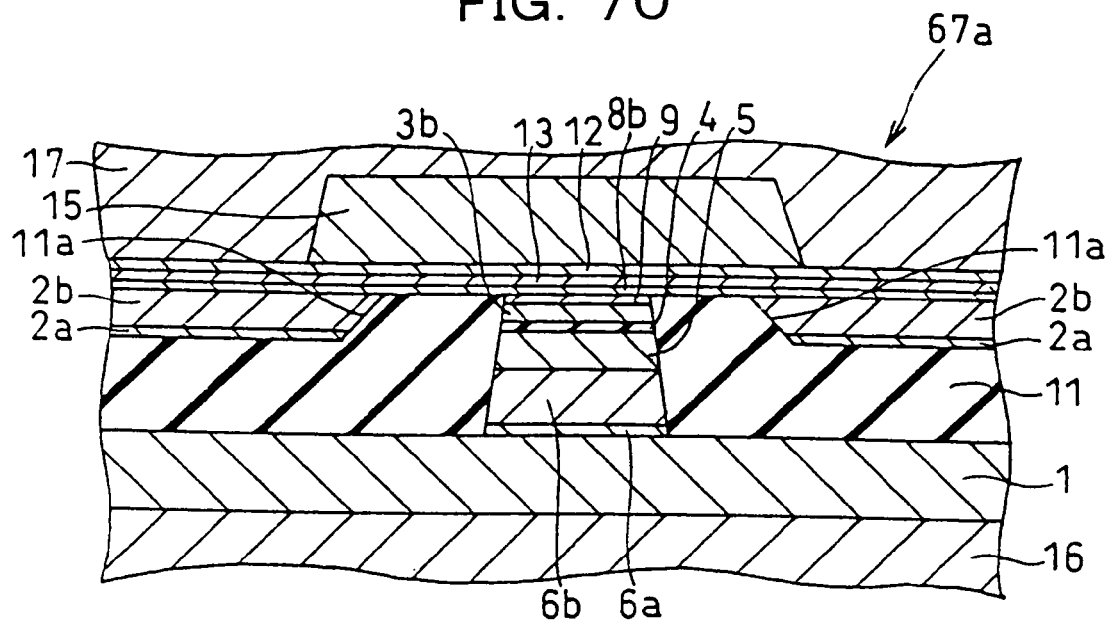

Then, as shown in FIG. 70, the upper conductive layer 15 is deposited on the second magnetic layer 12 and then a photoresist (not shown) is formed. With this photoresist being employed as a mask, the upper conductive layer 15 is patterned by dry etching or like means. Thereafter, the photoresist is removed and the upper shield layer 17 is formed thereupon, thereby forming a magneto-resistance effect head 67a.

Now, the structure of the magneto-resistance effect head 67a according to this embodiment is described below. The magneto-resistance effect head 67a is provided with the lower shield layer 16, and the lower conductive layer 1 is provided on the lower shield layer 16. Then, formed on top of the lower conductive layer 1 is the pattern in which the underlying layer for fixing layer 6a patterned on the fixing layer 6b, the fixed layer 5, non-magnetic layer 4, the free layer 3b, and the second non-magnetic layer 9 are layered in that order, and this pattern is buried in the insulation layer 11. As shown in FIG. 70, the insulation layer 11 has the recessed portion 11a on the upper surface thereof, and the underlying layer for vertical bias layer 2a and the vertical bias layer 2b are formed so as to be buried in the recessed portion 11a. Then, on the second non-magnetic layer 9, the insulation layer 11, and the vertical bias layer 2b, formed are the magnetic layer 8b, the third non-magnetic layer 13, and the second magnetic layer 12. Furthermore, the patterned upper conductive layer 15 is provided on the second magnetic layer 12, and the upper shield layer 17 is provided on the pattern of the second magnetic layer 12 and the upper conductive layer 15.

Now, a tenth embodiment according to the present invention is described below. FIGS. 71-76 are fragmentary sectional views illustrating the steps of a method for fabricating a magneto-resistance effect head according to this embodiment in the order in which they appear.

Figure 71:
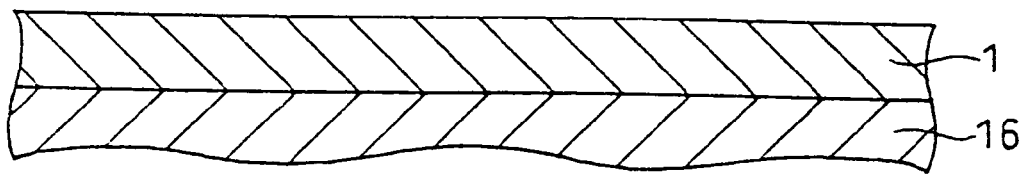
FIGS. 71-76 are fragmentary sectional views illustrating a method for fabricating a magneto-resistance effect head according to a tenth embodiment of the present invention.

First, as shown in FIG. 71, on a substrate (not shown), formed are the lower shield layer 16 and the lower conductive layer 1.

Figure 72:
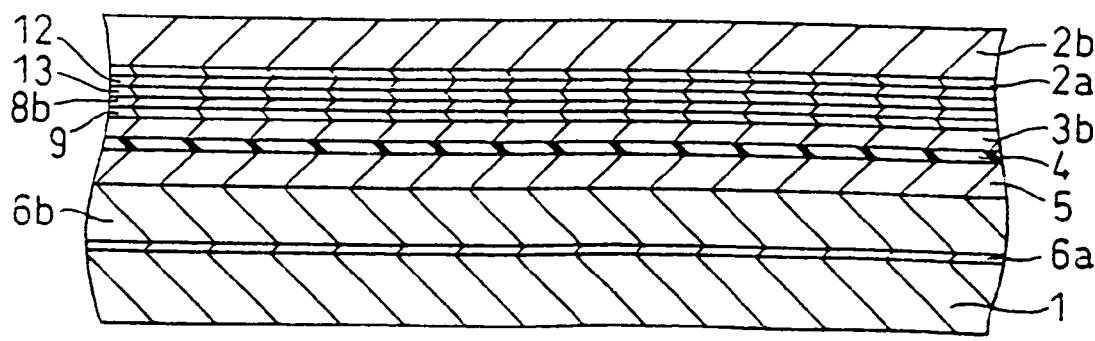

Then, as shown in FIG. 72, the following layers are formed and layered on the lower conductive layer 1. That is, the underlying layer for fixing layer 6a, the fixing layer 6b, the fixed layer 5, the first non-magnetic layer 4, the free layer 3b, the second non-magnetic layer 9, the first magnetic layer 8b, the third non-magnetic layer 13, the second magnetic layer 12, the underlying layer for vertical bias layer 2a, and the vertical bias layer 2b are formed and layered in that order.

Figure 73:
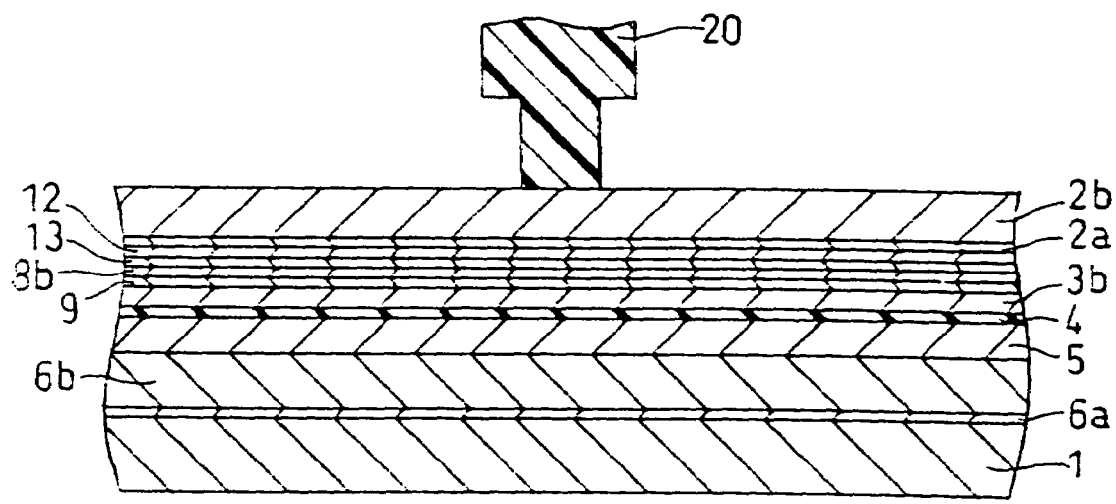

Then, as shown in FIG. 73, the photoresist 20 is patterned on the vertical bias layer 2b.

Figure 74:
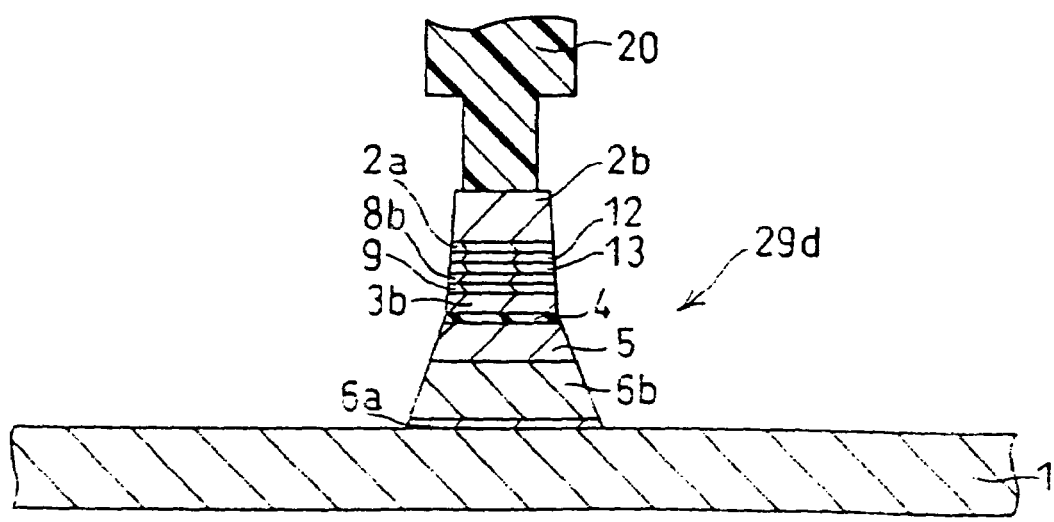

Then, as shown in FIG. 74, with the photoresist 20 being employed as a mask, etched by dry etching or like means and thereby patterned are the underlying layer for fixing layer 6a, the fixing layer 6b, the fixed layer 5, the non-magnetic layer 4, the free layer 3b, the second non-magnetic layer 9, the magnetic layer 8b, the third non-magnetic layer 13, the second magnetic layer 12, the underlying layer for vertical bias layer 2a, and the vertical bias layer 2b. Thus, a pattern 29d is formed which is made up of the underlying layer for fixing layer 6a, the fixing layer 6b, the fixed layer 5, the non-magnetic layer 4, the free layer 3b, the second non-magnetic layer 9, the magnetic layer 8b, the third non-magnetic layer 13, the second magnetic layer 12, the underlying layer for vertical bias layer 2a, and the vertical bias layer 2b.

Figure 75:
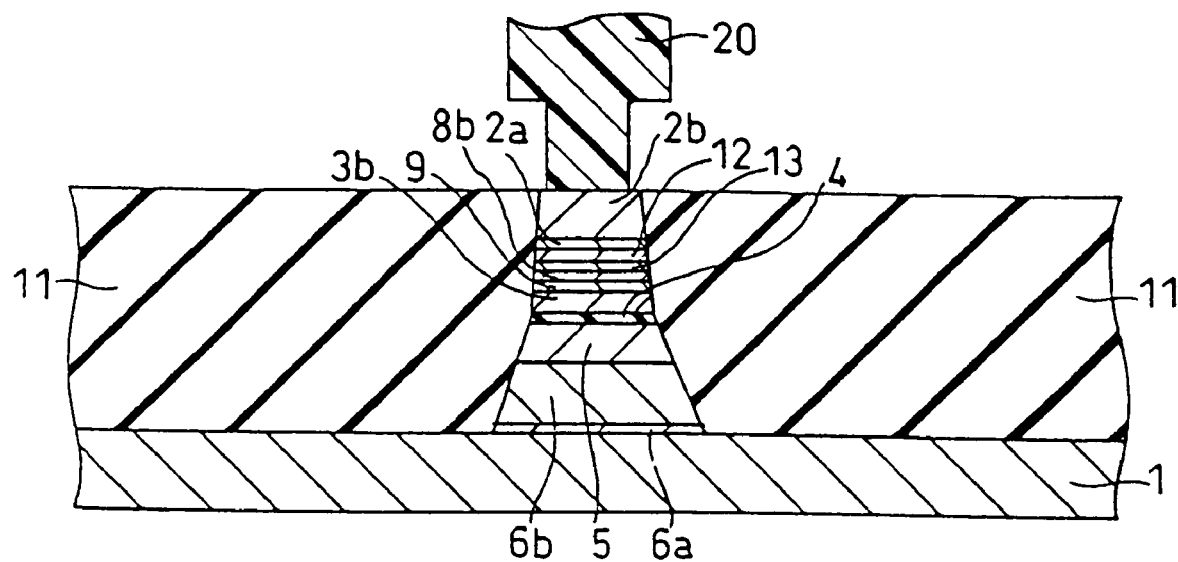

Then, as shown in FIG. 75, the insulation layer 11 is formed to bury the pattern 29d therein, thereby forming the magneto-resistance effect element 38a.

Figure 76:
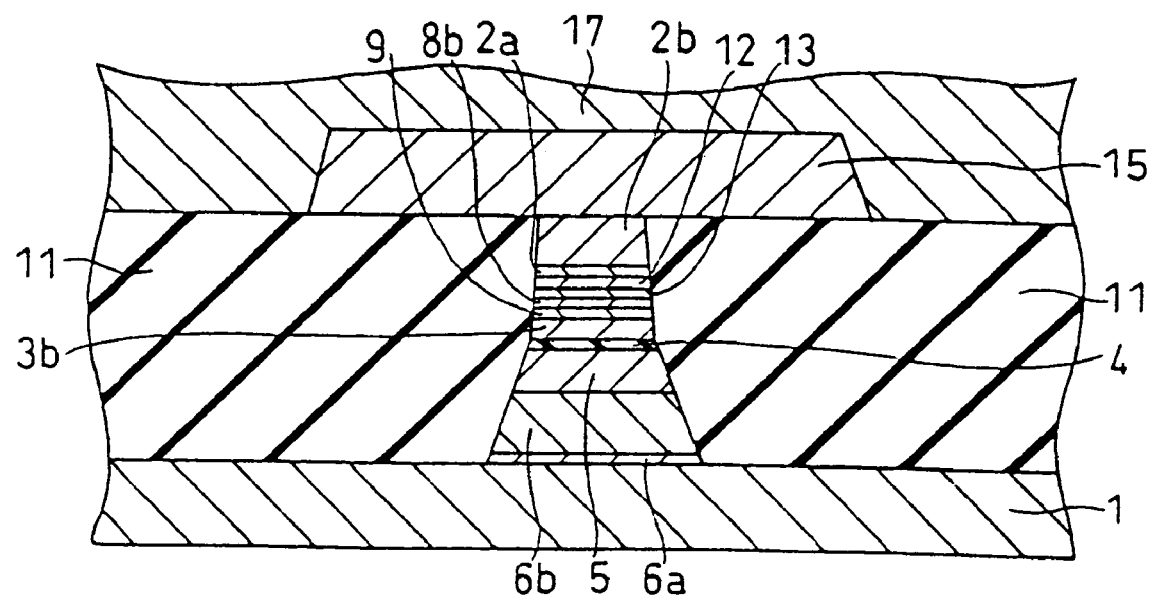

Then, as shown in FIG. 76, the photoresist 20 is removed, and the upper conductive layer 15 is formed on the vertical bias layer 12 and the insulation layer 11 to form a photoresist (not shown). Then, with this photoresist being employed as a mask, the upper conductive layer 15 is patterned by dry etching or like means. Then, the photoresist is removed to form the upper shield layer 17 thereupon, thus forming a magneto-resistance effect head.

Now, the structure of the magneto-resistance effect head according to this embodiment is described below. As shown in FIG. 76, the magneto-resistance effect head is provided with a lower shield layer (not shown), and the lower conductive layer 1 is provided on a lower shield layer. On top of the lower conductive layer 1, provided is the pattern 29d made up of the underlying layer for fixing layer 6a, the fixing layer 6b, the fixed layer 5, non-magnetic layer 4, the free layer 3b, the second non-magnetic layer 9, the first magnetic layer 8b, the third non-magnetic layer 13, the second magnetic layer 12, the underlying layer for vertical bias layer 2a, and the vertical bias layer 2b, which have been patterned. The pattern 29d is buried in the insulation layer 11, and the vertical bias layer 2b of the pattern 29d is exposed on the upper surface of the insulation layer 11. In addition, the upper conductive layer 15, which has been patterned, is provided on top of the pattern 29d and the insulation layer 11, and the upper shield layer 17 is provided on the upper conductive layer 15 and the insulation layer 11. Now, the operation of the magneto-resistance effect head according to this embodiment is described below. The magnetic field applied to the magneto-resistance effect head is applied to the second magnetic layer 12 via the vertical bias layer 2b. Then, the vertical bias magnetic field is applied to the first magnetic layer 8b from the second magnetic layer 12 via the third non-magnetic layer 13 by means of magnetic coupling such as ferromagnetic coupling, antiferromagnetic coupling, or magneto-static coupling. Furthermore, the vertical bias magnetic field is applied to the free layer 3b from the first magnetic layer 8b via the second non-magnetic layer 9 by means of magnetic coupling such as ferromagnetic coupling, antiferromagnetic coupling, or magneto-static coupling.

The third non-magnetic layer 13 allows the component material and the film thickness thereof to control the magnetic coupling between the second magnetic layer 12 and the magnetic layer 8b. In addition, the second non-magnetic layer 9 allows the component material and the film thickness thereof to control the magnetic coupling between the magnetic layer 8b and the free layer 3b. As described above, a vertical bias magnetic field is applied to the free layer 3b from the vertical bias layer 2b through three steps of process, thereby assuring the application of the vertical bias magnetic field and facilitating the control of the magnetic field applied.

Incidentally, the underlying layer for fixing layer 6a, the second non-magnetic layer 9, the third non-magnetic layer 13, and the underlying layer for vertical bias layer 2a can be omitted. Incidentally, a protective layer for protecting the vertical bias layer 2b may be provided on the vertical bias layer 2b, while an upper layer may be provided on the second magnetic layer 12.

Figure 77:
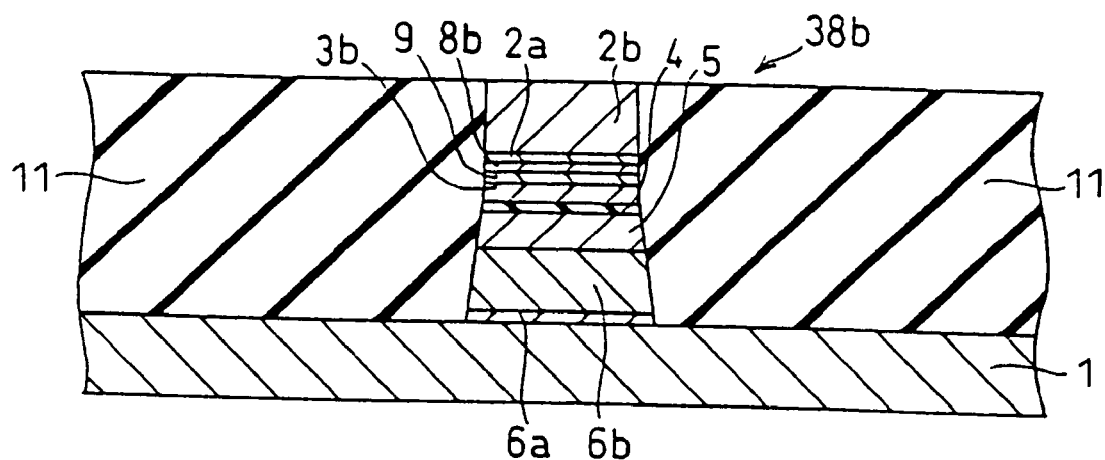
FIG. 77 is a fragmentary sectional view illustrating the structure of a magneto-resistance effect head according to a variation of this embodiment.

FIG. 77 is a fragmentary sectional view illustrating the structure of a magneto-resistance effect element 38b according to a variation of this embodiment. The magneto-resistance effect element 38b is provided with the lower conductive layer 1 on a substrate (not shown). On top of the lower conductive layer 1, provided are the underlying layer for fixing layer 6a, the fixing layer 6b, the fixed layer 5, non-magnetic layer 4, the free layer 3b, the second non-magnetic layer 9, the first magnetic layer 8b, the underlying layer for vertical bias layer 2a, and the vertical bias layer 2b. And, these layers have been patterned and buried in the insulation layer 11. The vertical bias layer 2b is exposed on the upper surface of the insulation layer 11.

First, the vertical bias magnetic field applied to the magneto-resistance effect element 38b is applied to the magnetic layer 8b via the vertical bias layer 2b. Then, the vertical bias magnetic field is applied to the free layer 3b from the first magnetic layer 8b via the second non-magnetic layer 9 by means of magnetic coupling such as ferromagnetic coupling, antiferromagnetic coupling, or magneto-static coupling. And, the second non-magnetic layer 9 allows the component material and the film thickness thereof to control the magnetic coupling between the magnetic layer 8b and the free layer 3b.

As described above, a vertical bias magnetic field is applied to the free layer 3b from the vertical bias layer 2b through two steps of process, thereby assuring the application of the vertical bias magnetic field and facilitating the control of the amount of the magnetic field applied.

Incidentally, in this embodiment, it has been explained in which the underlying layer for fixing layer 6a, the fixing layer 6b, the fixed layer 5, the non-magnetic layer 4, the free layer 3b, and the second non-magnetic layer 9 are patterned in the same way. However, it is necessary to pattern at least the free layer 3b but not necessary to pattern the layered film made up of the underlying layer for fixing layer 6a, the fixing layer 6b, the fixed layer 5, and the non-magnetic layer 4. In addition, the pattern of the underlying layer for fixing layer 6a may be extended further than that of the fixing layer 6b. The pattern of the fixing layer 6b may be extended further than that of the fixed layer 5. The pattern of the fixed layer 5 may be extended further than that of the non-magnetic layer 4. The pattern of the first non-magnetic layer 4 may be extended further than that of the free layer 3b.

Now, an eleventh embodiment according to the present invention is described below. FIGS. 78-87 are fragmentary sectional views illustrating the steps of a method for fabricating a magneto-resistance effect head according to this embodiment in the order in which they appear.

Figure 78:
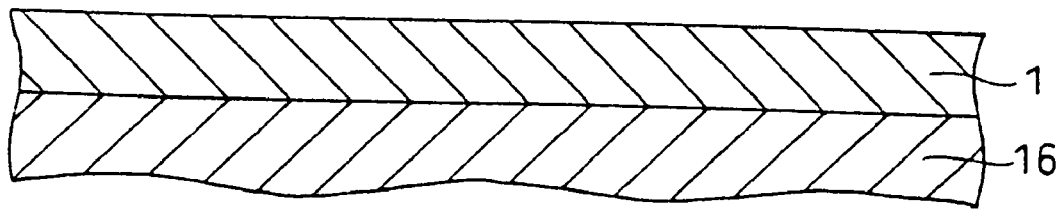
FIGS. 78-87 are fragmentary sectional views illustrating a method for fabricating a magneto-resistance effect head according to an eleventh embodiment of the present invention.

First, as shown in FIG. 78, the lower shield layer 16 and the lower conductive layer 1 are successively formed on top of a substrate (not shown).

Figure 79:
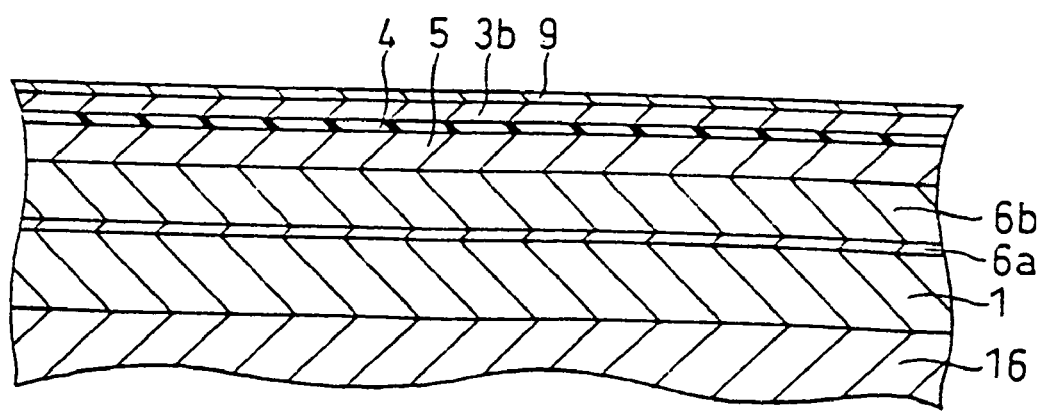

Then, as shown in FIG. 79, the underlying layer for fixing layer 6a, the fixing layer 6b, the fixed layer 5, the first non-magnetic layer 4, the free layer 3b, and the second non-magnetic layer 9 are formed and layered in that order on the lower conductive layer 1.

Figure 80:
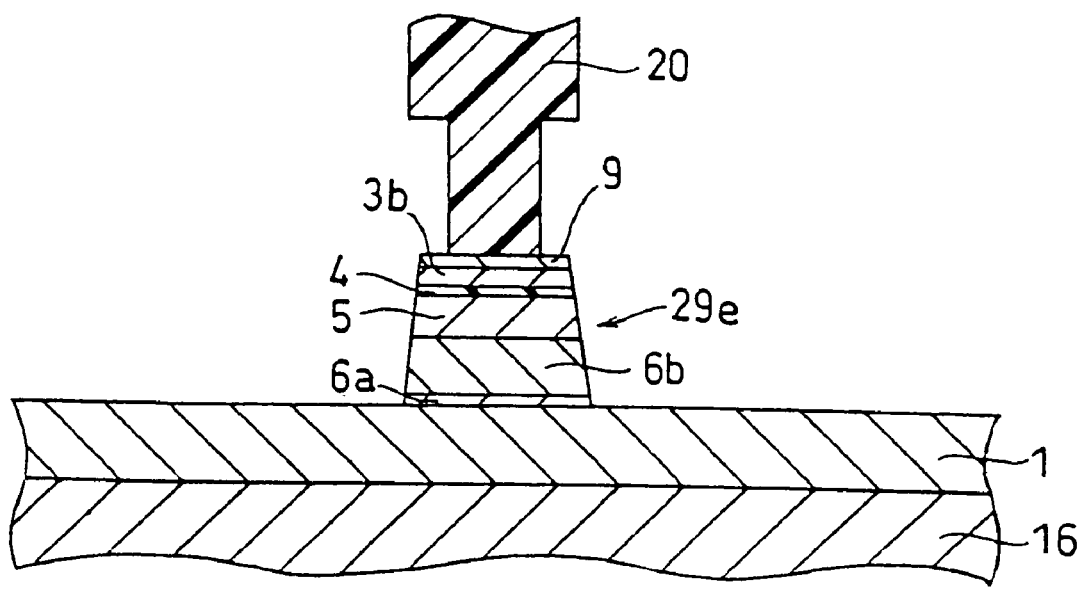

Then, as shown in FIG. 80, the photoresist 20 is patterned on the second non-magnetic layer 9. Then, the underlying layer for fixing layer 6a, the fixing layer 6b, the fixed layer 5, the first non-magnetic layer 4, the free layer 3b, and the second non-magnetic layer 9 are patterned by dry etching or like means, thereby forming a pattern 29e made up of these layers.

Figure 81:
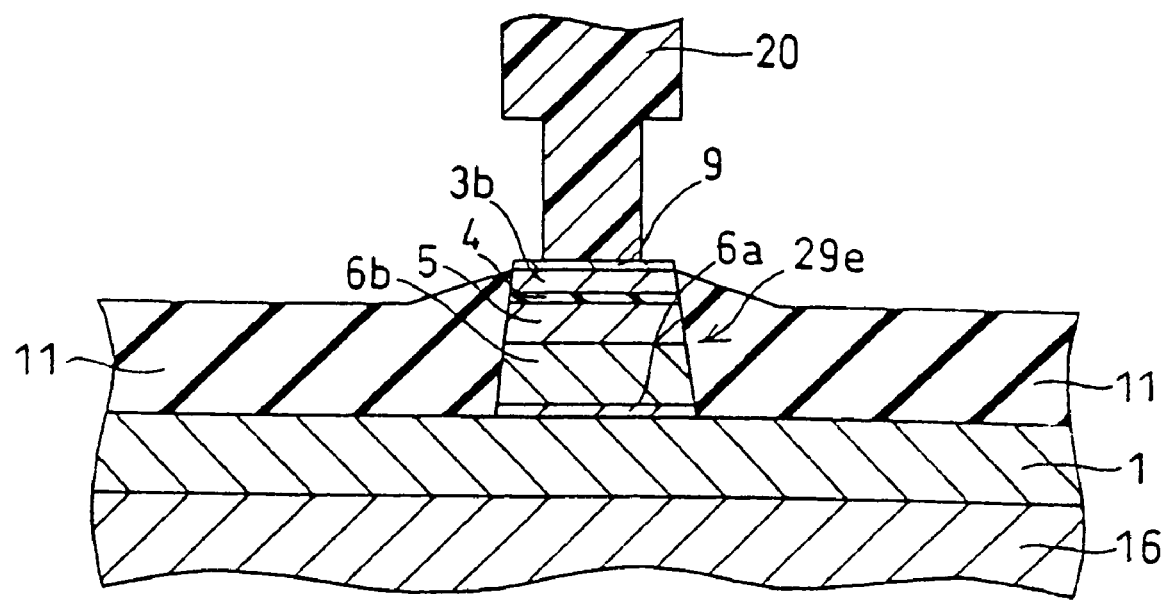

Then, as shown in FIG. 81, the insulation layer 11 is formed around the pattern 29e to bury the pattern 29e therein. And, the insulation layer 11 is made equal in height to the pattern 29e near the pattern 29e but is slightly lower than the pattern 29e at a given distance from the pattern 29e, between which a smooth slope connects.

Figure 82:
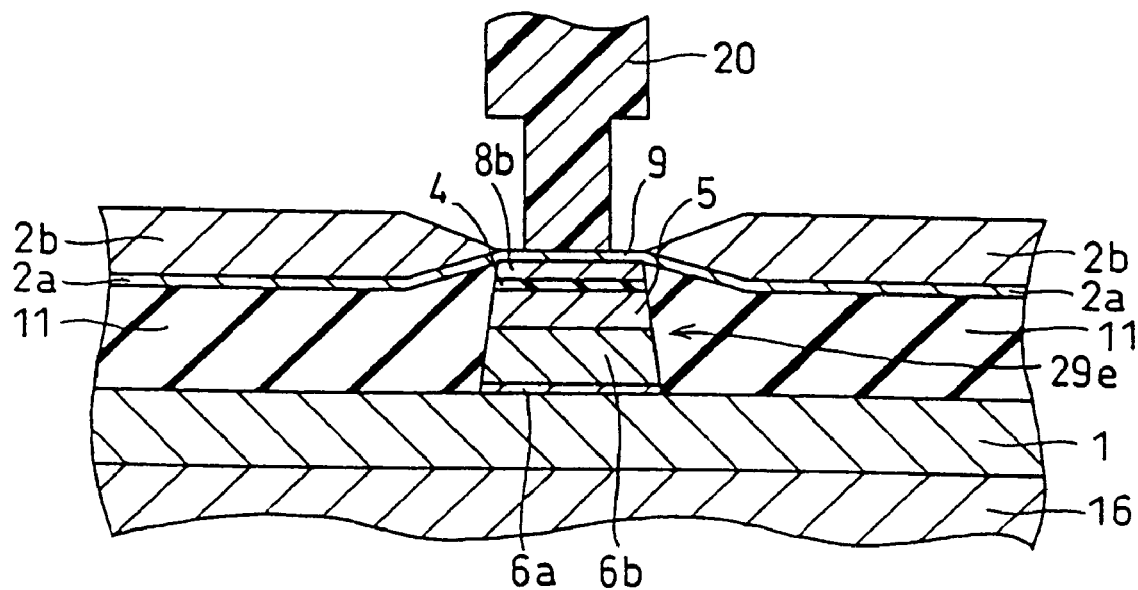

Then, as shown in FIG. 82, on the insulation layer 11, formed are the underlying layer for vertical bias layer 2a and the vertical bias layer 2b. The vertical bias layer 2b is varied in thickness along the slope of the insulation layer 11, allowing the vertical bias layer 2b to be thick in thickness at a given distance from the pattern 29e and reduced in thickness with increasing proximity to the pattern 29e.

Figure 83:
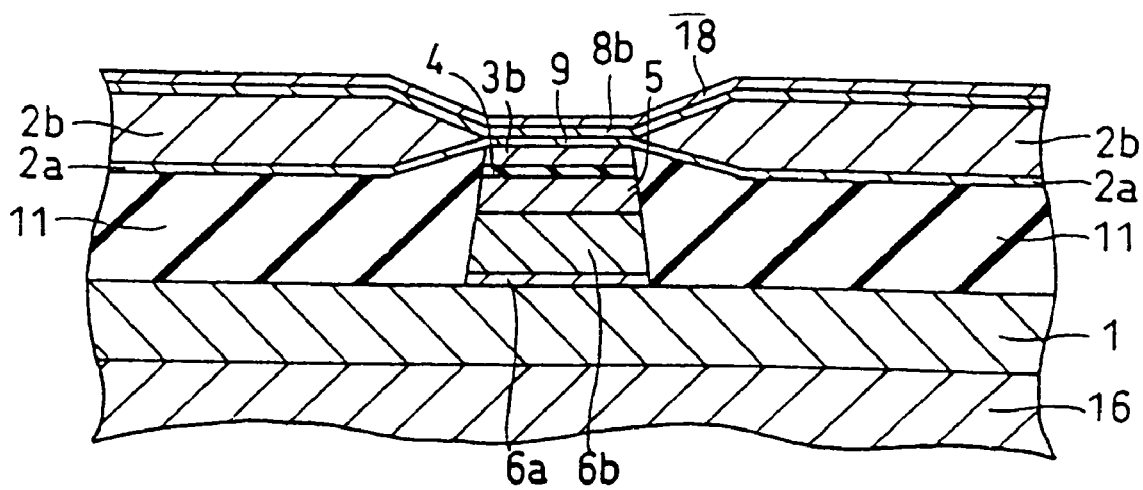

Then, as shown in FIG. 83, the photoresist 20 is removed to form the first magnetic layer 8b and a fourth magnetic layer 18 on the second non-magnetic layer 9 and the vertical bias layer 2b.

Figure 84:
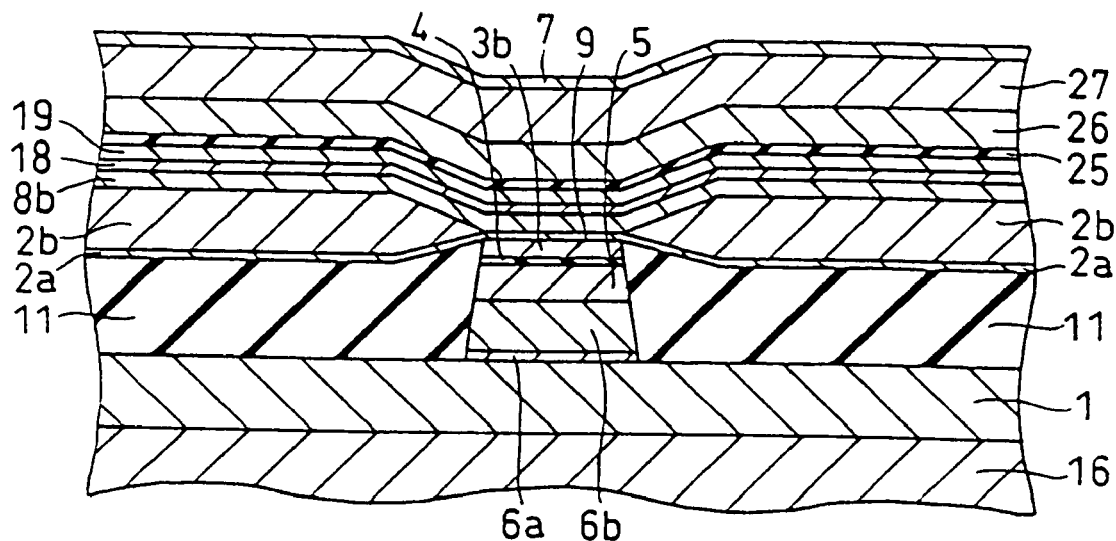

Then, as shown in FIG. 84, a second free layer 19, a fifth non-magnetic layer 25, a second fixed layer 26, a second fixing layer 27, and the upper layer 7 are formed in that order.

Figure 85:
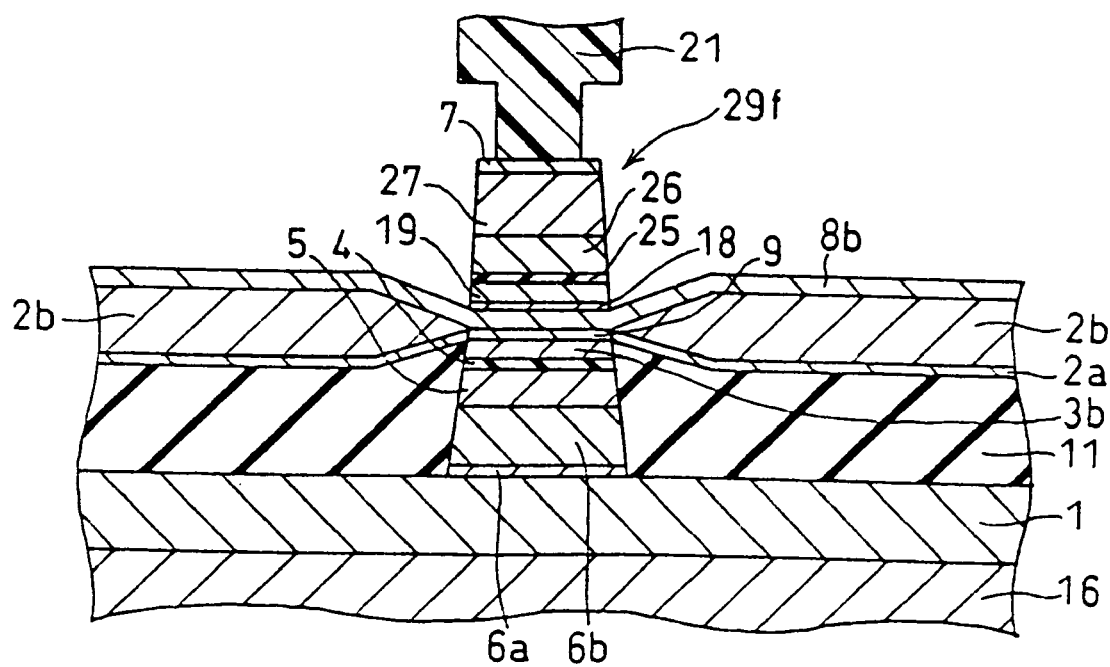

Then, as shown in FIG. 85, the photoresist 21 is formed to cover the region that matches the pattern 29e on the upper layer 7. With the photoresist 21 being employed as a mask, the fourth non-magnetic layer 18, the second free layer 19, the fifth non-magnetic layer 20, the second fixed layer 26, the second fixing layer 27, and the upper layer 7 are patterned. Formed thereby is a pattern 29f made up of the fourth non-magnetic layer 18, the second free layer 19, the fifth non-magnetic layer 20, the second fixed layer 26, the second fixing layer 27, and the upper layer 7.

Figure 86:
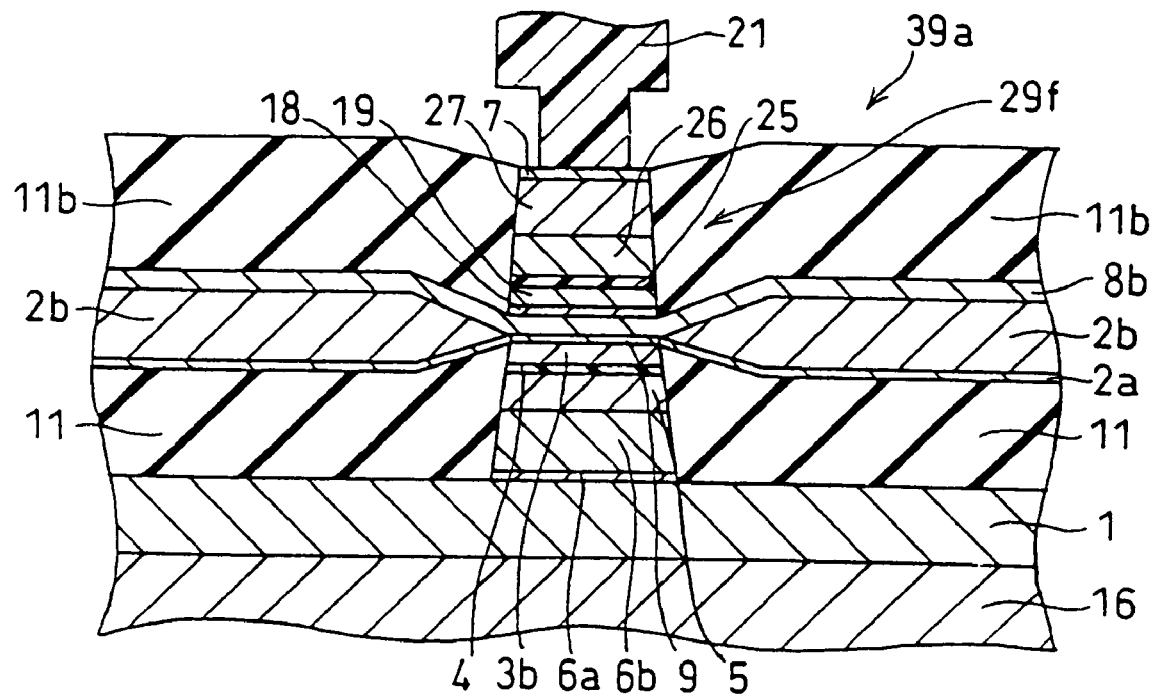

Then, as shown in FIG. 86, around the pattern 29f, the insulation layer 11b is formed to bury pattern 29f therein, thereby providing a magneto-resistance effect element 39a formed on the lower shield layer 16.

Figure 87:
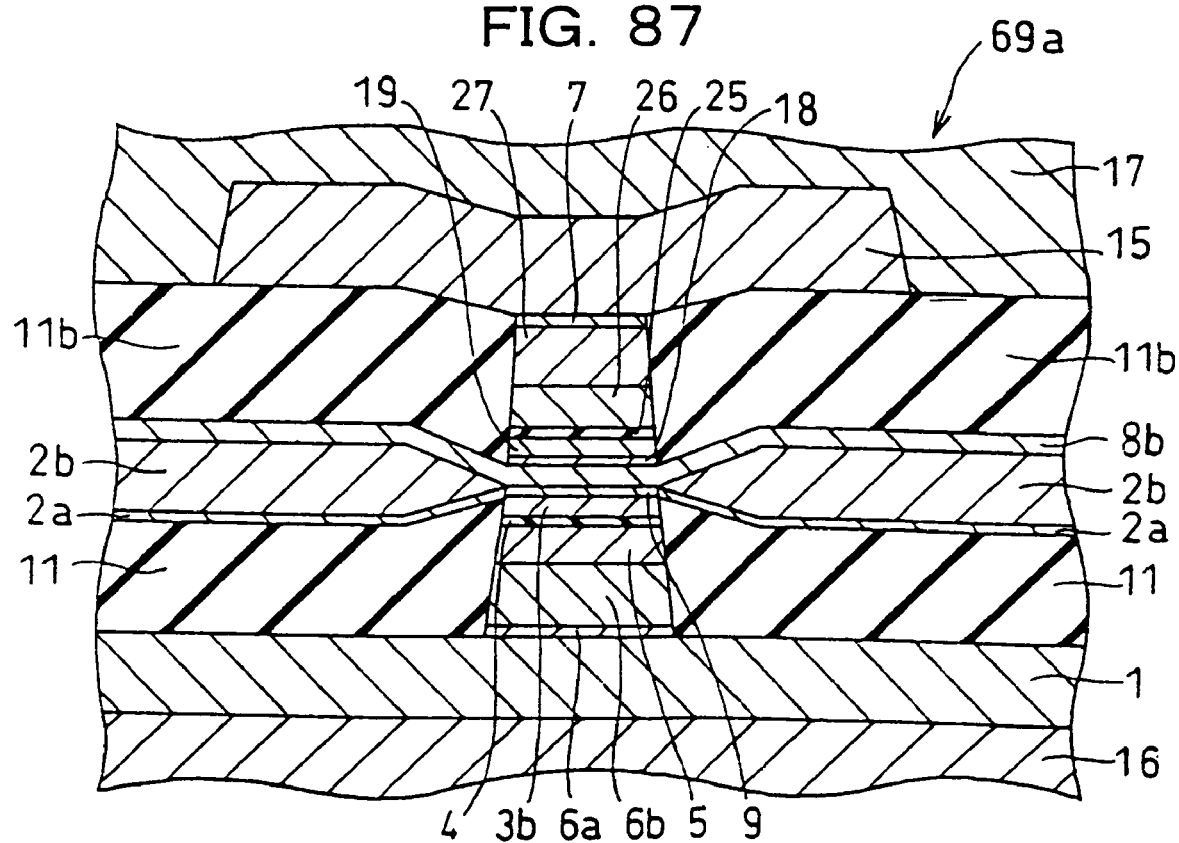

Then, as shown in FIG. 87, the photoresist 21 is removed, and the upper conductive layer 15 is deposited on the upper layer 7 and the insulation layer 11b to form a photoresist (not shown). With this photoresist being employed as a mask, the upper conductive layer 15 is patterned by dry etching or like means. Thereafter, the photoresist is removed and the upper shield layer 17 is formed thereupon, thus forming a magneto-resistance effect head 69a.

Now, the structure of the magneto-resistance effect element 39a according to this embodiment is described below. As shown in FIG. 87, the magneto-resistance effect element 39a is adapted that the non-magnetic layer, the free layer, the non-magnetic layer, the fixed layer, and the fixing layer are formed to be vertically symmetric with respect to the second non-magnetic layer 8b to which a vertical bias magnetic field is applied from the underlying layer for vertical bias layer 2a.

The magneto-resistance effect element 39a is provided with the lower shield layer 16, and the lower conductive layer 1 is provided on the lower shield layer 16. On top of the lower conductive layer 1, formed is the pattern 29e made up of the underlying layer for fixing layer 6a, the fixing layer 6b, the fixed layer 5, the first non-magnetic layer 4, the free layer 3b, and the second non-magnetic layer 9, which have been patterned. The pattern 29e is buried in the insulation layer 11.

The upper surface of the insulation layer 11 is generally flush with that of the pattern 29e near the pattern 29e but is slightly lower than the upper surface of the pattern 29e at a given distance from the pattern 29e. The pattern of the underlying layer for vertical bias layer 2a and the vertical bias layer 2b is provided to allow at least part thereof in the direction of film thickness to be buried in the insulation layer 11. The second non-magnetic layer 9 is provided on the pattern 29e and the vertical bias layer 2b.

On top of the second non-magnetic layer 9, the pattern 29f is provided which is made up of the fourth magnetic layer 18, the second free layer 19, the fifth non-magnetic layer 25, the second fixed layer 26, the second fixing layer 27, and the upper layer 7, which have been patterned, with the pattern 29f being buried in the insulation layer 11b. In addition, the upper conductive layer 15 and the upper shield layer 17 are provided on the pattern 29f and the insulation layer 11b.

Now, the operation of the magneto-resistance effect element 39a according to this embodiment is described below. When a sensor containing the magneto-resistance effect element 39a is subjected to an external magnetic field, the second free layer 19, like the free layer 3b, serves as a magnetic layer which changes its orientation of magnetization in accordance with the orientation and magnitude of the magnetic field. The fifth non-magnetic layer 25 is disposed between the second free layer 19 and the second fixed layer 26, and varies in electrical resistance in accordance with the angle between the orientation of magnetization of the second free layer and that of the second fixed layer 26. The orientation of magnetization of the second fixed layer 26 is pinned by the second fixing layer 27. Thus, a change in orientation of magnetization of the free layer in accordance with the orientation and magnitude of an external magnetic field would cause a change to occur between the orientation of magnetization of the fixed layer, the orientation of which is pinned, and that of the free layer. This results in a change in resistance of the fifth non-magnetic layer 25.

In the magneto-resistance effect element 39a, the amount of a change in electrical resistance produced upon conducting a sense current from the lower conductive layer 1 to the upper conductive layer 15 is equal to the sum of a change in electrical resistance of the pattern 29e located below the magnetic layer 8b and a change in electrical resistance of the pattern 29f located above the magnetic layer 8b.

Generally, in the magneto-resistance effect element, the free layer is unavoidably subjected to the influence of a circular electric magnetic field caused by a current flowing perpendicularly to the film surface. However, in the magneto-resistance effect element 39a according to this embodiment, the influence of the electric magnetic field to which the free layer 3b is subjected is opposite to that of the electric magnetic field to which the second free layer 19 is subjected, thereby canceling out the influences as a whole. Thus, it is made possible to significantly reduce the influence of the electric magnetic field.

In addition, in the magneto-resistance effect element 39a, the vertical bias magnetic field applied is first applied to the second magnetic layer 8b via the vertical bias layer 2b. Then, the vertical bias magnetic field is applied to the free layer 3b from the second magnetic layer 8b via the second non-magnetic layer 9 and to the second free layer 19 through the fourth non-magnetic layer 18. The second non-magnetic layer 9 controls the magnetic coupling between the second magnetic layer 8b and the free layer 3b by the component material and film thickness thereof, while the fourth non-magnetic layer 18 controls the magnetic coupling between the magnetic layer 8b and the second free layer 19 by the component material and film thickness thereof. As described above, a vertical bias magnetic field is applied to the free layer 3b and the second free layer 19 from the vertical bias layer 2b through two steps of process, thereby assuring the application of the vertical bias magnetic field and facilitating the control of the amount of application of the magnetic field.

Incidentally, in this embodiment, the underlying layer for vertical bias layer 2a, the underlying layer for fixing layer 6a, the second non-magnetic layer 9, the fourth magnetic layer 18, and the upper layer 7 can be omitted. Furthermore, in some cases, a protective layer for protecting the vertical bias layer may be provided on the vertical bias layer 2b.

In addition, in this embodiment, it has been explained in which the underlying layer for fixing layer 6a, the fixing layer 6b, the fixed layer 5, the first non-magnetic layer 4, the free layer 3b, and the second non-magnetic layer 9 are patterned in the same way. However, it is necessary to pattern at least the free layer 3b but not necessary to pattern the underlying layer for fixing layer 6a, the fixing layer 6b, the fixed layer 5, and the first non-magnetic layer 4. Furthermore, the pattern of the underlying layer for fixing layer 6a may be extended further than that of the fixing layer 6b. The pattern of the fixing layer 6b may be extended further than that of the fixed layer 5. The pattern of the fixed layer 5 may be extended further than that of the non-magnetic layer 4. The pattern of the first non-magnetic layer 4 may be extended further than that of the free layer 3b.

Still furthermore, this embodiment has shown that the upper surface of the insulation layer 11 is lower than that of the pattern of the free layer 3b at a given distance from the pattern 29e or 29f. However, the upper surface of the insulation layer 11 may be equal in height to the upper surface of the pattern of the free layer 3b or higher than the upper surface of the pattern of the free layer 3b. Furthermore, the pattern of the vertical bias layer 2b may be spaced apart from the pattern of the free layer 3b and that of the second free layer 19. In addition, the fourth magnetic layer 18 may be patterned in conjunction with the second free layer 19 and extended further than the pattern of the second free layer 19. Furthermore, the pattern of the second non-magnetic layer 9 may be extended further than that of the free layer 3b.

Figure 88:
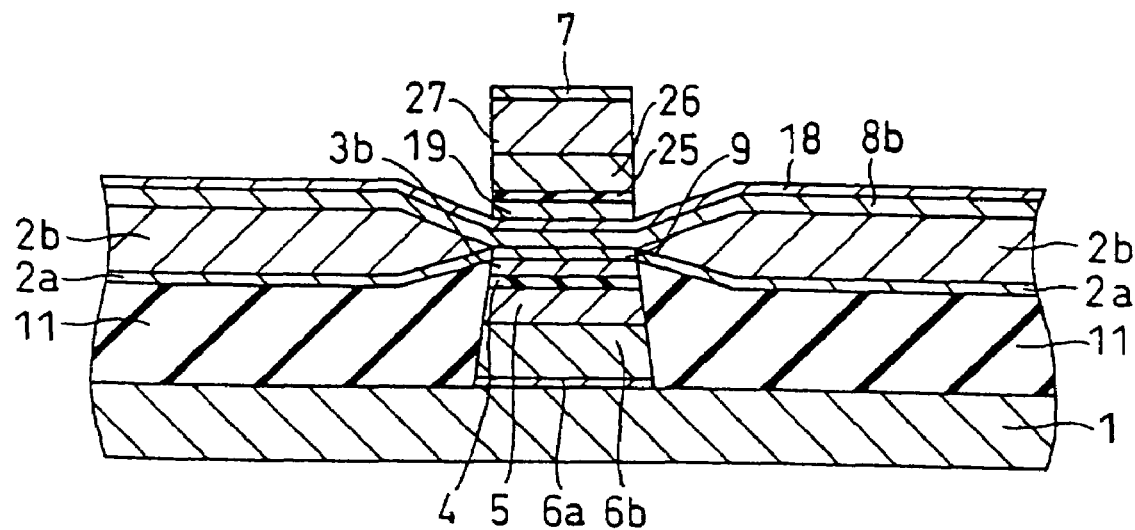
FIG. 88 is a fragmentary sectional view illustrating the structure of a magneto-resistance effect head according to a variation of this embodiment.
Figure 89:
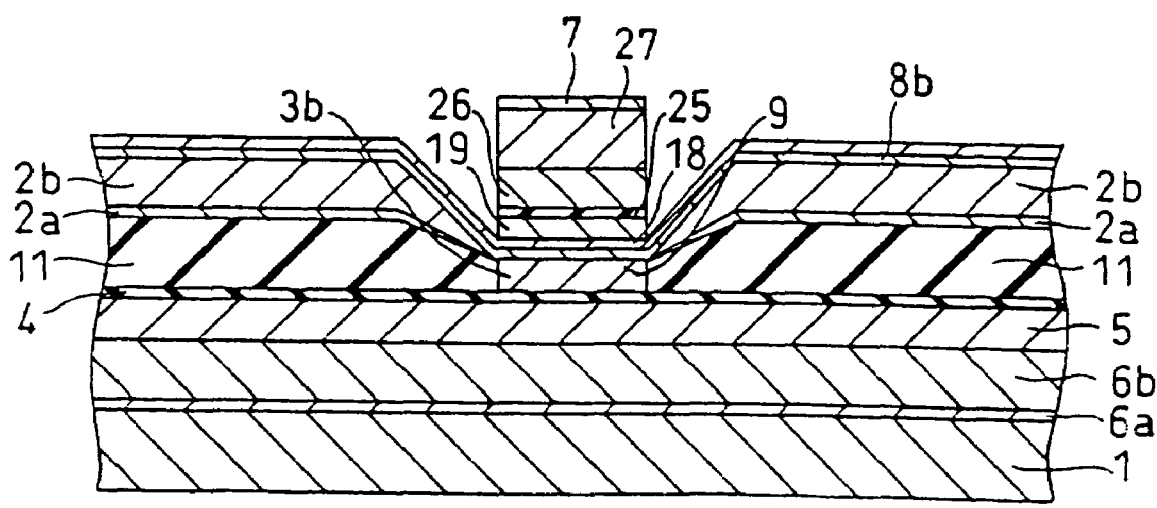
FIG. 89 is a fragmentary sectional view illustrating the structure of a magneto-resistance effect head according to another variation of this embodiment.
Figure 90:
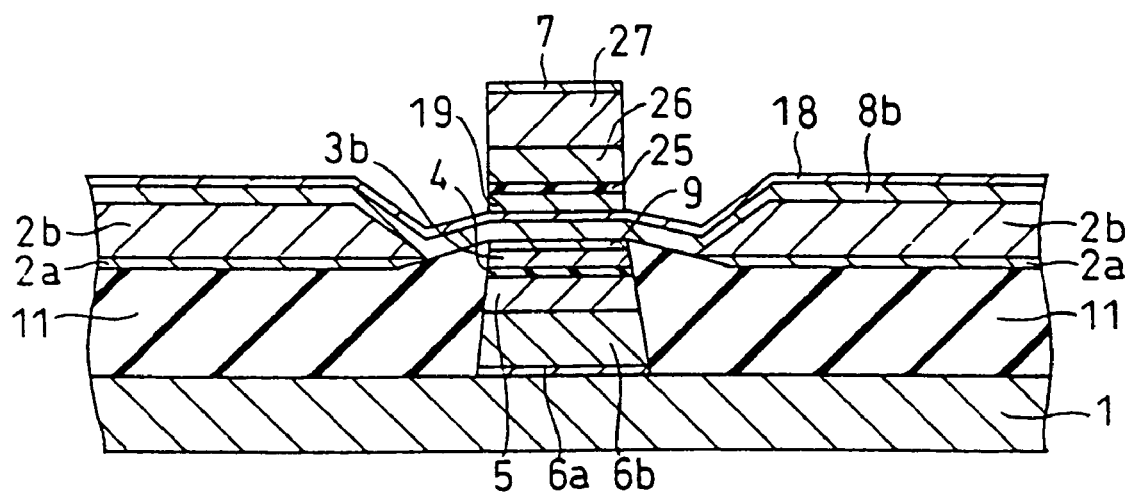
FIG. 90 is a fragmentary sectional view illustrating the structure of a magneto-resistance effect head according to still another variation of this embodiment.

FIGS. 88-90 are fragmentary sectional views illustrating the structure of a magneto-resistance effect element according to a variation of this embodiment. FIG. 88 shows that fourth magnetic layer 18 is not patterned.

In addition, FIG. 89 shows that the upper surface of the insulation layer 11 is higher than that of the pattern of the free layer 3b.

Furthermore, FIG. 90 shows that the pattern of the vertical bias layer 2b is spaced apart from that of the free layer 3b and the second free layer 19. The magneto-resistance effect element shown in FIGS. 88-90 can also be employed for the magneto-resistance effect head.

Now, a twelfth embodiment according to the present invention is described below. FIGS. 91-94 are fragmentary sectional views illustrating the structure of a magneto-resistance effect head according to this embodiment.

First, a layered body as shown in FIG. 6 is formed through the steps, shown in FIGS. 4-6, according to the aforementioned first embodiment.

Figure 91:
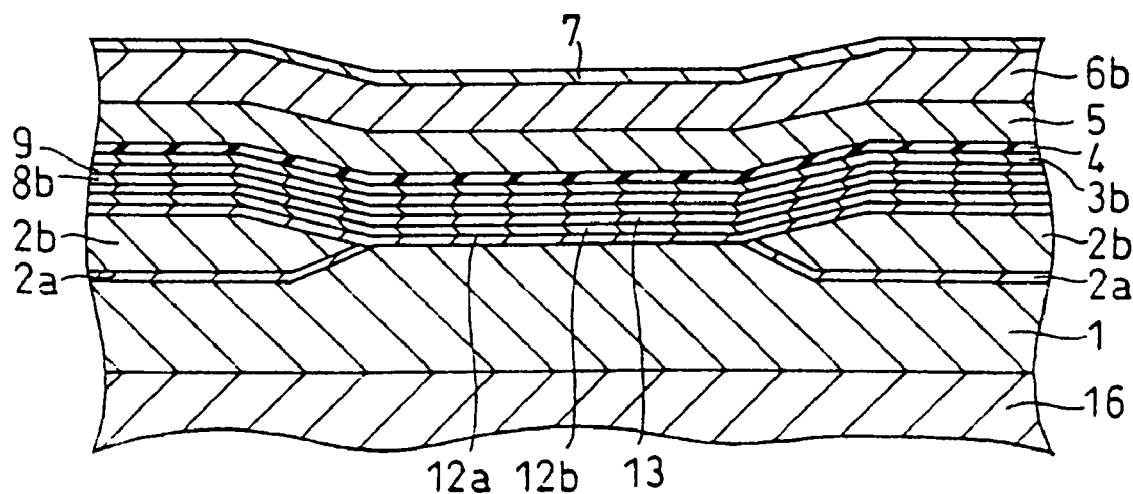
FIGS. 91-94 are fragmentary sectional views illustrating a method for fabricating a magneto-resistance effect head according to a twelfth embodiment of the present invention.

Then, as shown in FIG. 91, on the lower conductive layer 1 and the vertical bias layer 2b, layered in sequence are an underlying layer for magnetic layer 12a, a second magnetic layer 12b, the third non-magnetic layer 13, the first magnetic layer 8b, the second non-magnetic layer 9, the free layer 3b, the first non-magnetic layer 4, the fixed layer 5, the fixing layer 6b, and the upper layer 7.

Figure 92:
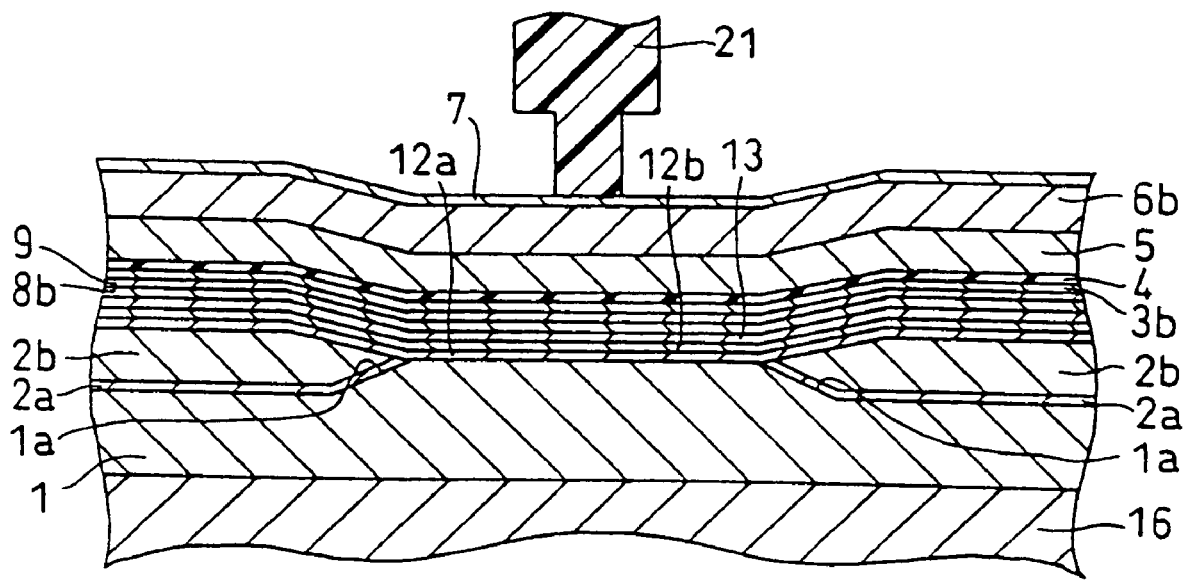

Then, as shown in FIG. 92, a photoresist 21 is formed at the central portion of the region where no recessed portion 1a of the lower conductive layer 1 is formed on the upper layer 7.

Figure 93:
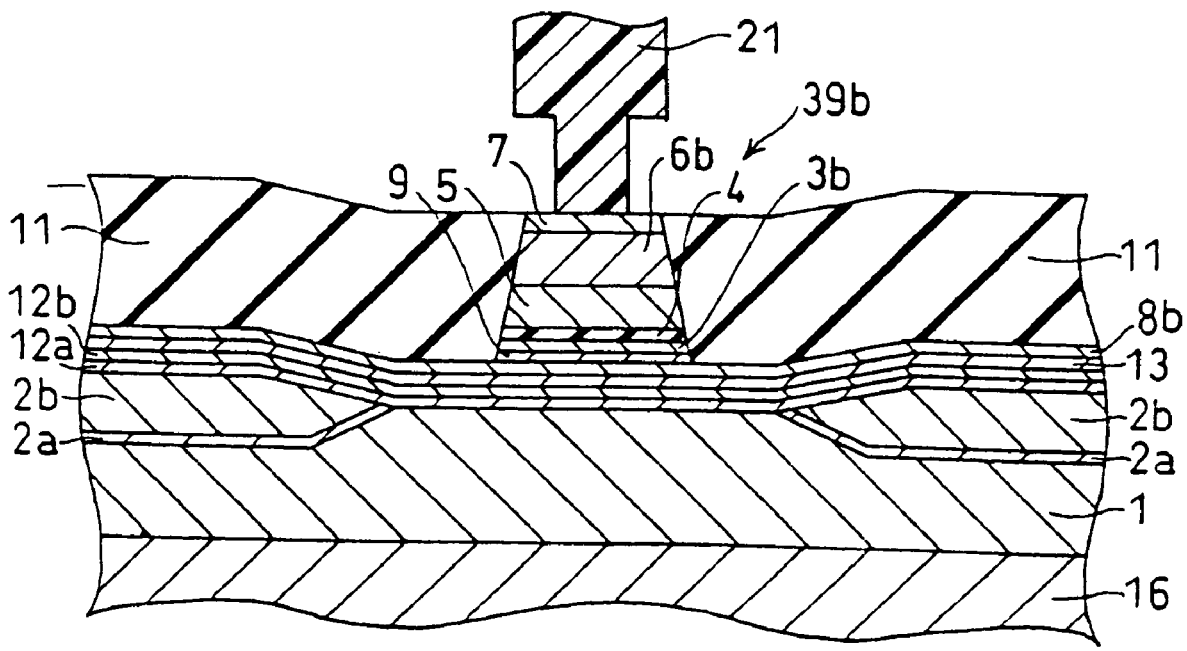

Then, as shown in FIG. 93, the second non-magnetic layer 9, the free layer 3b, the first non-magnetic layer 4, the fixed layer 5, the fixing layer 6b, and the upper layer 7 are etched by dry etching or like means. Then, the portion removed by the etching is buried in the insulation layer 11 and thus a magneto-resistance effect element 39b is formed.

Figure 94:
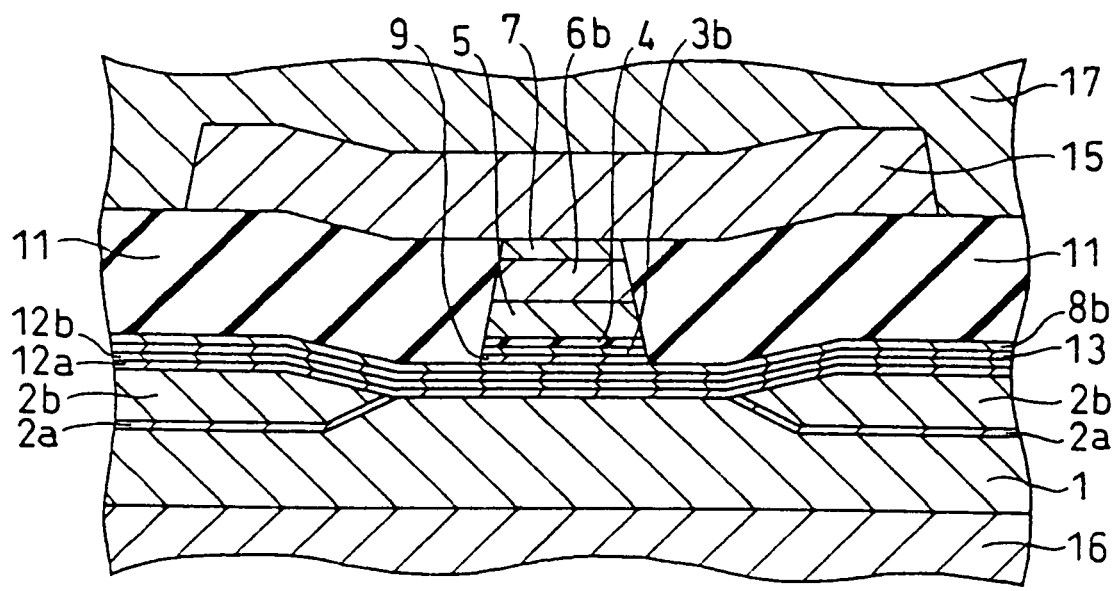

Then, as shown in FIG. 94, the photoresist 21 is removed, and the upper conductive layer 15 is deposited to form a photoresist (not shown). With this photoresist being employed as a mask, the upper conductive layer 15 is patterned by dry etching or like means. Thereafter, this photoresist is removed and the upper shield layer 17 is formed thereupon, thus forming a magneto-resistance effect head.

Now, the structure of the magneto-resistance effect head 69b according to this embodiment is described below. As shown in FIG. 94, the magneto-resistance effect head 69b is provided with the lower shield layer 16, while the lower conductive layer 1 is provided on the lower shield layer 16. The recessed portion 1a is provided on the upper surface of the lower conductive layer 1, and the underlying layer for vertical bias layer 2a and the vertical bias layer 2b are provided so as to be in the recessed portion 1a. On the lower conductive layer and the vertical bias layer 2b, provided are the second underlying layer for magnetic layer 12a, the second magnetic layer 12b, the third non-magnetic layer 13, and the first magnetic layer 8b. A pattern made up of the second non-magnetic layer 9, the free layer 3b, the non-magnetic layer 4, the fixed layer 5, the fixing layer 6b, and the upper layer 7 is formed immediately above the portion surrounded by the pattern of the two vertical bias layers on the magnetic layer 8b.

In this embodiment, it has been shown in which the second non-magnetic layer 9 is patterned in conjunction with the free layer 3b, the non-magnetic layer 4, the fixed layer 5, the fixing layer 6b, and the upper layer 7. However, the second non-magnetic layer 9 may be extended like the pattern of the magnetic layer 8b. Alternatively, the second non-magnetic layer 9 may be extended further than the free layer 3b, the non-magnetic layer 4, the fixed layer 5, the fixing layer 6b, and the upper layer 7, or may be smaller than the pattern of the magnetic layer 8b.

In addition, the underlying layer for vertical bias layer 2a, the second underlying layer for magnetic layer 12a, and the upper layer 7 can be omitted. A protective layer for protecting the vertical bias layer can be provided on the upper of the vertical bias layer 2b. Furthermore, the second underlying layer for magnetic layer 12a, the second magnetic layer 12b, the third non-magnetic layer 13, and the first magnetic layer 8b do not always have to extend as shown in FIG. 94.

Figure 95:
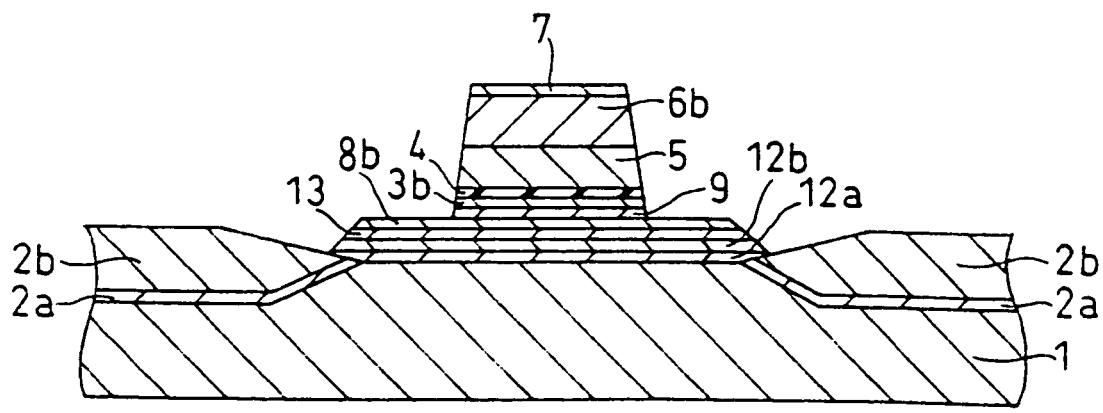
FIG. 95 is a fragmentary sectional view illustrating the structure of a magneto-resistance effect head according to a variation of this embodiment.
Figure 96:
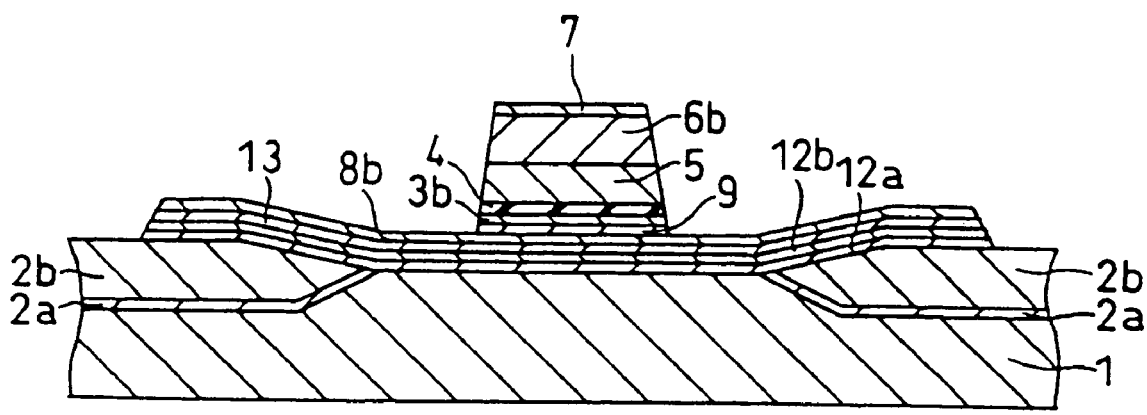
FIG. 96 is a fragmentary sectional view illustrating the structure of a magneto-resistance effect head according to another variation of this embodiment.

FIG. 95 and FIG. 96 are fragmentary sectional views illustrating the structure of a magneto-resistance effect element according to a variation of this embodiment. FIG. 95 shows that the end portions of the second underlying layer for magnetic layer 12a, the second magnetic layer 12b, the third non-magnetic layer 13, and the first magnetic layer 8b are in contact with that of the pattern of the vertical bias layer 2b.

In addition, FIG. 96 shows that the end portion of the second underlying layer for magnetic layer 12a, the second magnetic layer 12b, the third non-magnetic layer 13, and the first magnetic layer 8b sit on the pattern of the vertical bias layer 2b.

In addition, the pattern of the second magnetic layer 12b may be larger than that of the third non-magnetic layer 13, and the pattern of the third non-magnetic layer 13 may be larger than the pattern of the magnetic layer 8b.

Now, a thirteenth embodiment according to the present invention is described below. FIGS. 97-102 are fragmentary sectional views illustrating the structure of a magneto-resistance effect head according to this embodiment.

Figure 97:
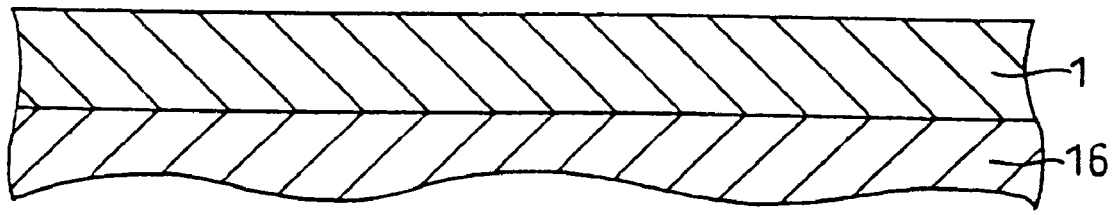
FIGS. 97-102 are fragmentary sectional views illustrating a method for fabricating a magneto-resistance effect head according to a thirteenth embodiment of the present invention.

First, as shown in FIG. 97, the lower shield layer 16 and the lower conductive layer 1 are formed successively on a substrate (not shown).

Figure 98:
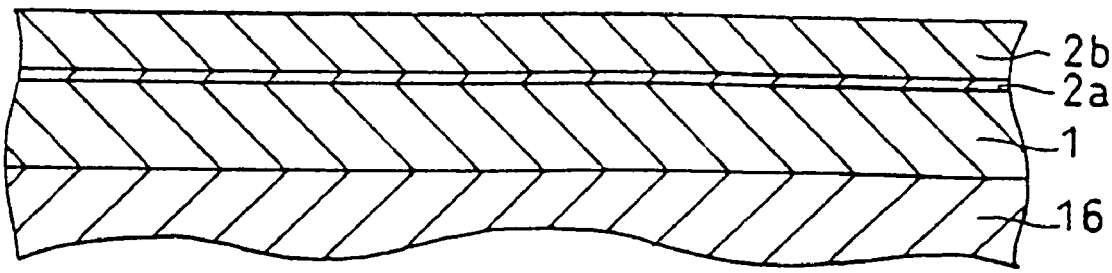

Then, as shown in FIG. 98, the underlying layer for vertical bias layer 2a and the vertical bias layer 2b are deposited on the lower conductive layer 1.

Figure 99:
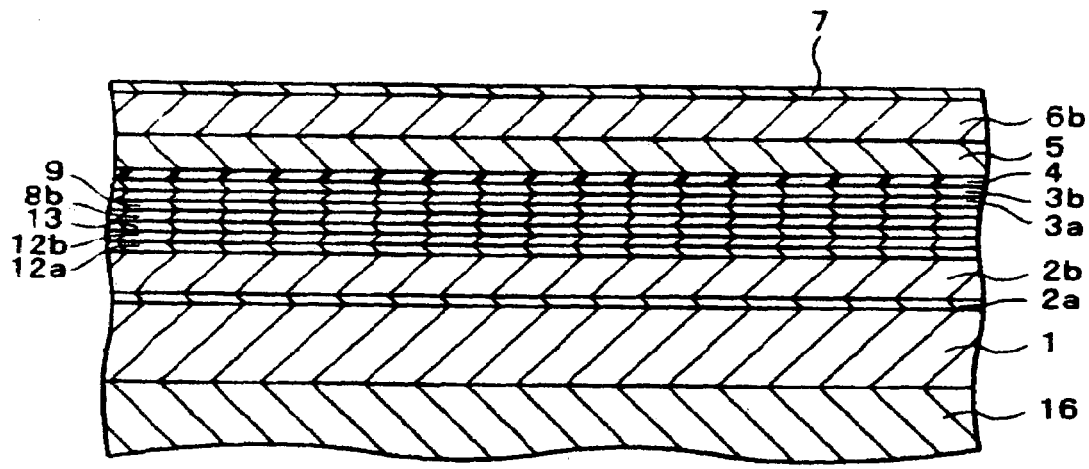

Then, as shown in FIG. 99, layered sequentially are the second underlying layer for magnetic layer 12a, the second magnetic layer 12b, the third non-magnetic layer 13, the magnetic layer 8b, the second non-magnetic layer 9, the underlying layer for free layer 3a, the free layer 3b, the non-magnetic layer 4, the fixed layer 5, the fixing layer 6b, and the upper layer 7.

Figure 100:
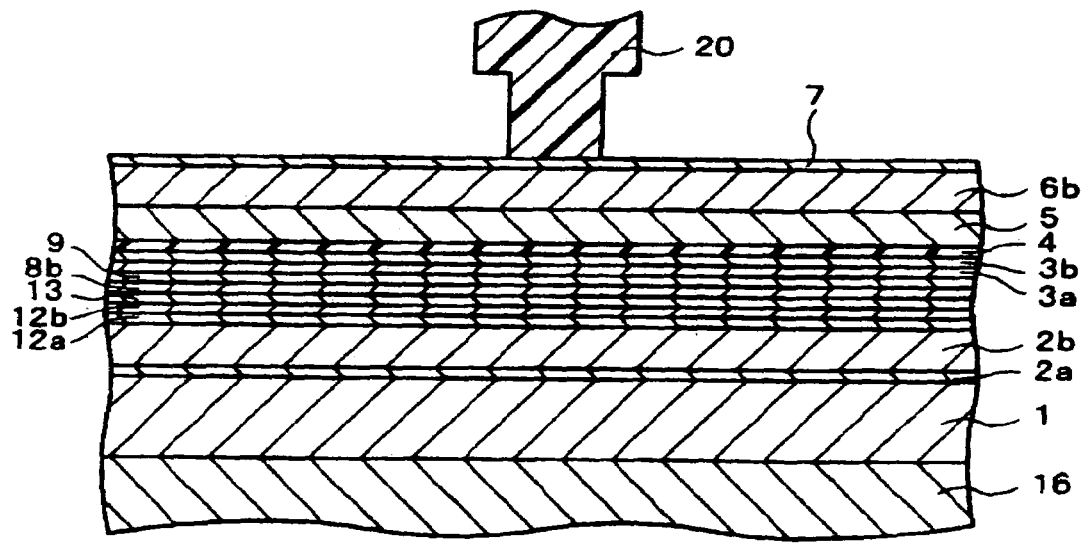

Then, as shown in FIG. 100, the photoresist 21 is patterned on the upper layer 7.

Figure 101:
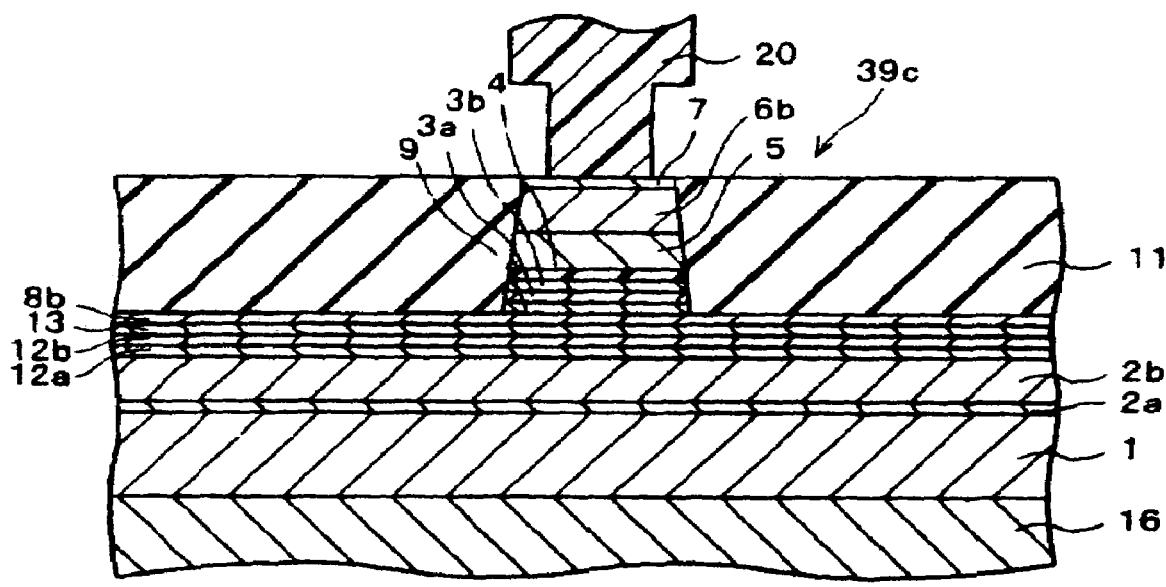

Then, as shown in FIG. 101, with the photoresist 21 being employed as a mask, the second non-magnetic layer 9, the free layer 3b, the first non-magnetic layer 4, the fixed layer 5, the fixing layer 6b and the upper layer 7 are etched by dry etching or like means. Thereafter, the portion removed by the etching is buried in the insulation layer 11 and thus a magneto-resistance effect element 39c is formed.

Figure 102:
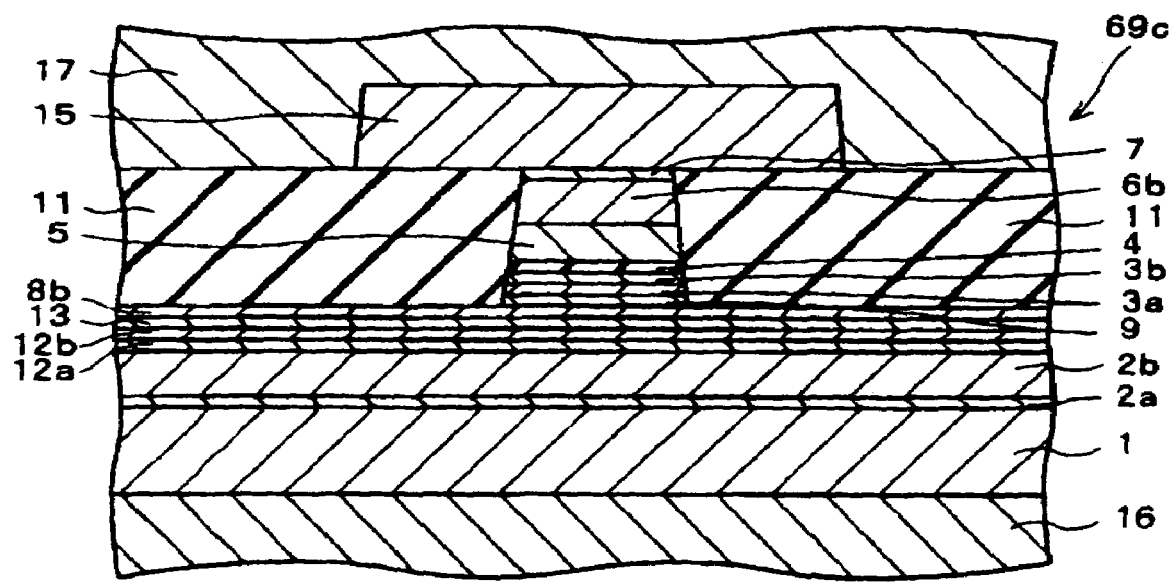

Then, as shown in FIG. 102, the photoresist 20 is removed, and the upper conductive layer 15 is deposited on the insulation layer 11 and the upper layer 7 to form a photoresist (not shown). With this photoresist being employed as a mask, the upper conductive layer 15 is patterned by dry etching or like means. Then, this photoresist is removed and the upper shield layer 17 is formed on the upper conductive layer 15, thus forming a magneto-resistance effect head 69c.

Now, the structure of the magneto-resistance effect head 69c according to this embodiment is described below. As shown in FIG. 102, the magneto-resistance effect head 69c has the lower conductive layer 1 provided on the lower shield layer 16. The underlying layer for vertical bias layer 2a and the vertical bias layer 2b are provided thereupon. Further formed thereupon are the second underlying layer for magnetic layer 12a, the second magnetic layer 12b, the third non-magnetic layer 13, and the magnetic layer 8b. On the magnetic layer 8b, provided are the second non-magnetic layer 9, the free layer 3b, the non-magnetic layer 4, the fixed layer 5, the fixing layer 6b, and the upper layer 7, which have been patterned and buried in the insulation layer 11. In addition, the upper conductive layer 15 is provided on the upper layer 7 and the insulation layer 11, upon which provided is the upper shield layer.

In this embodiment, it has been shown in which the second underlying layer for magnetic layer 12a, the second magnetic layer 12b, the third non-magnetic layer 13, and the first magnetic layer 8b are patterned. However, the second non-magnetic layer 9 may extend like the pattern of the first magnetic layer 8b. Alternatively, the second non-magnetic layer 9 may be extended further than the pattern of the free layer 3b, the non-magnetic layer 4, the fixed layer 5, the fixing layer 6b, and the upper layer 7 and may be smaller than the pattern of the magnetic layer 8b.

In addition, the vertical bias film underlying layer 2a, the second non-Underlying layer for magnetic layer 12a, and the upper layer 7 can be omitted. Furthermore, a protective layer for protecting the vertical bias layer can be provided above the vertical bias layer 2b. Furthermore, the second underlying layer for magnetic layer 12a, the second magnetic layer 12b, the third non-magnetic layer 13, and the first magnetic layer 8b do not always have to extend.

Figure 103:
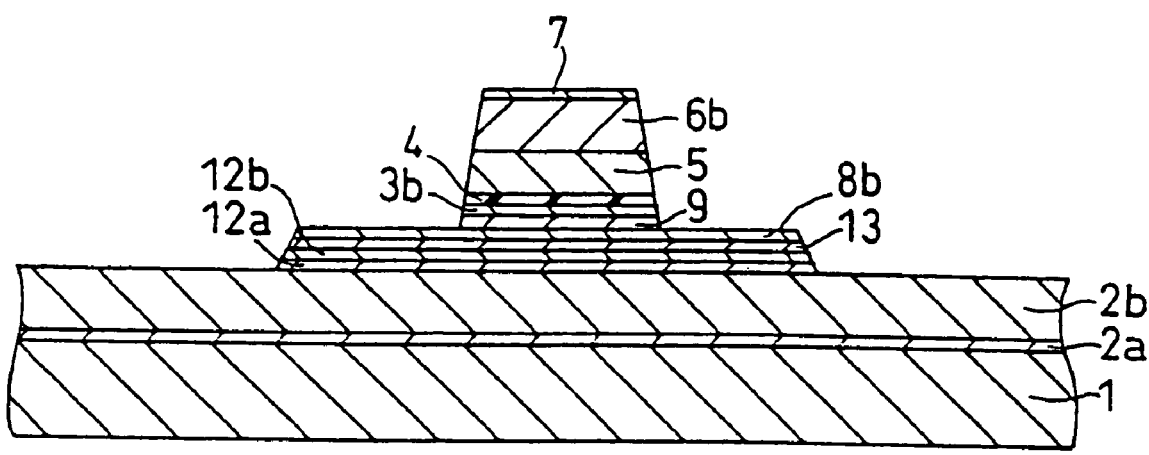
FIG. 103 is a fragmentary sectional view illustrating the structure of a magneto-resistance effect head according to a variation of this embodiment.
Figure 104:
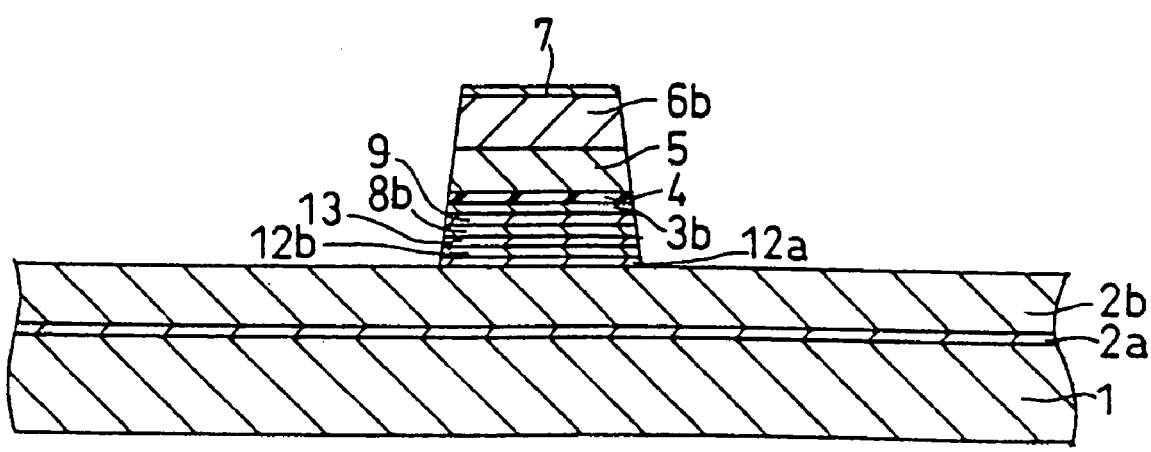
FIG. 104 is a fragmentary sectional view illustrating the structure of a magneto-resistance effect head according to another variation of this embodiment.

FIGS. 103 and 104 are fragmentary sectional views illustrating the structure of a magneto-resistance effect element according to a variation of this embodiment. FIG. 103 shows that the second underlying layer for magnetic layer 12a, the second magnetic layer 12b, the third non-magnetic layer 13, and the first magnetic layer 8b are patterned.

In addition, FIG. 104 shows that the second underlying layer for magnetic layer 12a, the second magnetic layer 12b, the third non-magnetic layer 13, and the first magnetic layer 8b are patterned to be generally equal in size to the pattern of the second non-magnetic layer 9, the free layer 3b, the first the non-magnetic layer 4, the fixed layer 5, the fixing layer 6b, and the upper layer 7. The magneto-resistance effect element shown in FIGS. 103 and 104 can also be employed for the magneto-resistance effect head.

Furthermore, the pattern of the second magnetic layer 12b may be larger than that of the third non-magnetic layer 13, and the pattern of the third non-magnetic layer 13 may be larger than that of the first magnetic layer 8b.

Figure 105:
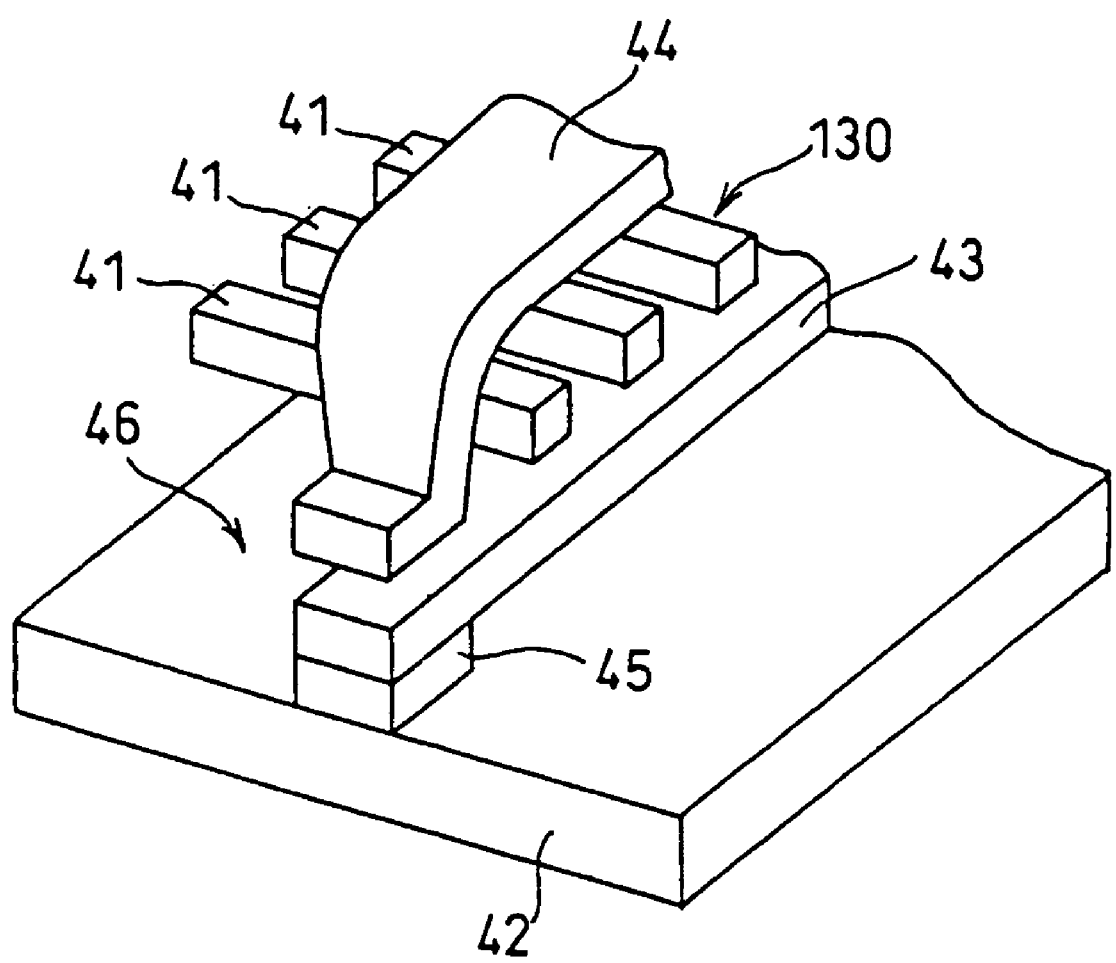
FIG. 105 is a perspective view illustrating the structure of a magnetic read/write head according to a fourteenth embodiment of the present invention.

Now, shown below is an application embodiment of the magneto-resistance effect element according to the present invention to a read/write head and a read/write system. FIG. 105 shows a schematic view illustrating a magnetic read/write head according to this embodiment. In this magnetic read/write head (a read/write element portion 130), provided on a substrate 42 is a read head 45, including the aforementioned magneto-resistance effect head as part thereof, for reading a signal from a storage medium. In addition, on the read head 45, there is provided a write head 46, comprising a magnetic pole 43, a plurality of coils 41, and an upper magnetic pole 44, for writing a signal onto the storage medium. In this case, the magnetic pole 43 may be commonly used as the upper shield layer or may be provided separately. As shown in FIG. 105, the magneto-sensitive portion of the read head 45 and the magnetic gap of the write head are formed to overlap each other on the same slider, thereby making it possible to simultaneously position them on the same track. And, the write head 46 applies a magnetic field to a storage medium (not shown) to write data thereon, and the read head 45 reads data stored in this storage medium. This read/write head is machined into a slider to be mounted on a magnetic read/write device.

Figure 106:
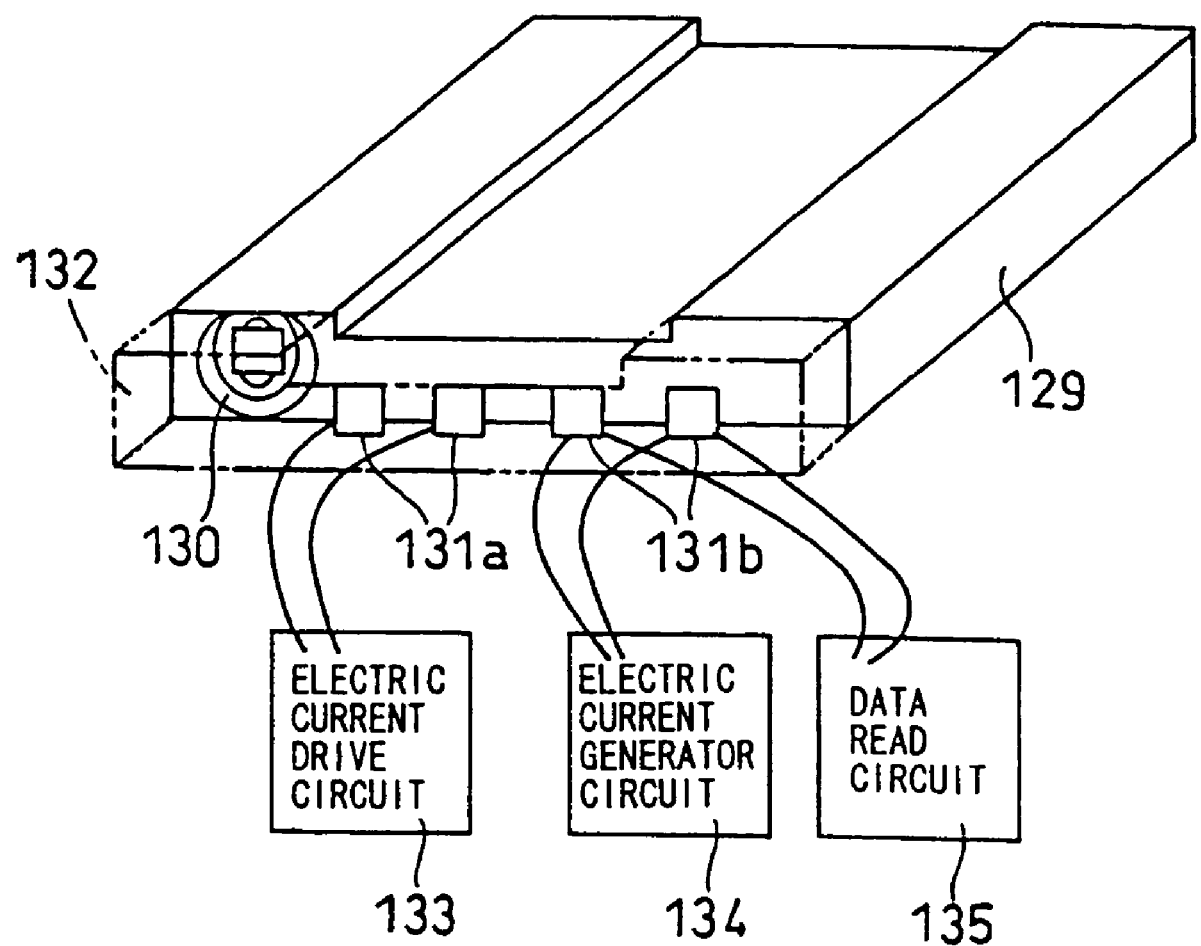
FIG. 106 is a schematic view illustrating the structure of a magneto-resistance transducer system according to this embodiment.

FIG. 106 is a schematic view illustrating the structure of a magneto-resistance transducer system, comprising the magnetic read/write head shown in FIG. 105, according to this embodiment. This magneto-resistance transducer system is provided with the read/write element portion 130 (a magnetic read/write head) formed in a board 129 constituting the slider and is protected by a protective film 132. For example, the board 129 is formed of Al2O3-TiC composite ceramic or the like, while the protective film 132 is formed of diamond-like carbon.

The read/write element portion 130 is provided with electrode terminals 131a connected to the write element portion (the write head) and electrode terminals 131b connected to the read element portion (the read head). The electrode terminal 131a applies a drive electric current to the write element portion and is connected to an electric current drive circuit 133 for causing write operation to occur. In addition, the electrode terminal 131b is connected to an electric current generator circuit 134 for conducting a sense current through the read element portion. The electrode terminal 131b is also connected to a data read circuit 135 for detecting a voltage change caused by a change in specific resistance of the read element portion as a function of an applied magnetic field to read data information stored on the storage medium. As described above, the magneto-resistance transducer system comprises the read/write element portion 130, the electric current generator circuit 134, and the data read circuit 135.

Figure 107:
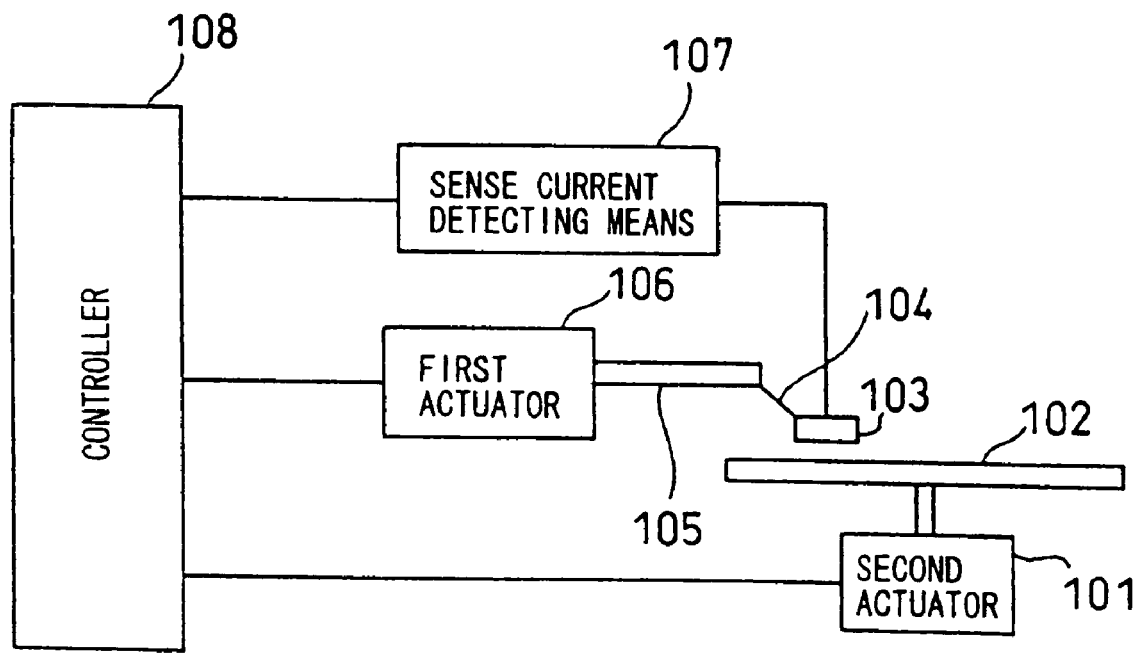
FIG. 107 is a block view illustrating the structure of a magnetic storage system according to this embodiment.

FIG. 107 is a schematic view illustrating an embodiment of a magnetic storage system employing the magneto-resistance transducer system shown in FIG. 106. This magnetic storage system comprises a magneto-resistance transducer system having a magnetic read/write head 103, sense current detecting means 107, and a controller 108. The magnetic storage system also comprises a magnetic storage medium 102 having a plurality of tracks for storing data, a first actuator 106 having a VCM (Voice Coil Motor) for moving the magnetic read/write head 103 to a given position on the magnetic storage medium 102, and a second actuator 101 having a motor for rotating the magnetic storage medium 102. In addition, the magnetic read/write head 103 is supported by a suspension 104 and an arm 105.

Figure 108:
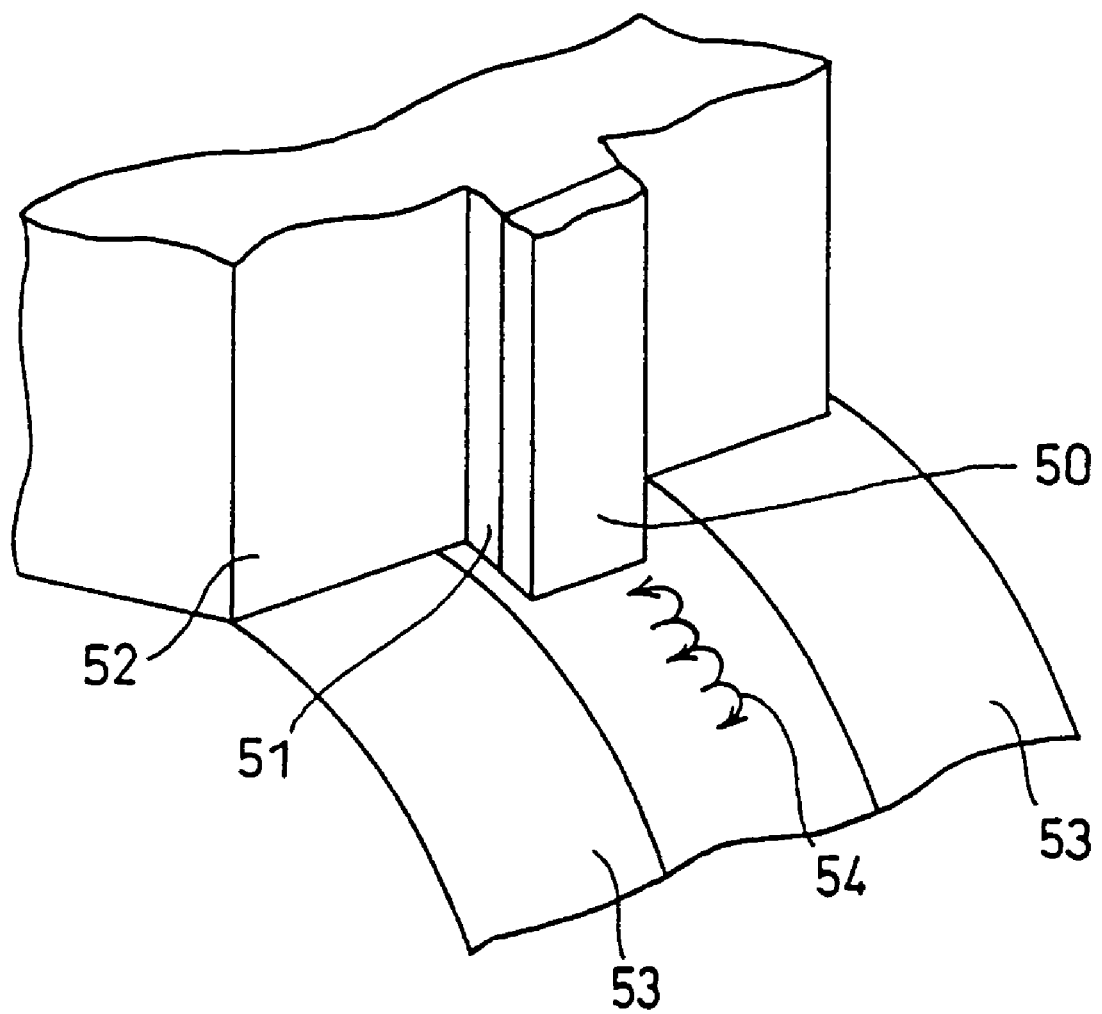
FIG. 108 is a perspective view illustrating the structure of a magnetic storage system according to this embodiment.

FIG. 108 is a perspective view illustrating a specific embodiment of the magnetic storage system. In this embodiment, a read head 51 and a write head 50 are formed on a board 52 that also serves as a head slider and positioned on a storage medium 53 for read operation. The storage medium 53 rotates and the head slider moves relatively thereto 0.2 µm or less above the storage medium 53 or in contact therewith. This mechanism allows the read head 51 to be set to where the read head 51 can read a magnetic signal stored on the storage medium 53 from a leak magnetic field 54.

As the magnetic memory system of the present invention, it is possible to employ hard disk devices, flexible disk devices, and magnetic tape units. The hard disk devices include a fixed disk device that allows no disks to be replaced and a disk device that allows disks to be replaced.

Now, described below is a prototype of a magnetic memory device fabricated according to the present invention. The magnetic memory device comprises three magnetic disks (magnetic storage media) on the base and houses, on the reverse side of the base, a head drive circuit, a signal processing circuit, and an input/output interface. The magnetic memory device is connected to the outside by a 32-bit bus line. The magnetic memory device is provided with six heads arranged on both sides of a magnetic disk, a rotary actuator for driving the heads (actuator means), and a drive circuit, a control circuit, and a motor directly connected to the disk rotating for use therewith. The disk is 63 mm in diameter and uses the range from 10 mm to 57 mm in diameter as the data storage surface. A buried servo scheme is employed and thereby no servo surface is prevent, thus making it possible to provide a high density. It is possible to directly connect this device to a small computer as an auxiliary memory device. The input/output interface is provided with a cash memory, corresponding to a bus line having transfer speeds within the range of 5 to 20 MB per second. It is also possible to provide an external controller having a plurality of the devices connected thereto, thereby constituting a large-capacity magnetic disk unit.

Now, the effect of the embodiments according to the present invention is specifically described below in comparison with comparative examples that depart from the scope of the claims. First, for comparison purposes, the head having the structure of FIGS. 1 and 2 described in the section of the prior art was prepared. After the deposition of the films, heat treatment was performed for five hours at a temperature of 250° C. while a magnetic field of $7.9 \times 10^5$ A/m was being applied in the direction perpendicular to the magnetic field applied upon deposition.

The following materials were employed as each component that forms the head. The composition of each of the material shown below is that of the targets employed for sputtering (atom %), and the numerals in the parentheses denote the thickness of the layer.

Substrate: alumina of 3 µm layered on an altic layer 1.2 mm in thickness

Lower shield layer: Co89Zr4Ta4Cr3 (1 µm)

Lower conductive layer: Ta (20 µm)

Upper electrode layer: not available

Upper shield layer: Co65Ni12Fe23 (1 µm)

Insulation layer: alumina (20 nm)

Underlying layer vertical bias: Cr (10 nm)

Vertical bias: Co74.5Cr10.5Pt15 (33 nm)

Lower gap layer: not available

Upper gap layer: not available

Upper layer: Ta (5 nm)

Underlying layer for free layer: Ta (3 nm)

Fixing layer: Pt46Mn54 (20 nm)

Fixed layer: three-layer film (Co90Fe10 (3 nm)/Ru (0.7 nm)/Co50Fe50 (3 nm))

Non-magnetic layer: Al oxide (0.7 nm)

Free layer: Ni82Fe18 (5 nm)

Upper layer: Ta (3 nm)

This head was machined and sliced into a merged read/write head like the read head 45 shown in FIG. 105 and then data was written onto and read from a CoCrTa-based medium. And, the write track was 0.7 µm in width and the read track was 0.4 µm in width.

The TMR element portion was fabricated through the photoresist process employing the i-line and the milling process. Upon preparing the coil portion of the write head, the photoresist was held at a temperature of 250° C. for two hours and thereby hardened.

This process caused the fixed layer and the fixing layer to rotate their orientation of magnetization which should be directed along the height of the element, thereby resulting in improper operation of the magneto-resistance effect element. Accordingly, after the read head portion and the write head portion were prepared, magnetization heat treatment was performed for one hour at a temperature 200° C. in a magnetic field of $4.0 \times 10^4$ A/m. Almost no rotation of the magnetization easy axis of the free layer in the orientation of magnetization caused by this magnetization heat treatment was observed in the magnetization curve.

Figure 1:
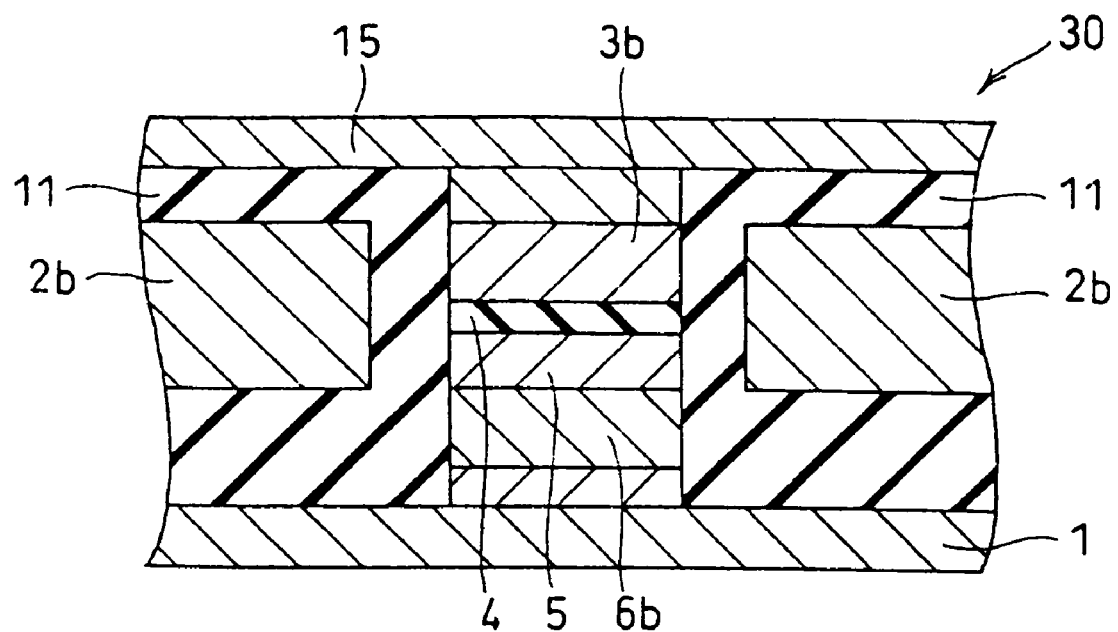
FIG. 1 is a fragmentary sectional view illustrating the structure of a magneto-resistance effect head according to a prior-art.
Figure 2:
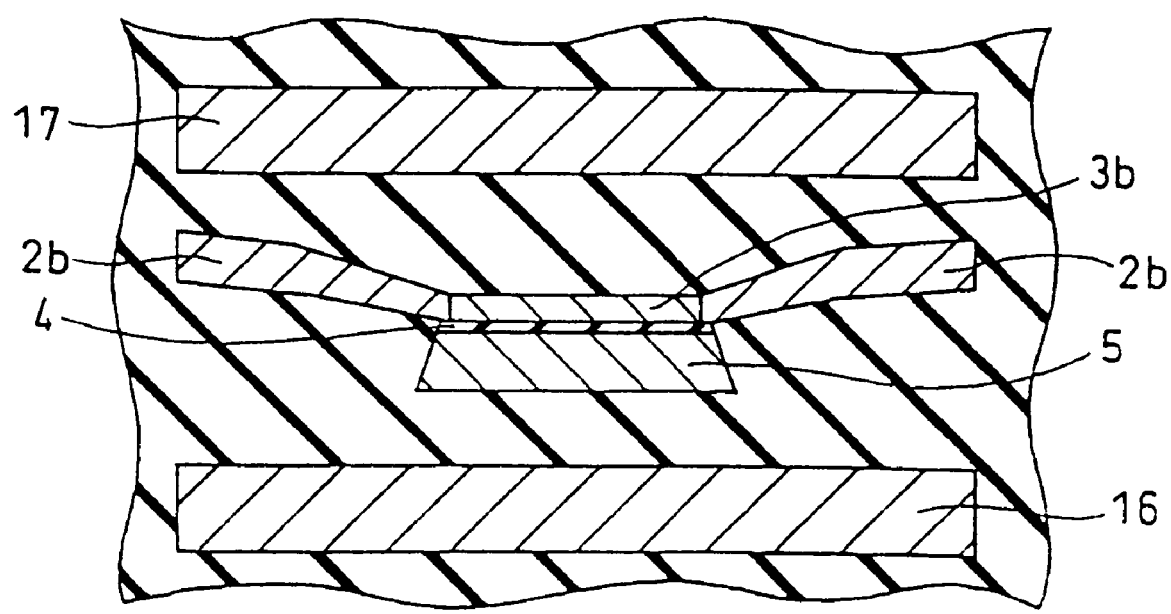
FIG. 2 is a fragmentary sectional view illustrating the structure of a magneto-resistance effect head according to a prior-art.
Figure 3:
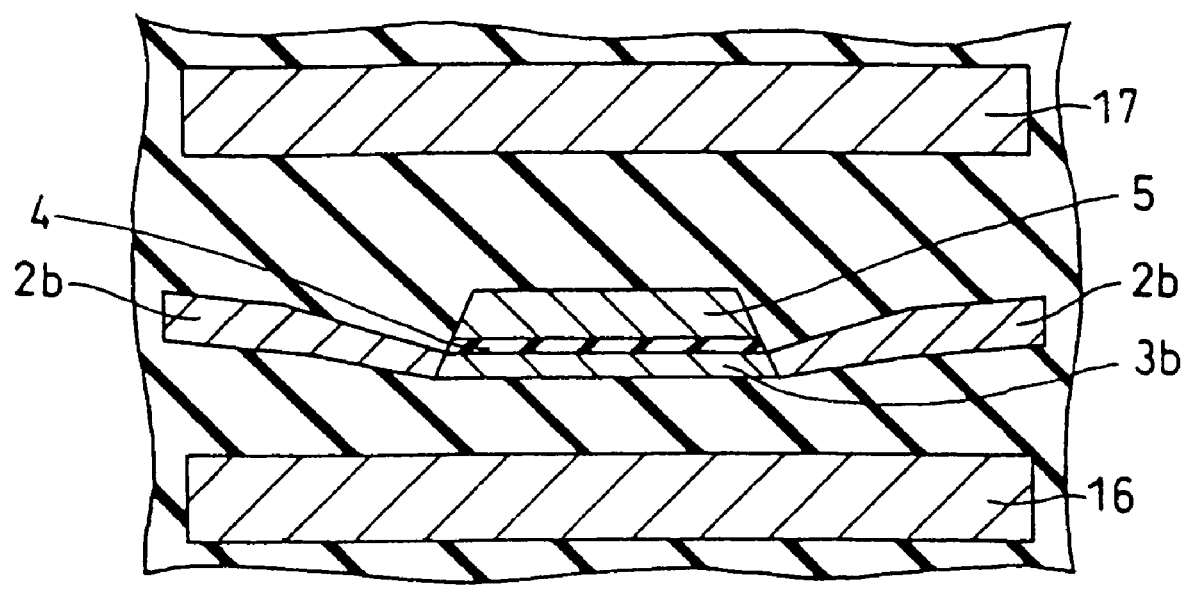
FIG. 3 is a fragmentary sectional view illustrating the structure of a magneto-resistance effect head according to a prior-art.

It was assumed that the coercive force of the medium was $2.4 \times 10^5$ A/m, and MrT (the product of residual magnetization and film thickness) was 0.35 emu/cm$^2$. Using ten prototype heads of each structure, the read output, S/N ratio, and effective track width were measured. The results of measurement made on the structure of FIG. 2 are shown in Table 1, and the results of measurement made on the structure of FIG. 1 are shown in Table 2.

TABLE 1

| Element No. | Output (mV) | (S/N) ratio (dB) |
| --- | --- | --- |
| 1 | 3.1 | 21 |
| 2 | 3.0 | 20 |
| 3 | 2.8 | 19 |
| 4 | 2.9 | 18 |
| 5 | 2.9 | 19 |
| 6 | 3.1 | 21 |
| 7 | 2.9 | 19 |
| 8 | 3.1 | 19 |
| 9 | 3.0 | 21 |
| 10 | 2.8 | 19 |

TABLE 2

| Element No. | Output (mV) | (S/N) ratio (dB) |
| --- | --- | --- |
| 1 | 1.2 | 17 |
| 2 | 1.1 | 16 |
| 3 | 0 | 0 |
| 4 | 0.5 | 12 |
| 5 | 0.2 | 5 |
| 6 | 0.3 | 8 |
| 7 | 0.4 | 9 |
| 8 | 0.2 | 2 |
| 9 | 0 | 0 |
| 10 | 0.3 | 8 |

The structure of FIG. 1 provides a read output as high as 2.8 to 3.1 mV but S/N ratio as low as 18 to 21 dB. This was caused by Barkhausen noise included in the read signal. It was found by measuring the R-H loop of the head that the hysteresis produced by the inversion of the free layer magnetization was so high as to cause the Barkhausen noise involved in the magnetic wall displacement of the free layer. In the structure of FIG. 1, it is considered that since the vertical bias layer and the free layer are isolated by the insulation layer, the vertical bias magnetic field is not applied sufficiently to the free layer, so that the vertical bias magnetic field does not contribute to the reduction in Barkhausen noise.

On the other hand, in the structure of FIG. 2, the read output was as low as 0 to 1.2 mV, and accordingly the (S/N) ratio was as low as 0 to 17 dB. This is because the sense current leaks out to the vertical bias layer 2b and thus does not conduct through the non-magnetic layer 4. In this structure, it may be possible in principle to prevent the leakage of the sense current to the vertical bias layer 2b; however, the leakage cannot be prevented. This is conceivably because the structure cannot be precisely fabricated to prevent the leakage of the sense current to the vertical bias layer 2b and conduct the sense current sufficiently through the non-magnetic layer 4. This results from the fact that the vertical bias layer 2b is in close proximity to the end portion of the non-magnetic layer 4 (barrier layer) in the layered body made up of the fixed layer 5, the non-magnetic layer 4, and the free layer 3.

Then, as an embodiment of the present invention, fabricated was the magneto-resistance effect head of the structure shown in FIGS. 10, 21, 31, 37, 49, and 64. And, the following materials were employed as each component that forms the magneto-resistance effect head.

Substrate: alumina of 3 μm layered on an altic layer 1.2 mm in thickness
Lower shield layer: Co89Zr4Ta4Cr3 (1 μm)
Lower conductive layer: Ta (20 μm)
Upper electrode layer: not available
Upper shield layer: Co65Ni12Fe23 (1 μm)
Insulation layer: alumina (20 nm)
Underlying layer for vertical bias layer: Cr (10 nm)
Vertical bias: Co74.5Cr10.5Pt15 (33 nm)
Lower gap layer: not available
Upper gap layer: not available
Upper layer: Ta (5 nm)
Underlying layer for free layer: Ta (3 nm)
Underlying layer for magnetic layer: Ta (3 nm)
Fixing layer: Pt46Mn54 (20 nm)
Second fixing layer: Pt46Mn54 (20 nm)
Fixed layer: three-layer film (Co90Fe10 (3 nm)/Ru (0.7 nm)/Co50Fe50 (3 nm))
Second fixed layer: three-layer film (Co90Fe10 (3 nm)/Ru (0.7 nm)/Co50Fe50 (3 nm))
First non-magnetic layer: Al oxide (0.7 nm)
Second non-magnetic layer: Ru (0.75 nm)
Third non-magnetic layer: Ru (0.75 nm)
Fourth non-magnetic layer: Ru (0.75 nm)
Fifth non-magnetic layer: Al oxide (0.7 nm)
Free layer: Ni82Fe18 (5 nm)
Magnetic layer: Ni82Fe18 (5 nm)
Upper layer: Ta (3 nm)

This head was machined and sliced into a merged read/write head like the read head 45 shown in FIG. 105 and then data was written onto and read from a CoCrTa-based medium. And, the write track was 0.7 μm in width and the read track was 0.4 μm in width.

The TMR element portion was fabricated through the photoresist process employing the i-line and the milling process. Upon preparing the coil portion of the write head, the photoresist was held at a temperature of 250° C. for two hours and thereby hardened.

This process caused the fixed layer and the fixing layer to rotate their orientation of magnetization, which should be directed along the height of the element, thereby resulting in improper operation of the magneto-resistance effect element. Accordingly, after the read head portion and the write head portion were prepared, magnetization heat treatment was performed for one hour at a temperature 200° C. in a magnetic field of $4.0 \times 10^4$ A/m. Almost no rotation of the magnetization easy axis of the free layer in the orientation of magnetization caused by this magnetization heat treatment was observed in the magnetization curve.

It was assumed that the coercive force of the medium was $2.4 \times 10^5$ A/m, and MrT (the product of residual magnetization and film thickness) was 0.35 emu/cm$^2$. Using ten prototype heads of each structure, the read output, S/N ratio, and effective track width were measured. The results of measurement made on the structure of FIGS. 10, 21, 31, 37, 49, and 64 are shown in Tables 1 to 8.

TABLE 3

| Element No. | Output (mV) | (S/N) ratio (dB) | Effective track width (μm) |
| --- | --- | --- | --- |
| 1 | 3.0 | 27 | 0.61 |
| 2 | 3.1 | 26 | 0.59 |
| 3 | 2.9 | 27 | 0.60 |
| 4 | 3.0 | 28 | 0.61 |
| 5 | 2.8 | 26 | 0.57 |
| 6 | 3.0 | 27 | 0.57 |
| 7 | 3.1 | 28 | 0.60 |
| 8 | 3.0 | 27 | 0.59 |
| 9 | 2.8 | 26 | 0.58 |
| 10 | 2.8 | 25 | 0.57 |

TABLE 4

| Element No. | Output (mV) | (S/N) ratio (dB) | Effective track width (μm) |
|---|---|---|---|
| 1 | 3.0 | 27 | 0.58 |
| 2 | 2.8 | 28 | 0.59 |
| 3 | 2.9 | 27 | 0.57 |
| 4 | 2.8 | 27 | 0.57 |
| 5 | 2.7 | 26 | 0.59 |
| 6 | 3.0 | 25 | 0.60 |
| 7 | 3.1 | 27 | 0.59 |
| 8 | 3.0 | 28 | 0.58 |
| 9 | 3.1 | 26 | 0.57 |
| 10 | 3.0 | 25 | 0.60 |

TABLE 5

| Element No. | Output (mV) | (S/N) ratio (dB) | Effective track width (μm) |
|---|---|---|---|
| 1 | 3.2 | 27 | 0.58 |
| 2 | 3.1 | 27 | 0.57 |
| 3 | 2.9 | 28 | 0.56 |
| 4 | 2.7 | 26 | 0.58 |
| 5 | 2.8 | 27 | 0.60 |
| 6 | 2.9 | 27 | 0.60 |
| 7 | 2.8 | 26 | 0.58 |
| 8 | 3.0 | 27 | 0.57 |
| 9 | 3.0 | 28 | 0.59 |
| 10 | 3.1 | 27 | 0.60 |

TABLE 6

| Element No. | Output (mV) | (S/N) ratio (dB) | Effective track width (μm) |
|---|---|---|---|
| 1 | 2.9 | 28 | 0.58 |
| 2 | 2.8 | 27 | 0.59 |
| 3 | 2.7 | 26 | 0.56 |
| 4 | 2.8 | 27 | 0.58 |
| 5 | 2.9 | 27 | 0.56 |
| 6 | 2.9 | 26 | 0.55 |
| 7 | 2.7 | 27 | 0.54 |
| 8 | 2.8 | 26 | 0.58 |
| 9 | 2.7 | 26 | 0.56 |
| 10 | 2.9 | 28 | 0.57 |

TABLE 7

| Element No. | Output (mV) | (S/N) ratio (dB) | Effective track width (μm) |
|---|---|---|---|
| 1 | 2.8 | 27 | 0.55 |
| 2 | 2.7 | 28 | 0.54 |
| 3 | 2.8 | 26 | 0.53 |
| 4 | 2.9 | 27 | 0.54 |
| 5 | 2.9 | 28 | 0.54 |
| 6 | 3.0 | 27 | 0.542 |
| 7 | 2.8 | 26 | 0.53 |
| 8 | 2.9 | 27 | 0.54 |
| 9 | 2.9 | 28 | 0.55 |
| 10 | 2.8 | 25 | 0.51 |

TABLE 8

| Element No. | Output (mV) | (S/N) ratio (dB) | Effective track width (μm) |
|---|---|---|---|
| 1 | 2.9 | 25 | 4.8 |
| 2 | 2.9 | 26 | 4.9 |
| 3 | 2.7 | 26 | 4.8 |

TABLE 8-continued

| Element No. | Output (mV) | (S/N) ratio (dB) | Effective track width (μm) |
|---|---|---|---|
| 4 | 2.6 | 27 | 5.1 |
| 5 | 2.7 | 26 | 4.8 |
| 6 | 2.8 | 26 | 5.0 |
| 7 | 2.5 | 25 | 5.1 |
| 8 | 2.5 | 27 | 4.9 |
| 9 | 2.6 | 25 | 4.6 |
| 10 | 2.6 | 25 | 4.5 |

It can be seen that any one of the structures shown in FIGS. 10, 21, 31, 37, 49 and 64 provides a S/N ratio of 25 dB or more, thus providing a significantly improved S/N ratio in comparison with the prior-art example. This is because any one of the structures can prevent the sense current from bypassing the barrier layer, and therefore provide sufficient output and successfully apply a proper amount of vertical bias magnetic field to the free layer, thereby making it possible to sufficiently reduce noise and thus provide a good S/N ratio. Among the magneto-resistance effect heads shown in FIGS. 10, 21, 31, 37, 49, and 64, the one shown in FIG. 64 has the smallest effective track width and provides the best result. This is conceivably because the magneto-resistance effect head shown in FIG. 64 has a layered anti-ferromagnetic layer structure of the magnetic layer 8*b*, the third non-magnetic layer 13, and the second magnetic layer 12. This structure is thereby prevented from being subjected to the effect of the leakage magnetic field from the medium, so that the read effective track width is determined only by the width of the free layer 3*b*.

What is claimed is:

1. A magneto-resistance effect element comprising:
a lower electrically conductive layer;
a first magnetic layer;
a second magnetic layer provided on the lower electrically conductive layer, said first magnetic layer being provided on the second magnetic layer and magnetically coupled to the second magnetic layer;
a free layer provided on the first magnetic layer, magnetically coupled to the first magnetic layer, and having an orientation of magnetization varied by a magnetic field applied thereto;
a first non-magnetic layer provided on the free layer;
a fixed layer provided on the first non-magnetic layer and having a pinned orientation of magnetization; and
a vertical bias layer for applying a magnetic field to said second magnetic layer, wherein at least part of said second magnetic layer is in direct contact with said vertical bias layer and a sense current for detecting a change in electrical resistance of said first non-magnetic layer flows substantially in perpendicular relation to said first non-magnetic layer.

2. The magneto-resistance effect element according to claim 1, wherein said second magnetic layer is equal to or greater than said free layer in length in the direction of the magnetic field applied by said vertical bias layer.

3. The magneto-resistance effect element according to claim 1, wherein said first magnetic layer is equal to or greater than said free layer in length in the direction of the magnetic field applied by said vertical bias layer.

4. The magneto-resistance effect element according to claim 1, further comprising a fixing layer, disposed on said fixed layer, for pinning the orientation of magnetization of said fixed layer.

5. The magneto-resistance effect element according to claim 1, further comprising a second non-magnetic layer between said first magnetic layer and said second magnetic layer.

6. The magneto-resistance effect element according to claim 1, further comprising a second non-magnetic layer between said first magnetic layer and said free layer.

7. The magneto-resistance effect element according to claim 1, wherein said free layer is magnetically coupled to said first magnetic layer by anti-ferromagnetic coupling or ferromagnetic coupling.

8. The magneto-resistance effect element according to claim 1, wherein said second magnetic layer is magnetically coupled to said first magnetic layer by anti-ferromagnetic coupling or ferromagnetic coupling.

9. The magneto-resistance effect element according to claim 1, wherein the product of saturation magnetization and film thickness of said first magnetic layer is substantially equal to the product of saturation magnetization and film thickness of said second magnetic layer.

10. The magneto-resistance effect element according to claim 1, wherein a three-layered film made up of said first magnetic layer, a second non-magnetic layer, and said second magnetic layer is a layered antiferromagnetic body.

11. The magneto-resistance effect element according to claim 1, wherein at least part of said first magnetic layer is in direct contact with said vertical bias layer.

12. The magneto-resistance effect element according to claim 1, wherein said second magnetic layer sits on the vertical bias layer.

13. The magneto-resistance effect element according to claim 1, wherein said second magnetic layer overlies the vertical bias layer.

14. The magneto-resistance effect element according to claim 1, further comprising a third magnetic layer and a second non-magnetic layer provided between the lower conductive layer and the second magnetic layer.

15. The magneto-resistance effect element according to claim 1, wherein the first magnetic layer, the free layer provided on the first magnetic layer, the first non-magnetic layer provided on the free layer, and the fixed layer provided on the first non-magnetic layer are etched to form a magneto-resistance element stack so as not to be placed immediately above the vertical bias layer, further comprising an insulation layer provided over the second magnetic layer and burying the magneto-resistance element stack.

* * * * *